(12) United States Patent
Yin et al.

(10) Patent No.: US 6,475,335 B1
(45) Date of Patent: *Nov. 5, 2002

(54) RF PLASMA REACTOR WITH HYBRID CONDUCTOR AND MULTI-RADIUS DOME CEILING

(75) Inventors: Gerald Yin, Cupertino, CA (US); Diana Xiabing Ma, Saratoga, CA (US); Peter Loewenhardt, Sant Jose, CA (US); Philip Salzman, San Jose, CA (US); Allen Zhao, Mountain View, CA (US); Hiroji Hanawa, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 116 days.

This patent is subject to a terminal disclaimer.

(21) Appl. No.: 09/658,572

(22) Filed: Sep. 8, 2000

Related U.S. Application Data

(60) Division of application No. 08/778,051, filed on Jan. 2, 1997, now Pat. No. 6,270,617, which is a continuation-in-part of application No. 08/597,445, filed on Feb. 2, 1996, now Pat. No. 5,777,289, which is a continuation-in-part of application No. 08/389,889, filed on Feb. 15, 1995, now Pat. No. 5,753,044.

(51) Int. Cl.[7] .................................................. H05H 1/00
(52) U.S. Cl. ................................ 156/345.48; 118/723 I
(58) Field of Search ...................... 118/723 I; 156/345

(56) References Cited

U.S. PATENT DOCUMENTS

| | | |
|---|---|---|
| 4,795,529 A | 1/1989 | Kawasaki et al. |
| 4,842,683 A | 6/1989 | Cheng et al. |
| 4,844,775 A | 7/1989 | Keeble |
| 4,872,947 A | 10/1989 | Wang et al. |
| 4,948,458 A | 8/1990 | Ogle |

(List continued on next page.)

FOREIGN PATENT DOCUMENTS

| | | |
|---|---|---|
| EP | 379 828 A3 | 8/1990 |
| EP | 379 828 A2 | 8/1990 |
| EP | 489 407 A2 | 6/1992 |
| EP | 520 519 A1 | 12/1992 |
| EP | 552 491 A1 | 7/1993 |

(List continued on next page.)

*Primary Examiner*—Thi Dang
(74) *Attorney, Agent, or Firm*—Robert M. Wallace; Joseph Bach

(57) ABSTRACT

An RF plasma reactor for processing a semiconductor wafer in a reactor chamber with a multi-radius dome-shaped ceiling and a gas inlet for supplying a process gas into the chamber includes an overhead RF signal applicator near the ceiling for applying an RF signal into the chamber through the ceiling to maintain a plasma of the process gas in the chamber, the plasma having a radial ion density distribution near the plane of the pedestal which is center-high for a greater height of the ceiling above the pedestal and is center-low for a lesser height, the height of the ceiling being intermediate the greater and lesser heights such that the radial ion density distribution is neither center-high nor center-low. In another aspect of the invention, the RF signal applicator has an annular distribution characterized by an effective mean radius, the plasma having a radial ion density distribution with respect to an axis of symmetry of the ceiling which is center-high for a lesser mean radius of the signal applicator and center-low for a greater mean radius of the signal applicator, the mean radius of the signal applicator being intermediate the greater and lesser mean radii such that the radial ion density distribution is neither center-high nor center-low.

162 Claims, 24 Drawing Sheets

U.S. PATENT DOCUMENTS

| | | |
|---|---|---|
| 4,990,229 A | 2/1991 | Campbell et al. |
| 4,992,665 A | 2/1991 | Mohl |
| 5,122,251 A | 6/1992 | Campbell et al. |
| 5,234,529 A | 8/1993 | Johnson |
| 5,277,751 A | 1/1994 | Ogle |
| 5,280,154 A | 1/1994 | Cuomo et al. |
| 5,346,578 A | 9/1994 | Benzing et al. |
| 5,368,710 A | 11/1994 | Chen et al. |
| 5,401,350 A | 3/1995 | Patrick et al. |
| 5,449,432 A | 9/1995 | Hanawa |
| 5,614,055 A | 3/1997 | Fairbairn et al. |
| 5,688,358 A | 11/1997 | Tanaka et al. |

FOREIGN PATENT DOCUMENTS

| | | |
|---|---|---|
| EP | 596 551 A1 | 5/1994 |
| EP | 641 013 A2 | 3/1995 |
| EP | 685 873 A1 | 12/1995 |
| EP | 0 702 391 A2 | 3/1996 |
| EP | 0 710 055 A1 | 5/1996 |
| EP | 0 727 807 A1 | 8/1996 |
| EP | 0 727 923 A1 | 8/1996 |
| EP | 0 742 577 A2 | 11/1996 |
| EP | 0 820 087 A2 | 1/1998 |
| GB | 2 231 197 A | 11/1990 |
| WO | WO-92/20833 | 11/1992 |

RF PLASMA REACTOR WITH HYBRID CONDUCTOR AND MULTI-RADIUS DOME CEILING

This is a divisional of application Ser. No. 08/788,051 filed on Jan. 2, 1997, now U.S. Pat. No. 6,270,617, which is a continuation-in-part of application Ser. No. 08/597,445 filed Feb. 2, 1996, now U.S. Pat. No. 5,777,289 which is a continuation-in-part of application Ser. No. 08/389,889, filed Feb. 15, 1995 now U.S. Pat. No. 5,753,044.

CROSS-REFERENCE TO RELATED APPLICATIONS

This application is a continuation-in-part of U.S. application Ser. No. 08/597,445 entitled "RF Plasma Reactor with Hybrid Conductor and Multi-Radius Dome Ceiling", filed Feb. 2, 1996 by Gerald Yin et al., which is a continuation-in-part of U.S. application Ser. No. 08/389,889 entitled "RF Plasma Reactor with Hybrid Conductor and Multi-Radius Dome Ceiling" filed Feb. 15, 1995 by Gerald Yin et al.

BACKGROUND OF THE INVENTION

1. Technical Field

The invention is related to radio frequency (R.F) inductively or capacitively coupled plasma reactors used in processing semiconductor wafers, and in particular to improvements therein for increasing the plasma ion density uniformity across the wafer surface.

2. Background Art

Inductively coupled plasma reactors are currently used to perform various processes on semiconductor wafers including metal etching, dielectric etching and chemical vapor deposition, as some examples. In an etch process, one advantage of an inductively coupled plasma is that a high density plasma is provided to permit a large etch rate independently of wafer bias, thereby permitting more control of the wafer bias to reduce device damage. For this purpose, the source power applied to the antenna and the bias power applied to the wafer pedestal are controlled separately. Separating control of the bias power and source power facilitates independent control of ion density and ion energy, in accordance with well-known techniques. To produce an inductively coupled plasma, the antenna is a coil inductor adjacent the chamber, the coil inductor being connected to the RF source power supply. The coil inductor provides the RF power which ignites and sustains the plasma. The geometry of the coil inductor can in large part determine spatial distribution of the plasma ion density within the reactor chamber.

One problem with such a plasma reactor is that the spatial distribution of the plasma ion density across the wafer surface is often non-uniform. This is a problem in a metal etch process, for example, because the etch rate and accumulation of electric charge on the device is affected by plasma ion density. Specifically, non-uniform plasma ion density distribution tends to render the etch rate non-uniform across the wafer and leads to device damage from charge build-up. As a result, the etch process is difficult to control, over-etching devices on some portions of the wafer and under-etching devices on other portions of the wafer, leading to reduced production yield.

One of the causes of non-uniform plasma ion distribution is the coil geometry and location. Another cause is the shape of the plasma itself, which is largely determined by the shape of the reactor chamber, particularly the reactor chamber ceiling.

Generally, the coil inductor of an inductively coupled plasma reactor is wrapped around the reactor chamber, although it does not necessarily conform to the shape of the reactor chamber walls. Necessarily, different regions of the wafer surface are displaced from the nearest coil windings by different distances and therefore experience different plasma ion densities.

Depending upon the shape of the reactor chamber ceiling, more plasma volume is located over the wafer center and less over the wafer edges, particularly in the case of a conical or hemispherical ceiling, for example. Accordingly, there tends to be inherent spatial non-uniformities in the ion flux density.

A different approach is disclosed in U.S. Pat. No. 4,948,458 to James Ogle in which a plasma reactor has a flat ceiling and a flat coil antenna overlying the ceiling. However, this approach has generally been found to provide no improvement in plasma ion density uniformity and moreover suffers from relatively large capacitive coupling in the plasma, hindering control of the plasma ion energy. A modification of that approach is disclosed in U.S. Pat. No. 5,368,710 to Chen et al., in which an attempt is made to adjust the plasma characteristics such as density by increasing the thickness of the dielectric chamber cover toward the center of the chamber. U.S. Pat. No. 5,346,578 discloses a reactor having an arcuate ceiling. However, such techniques are generally limited in their best applications to a relatively narrow window of process recipes.

Thus, there is a need for a plasma reactor which permits versatile optimization of plasma characteristics to optimize uniformity of plasma ion density distribution over a large process window.

SUMMARY OF THE INVENTION

An RF plasma reactor for processing a semiconductor wafer in a reactor chamber with a multi-radius dome-shaped ceiling and a gas inlet for supplying a process gas into the chamber includes an overhead RF signal applicator near the ceiling for applying an RF signal into the chamber through the ceiling to maintain a plasma of the process gas in the chamber, the plasma having a radial ion density distribution near the plane of the pedestal which is center-high for a greater height of the ceiling above the pedestal and is center-low for a lesser height, the height of the ceiling being intermediate the greater and lesser heights such that the radial ion density distribution is neither center-high nor center-low. In another aspect of the invention, the RF signal applicator has an annular distribution characterized by an effective mean radius, the plasma having a radial ion density distribution with respect to an axis of symmetry of the ceiling which is center-high for a lesser mean radius of the signal applicator and center-low for a greater mean radius of the signal applicator, the mean radius of the signal applicator being intermediate the greater and lesser mean radii such that the radial ion density distribution is neither center-high nor center-low.

The process gas may be selected to be compatible with any one of: (a) a metal etch plasma process, (b) a silicon oxide etch plasma process, (c) a polysilicon etch plasma process, (d) a silicide etch process, (e) a nitride etch process, (f) a polymer etch process. The following additional features obtain either singly or in combination in preferred embodiments of the invention.

The ceiling height may be such that the ion density distribution may be neither predominantly center-high nor predominantly center-low. The distribution may be M-shaped. The ceiling height may be in the range of 3 to 11 inches for a chamber diameter exceeding 200 mm. The ceiling height may be in the range of 4 to 12 inches for a chamber diameter exceeding 300 mm. The ceiling may include a flat interior surface facing the wafer pedestal. The ceiling may include a smooth three-dimensionally shaped interior surface facing the wafer pedestal. The highest part of the interior surface may be disposed at the intermediate height. The ceiling may include a flat interior surface facing the wafer pedestal. The ceiling may include a smooth three-dimensionally shaped interior surface facing the wafer pedestal. The ceiling height may be approximately 7 inches. The ceiling may define a multi-radius interior surface of the chamber. The interior surface may have a major radius and a minor radius defining a ratio therebetween in the range of about 2 to 10. The interior surface may have an apex, the apex lying at the intermediate height. The chamber may have a diameter of between about 12 inches and 24 inches for a wafer diameter in the range of approximately 6–12 inches.

If the process gas is compatible with a metal etch process then it may include at least one of the following etchants: chlorine, BCl$_2$, HCl, HBr, and the ceiling may be at a height above the support in a range of about 3" to 11" the mean radius may be in a range of about 3" to 9", where the chamber may be sufficiently large to accommodate a 200 mm wafer. Alternatively, for the metal etch process, the ceiling may be at a height above the support in a range of about 4" to 12", the mean radius may be in a range of about 5" to 14", where the chamber may be sufficiently large to accommodate a 300 mm wafer. For metal etch the RF signal may have a frequency of about 2 MHz.

If the process gas is compatible with a silicon oxide etch process then it may include at least one of the following etchant precursors: a fluorocarbon, a fluorohydrocarbon, and the ceiling may be at a height above the support in a range of about 3" to 11", the mean radius may be in a range of about 5" to 11" where, the chamber is sufficiently large to accommodate a 200 mm wafer. Alternatively for the silicon oxide etch process, the ceiling may be at a height above the support in a range of about 4" to 12", the mean radius may be in a range of about 6" to 14" where the chamber may be sufficiently large to accommodate a 300 mm wafer. For the silicon dioxide etch process, the RF signal may have a frequency of about 2 MHz.

If the process gas is compatible with a polysilicon etch process then it may include at least one of the following etchants: chlorine, HBr, mixed with at least one of the following: oxygen, a non-reactive gas, an inert gas, and the ceiling may be at a height above the support in a range of about 3" to 11", the mean radius may be in a range of about 41" to 12", where the chamber may be sufficiently large to accommodate a 200 mm wafer. Alternatively, for the polysilicon etch process, the ceiling may be at a height above the support in a range of about 4" to 12", the mean radius may be in a range of about 6" to 15", where the chamber is sufficiently large to accommodate a 300 mm wafer. For the polysilicon etch process the RF signal may have frequency of at least 10 MHz. For the polysilicon etch process, the invention may include maintaining a pressure in the chamber less than 20 mT or between about 1 mT and 5 mT. The height of the ceiling above the wafer pedestal and the means radius of the RF signal applicator define a ratio therebetween in the range of approximately 0.8 to 1.5.

The invention provides advantages in power deposition, azimuthal electric field, ion density and ion flux directionality and electron temperature. Specifically, the electric field at the wafer is reduced relative to a fixed set of process conditions, reducing device damage. The region where ions are produced (i.e., the region nearest the coil) is remote from the wafer so that non-uniformities therein are amelioriated by ion diffusion before reaching the wafer surface. The ion flux is more collimated so that a generally lower bias voltage on the wafer suffices to achieve anisotropic etching. The electron temperature gradient across the wafer surface, thereby reducing device damage due.

DETAILED DESCRIPTION OF THE PREFERRED EMBODIMENTS

Disclosure of the Parent Applications

The descriptions herein make reference to a plasma power source employing a conductor connected to an RF power source and overlying the plasma chamber ceiling, the conductor being a coiled inductor or antenna, for example, of particular shapes and ranges of shapes. However, the invention may be implemented with a plasma power source employing a conductor which is a capacitive electrode of the same particular shapes and ranges of shapes, the coil windings being replaced by a single integral conductive film as the capacitive electrode. In either case, the conductor (i.e., the coil windings or the integral conductive film) defines or conforms to a three dimensional surface or shape lying within a range of shapes to be described below, such as a truncated cone, a cylinder, a dome and a multi-radius dome, for example.

The present invention sculpts or adjusts the shape of the plasma ion density by varying the shape of either or both the conductor and the ceiling. The ceiling shape is adjusted preferably by providing a multi-radius dome-shaped ceiling and individually adjusting the different radii of the ceiling to achieve a desired ceiling shape. The multi-radius dome embodiment of the ceiling is the preferred embodiment because it has applicability to the widest process window (versatility of application) and greater plasma power efficiency than other ceiling shapes including a single-radius (hemispherical) dome. For a given ceiling shape, the conductor shape is selected from among a continuous range of shapes from a right cylinder shape at one extreme, to a shape exactly conforming with the ceiling to either a non-arcuate shape or a right cylinder shape at the other extreme of the range, as will be described below with greater particularity.

Such a selection enables the plasma ion density to be optimally uniform across the wafer surface, thereby achieving optimum processing uniformity. Such adjustments affect the plasma ion density because the ion density is affected by three factors, namely ion diffusion, local ionization near the coil inductor and local recombination near surfaces such as the ceiling surface. In a reactor in which the distances between the wafer and the ceiling and between the wafer and the coil inductor are relatively-short (e.g., on the order of, but not necessarily limited to, less than 30 cm and 32 cm, respectively), the latter two factors (local ionization near the coil inductor and local recombination near the ceiling surface) are significant and the present invention can be employed to good effect. Thus, optimizing the coil inductor shape improves the spatial profile of local ionization near the coil inductor. Optimizing the multi-radius ceiling shape improves the spatial profile of local ionization near the coil inductor and also improves the spatial profile of the local recombination at the interior ceiling surface.

Figure 1:
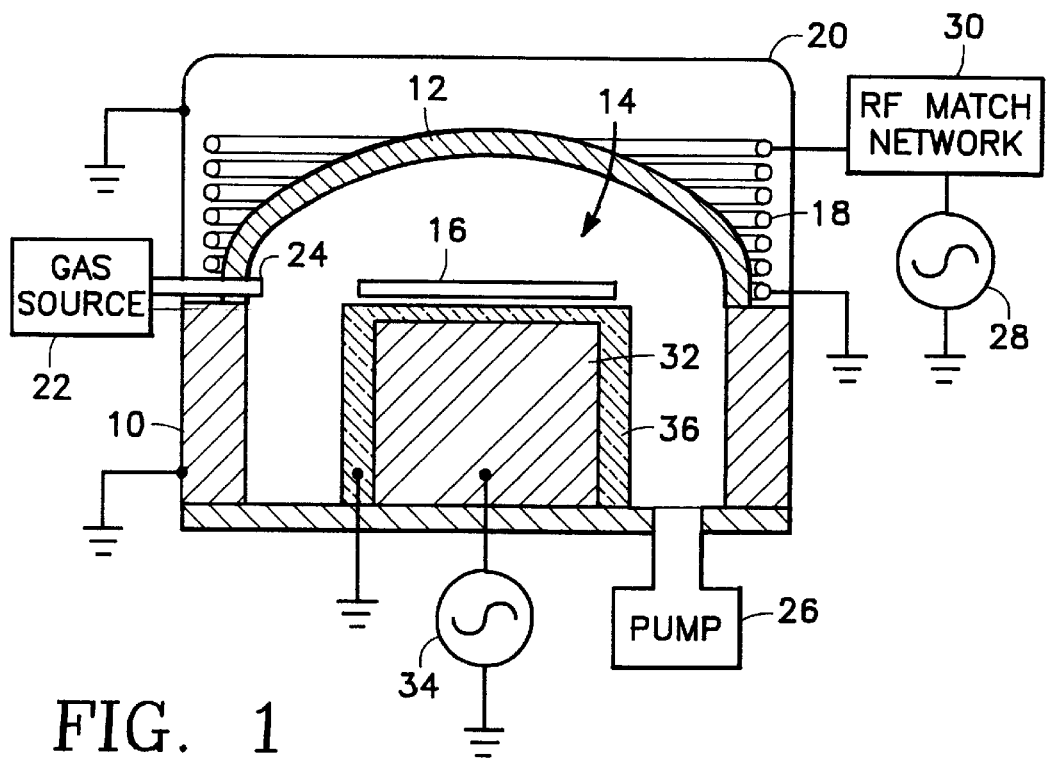
FIG. 1 is a simplified cut-away side view of an inductively coupled RF plasma reactor corresponding to a first embodiment of the invention.

Referring to FIG. 1, an inductively coupled RF plasma reactor includes a reactor chamber having a grounded conductive cylindrical sidewall 10 and a dielectric ceiling 12, the reactor including a wafer pedestal 14 for supporting a semiconductor wafer 16 in the center of the chamber, a cylindrical inductor coil 18 surrounding an upper portion of the chamber beginning near the plane of the top of the wafer or wafer pedestal 14 and extending upwardly therefrom toward the top of the chamber, a processing gas source 22 and gas inlet 24 for furnishing a processing gas into the chamber interior and a pump 26 for controlling the chamber pressure. The coil inductor 18 is energized by a plasma source power supply or RF generator 28 through a conventional active RF match network 30, the top winding of the coil inductor 18 being "hot" and the bottom winding being grounded. The wafer pedestal 14 includes an interior conductive portion 32 connected to a bias RF power supply or generator 34 and an exterior grounded conductor 36 (insulated from the interior conductive portion 32). A conductive grounded RF shield 40 surrounds the coil inductor 18. In accordance with one aspect of the invention, uniformity of the plasma density spatial distribution across the wafer is improved (relative to conical or hemispherical ceilings) by shaping the ceiling 12 in a multi-radius dome and individually determining or adjusting each one of the multiple radii of the ceiling 12. The multiple-radius dome shape in the particular embodiment of FIG. 1 somewhat flattens the curvature of the dome ceiling 12 around the center portion of the dome, the peripheral portion of the dome having a steeper curvature. The multiple-radius dome ceiling of FIG. 12 has two radii, namely a 15 inch (37.5 cm) radius R at the top and a 2.5 inch (6.25 cm) radius r at the corner. In another embodiment, the top radius R is 13 inches (32.5 cm) while the corner radius r is 4 inches (10 cm). It should be noted that as the wafer diameter is increased, the top radius R can be increased to accommodate a larger chamber size, while r generally remains the same, so that the multi-radius dome-shaped ceiling profile is relatively flatter as wafer size and chamber size increases.

In accordance with one feature of the invention, there is an approximately 10 cm (4 in.) space or horizontal distance between the circumferential edge of the wafer 16 and the inner surface of the dome 12 intersected by the plane of the wafer surface. This assures uniform plasma processing of the wafer substantially free of edge effects. Depending upon application, this space may lie in the range of about 8 cm to 15 cm, but is not necessarily limited thereto.

Figure 2:
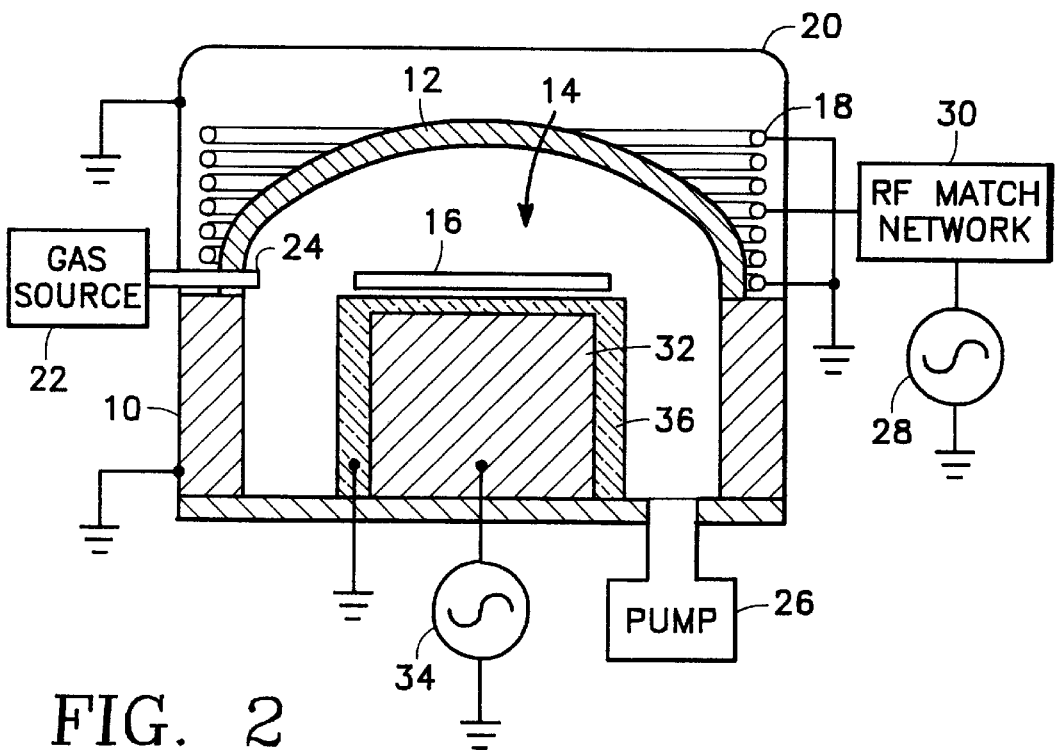
FIG. 2 is a simplified cut-away side view of an inductively coupled RF plasma reactor corresponding to a second embodiment of the invention.

As illustrated in FIG. 2, the coil inductor 18 may be coupled to the RF power source 28, 30 in a mirror coil configuration disclosed in co-pending U.S. application Ser. No. 08/277,531 filed Jul. 18, 1994 by Gerald Z. Yin et al., entitled "Plasma Reactor With Multi-Section RF Coil and Isolated Conducting Lid" and assigned to the present assignee. In the mirror coil configuration of FIG. 2, the RF source 28, 30 is connected to the center winding of the coil inductor 18 while the top and bottom ends of the coil inductor are both grounded. As described in the above-referenced application by Gerald Yin et al., the mirror coil configuration has the advantage of reducing the maximum potential on the coil.

Figure 3:
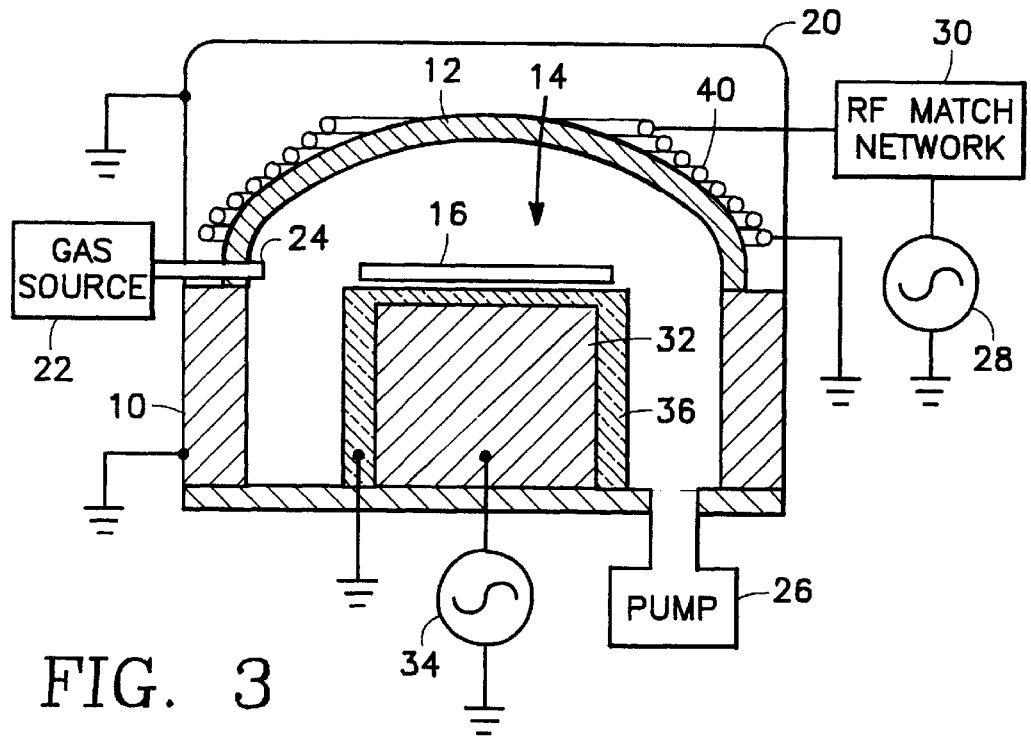
FIG. 3 is a simplified cut-away side view of an inductively coupled RF plasma reactor corresponding to a third embodiment of the invention.
Figure 4:
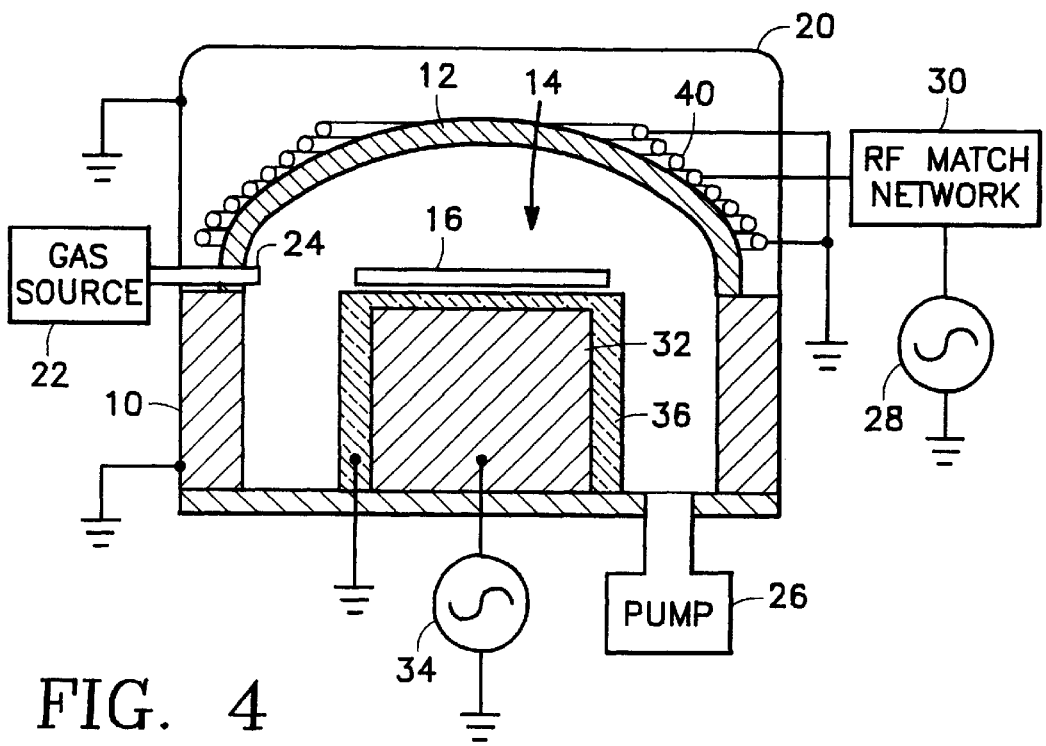
FIG. 4 is a simplified cut-away side view of an inductively coupled RF plasma reactor corresponding to a fourth embodiment of the invention.

The plasma density distribution may be varied from that obtained in the embodiment of FIG. 1 by providing a partial conical coil inductor 40 as illustrated in FIG. 3, instead of the cylindrical coil inductor. The upper windings of the conical coil inductor 40 of FIG. 3 are closer to the wafer 16 than are the upper windings of the cylindrical coil inductor 18 of FIG. 1. As illustrated in FIG. 4, the conical coil inductor 40 may be coupled to the power source 28, 30 in a mirror coil configuration analogous to that described above with reference to FIG. 2.

FIG. 4 shows that the truncated conical coil inductor 40 is spaced away from the ceiling 12 near the bottom corner of the ceiling more so than other locations along the ceiling/coil interface, due to the non-conformality between the conical coil shape and the arcuate ceiling shape. This feature advantageously suppresses sputtering at the bottom corner of the ceiling 12. For this reason, in many applications a conductor (coil inductor or capacitive electrode) which is nonconformal with the shape of the ceiling is advantageous.

Figure 5:
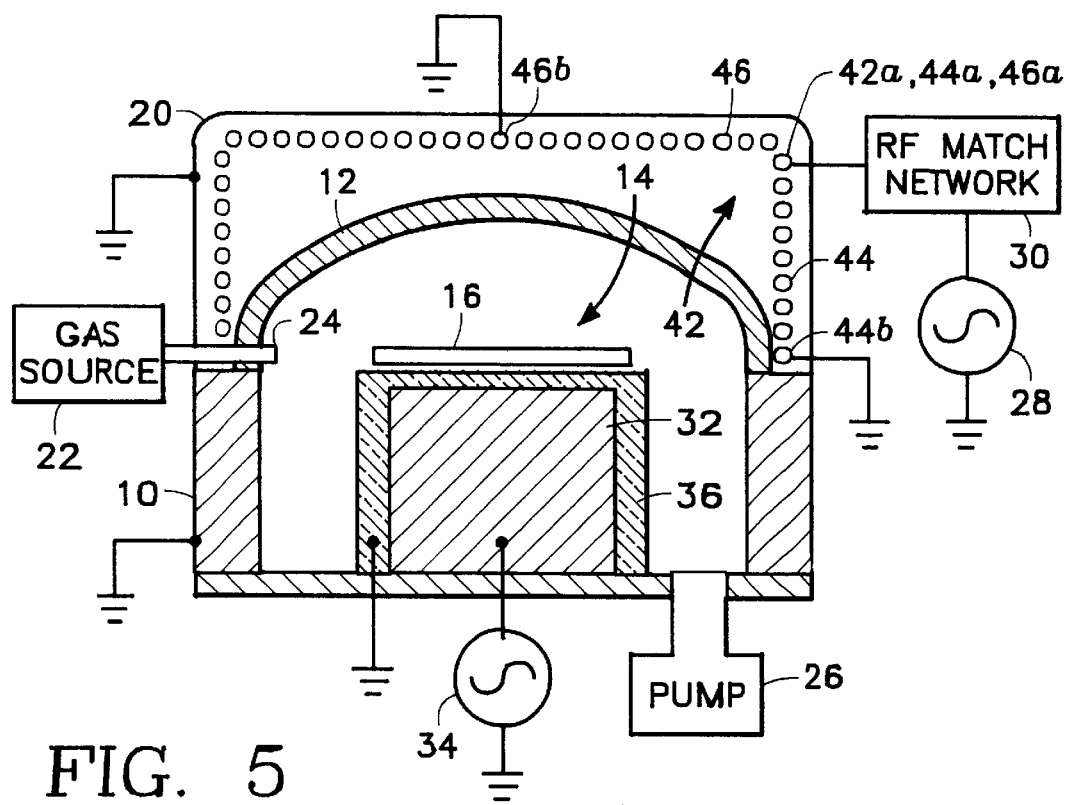
FIG. 5 is a simplified cut-away side view of an inductively coupled RF plasma reactor corresponding to a fifth embodiment of the invention.
Figure 6:
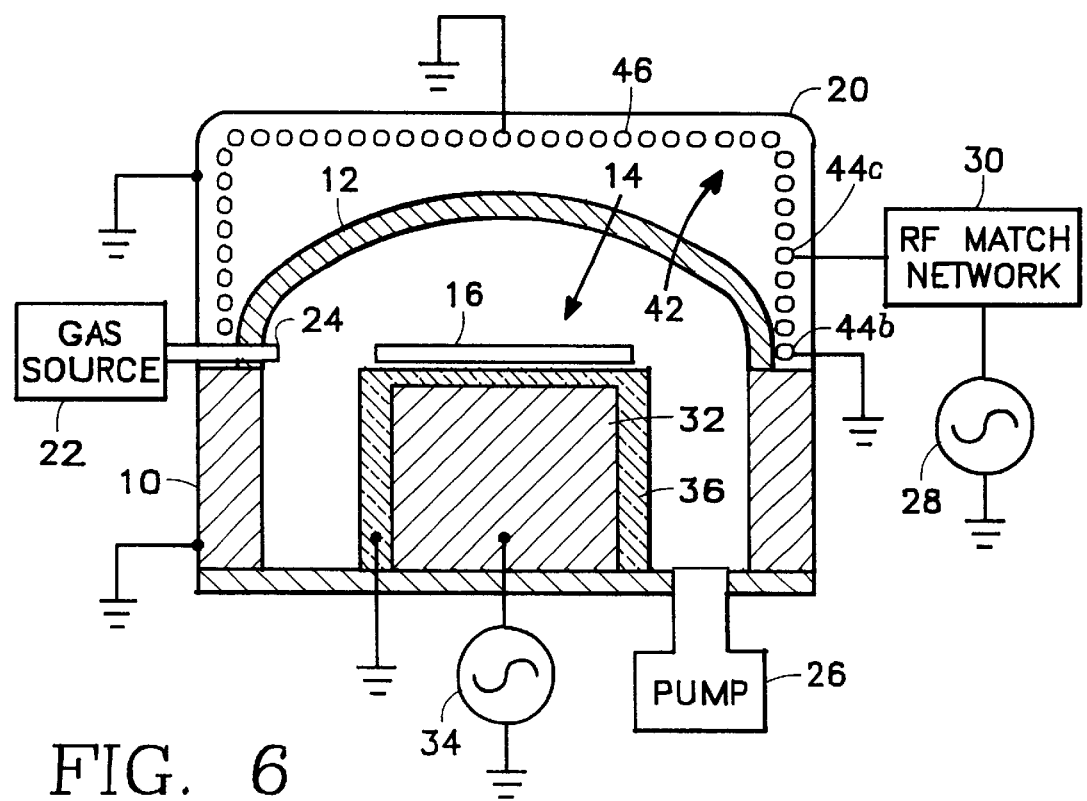
FIG. 6 is a simplified cut-away side view of an inductively coupled RF plasma reactor corresponding to a sixth embodiment of the invention.
Figure 7:
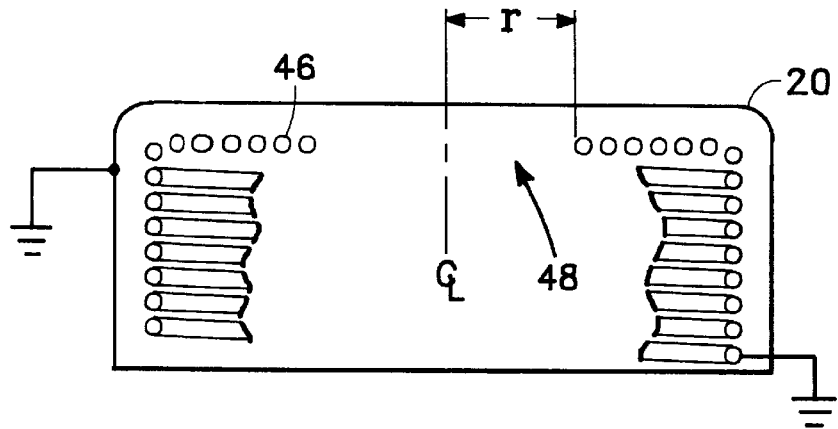
FIG. 7 is a simplified cut-away side view of an inductively coupled RF plasma reactor corresponding to a seventh embodiment of the invention.

FIG. 5 illustrates a first embodiment of the hybrid coil inductor 42 of the invention. The hybrid coil inductor 42 preferably is wound continuously from the same conductor as a unitary coil having a cylindrically shaped portion 44 and terminating in a shallow top portion 46. The cylindrically shaped portion 44 is generally configured in a manner similar to the inductor 18 of FIG. 1. The entire coil inductor 42 is energized by the same power source 28, 30. The embodiment of FIG. 5 is coupled to the power source 28, 30 in the same manner as the embodiment of FIG. 1 in which the top winding 42*a* is RF "hot" while the bottom winding 42*b* is grounded. Moreover, the top winding 42*a* of the hybrid coil inductor 42 is both the top winding 44*a* of the cylindrical coil 44 as well as being the outermost winding 46*a* of the shallow top portion 46. The end of the innermost winding 46*b* of the top portion 46 is also grounded as shown in FIG. 5. FIG. 6 illustrates how the embodiment of FIG. 5 may be modified by moving the connection of the power source 28, 30 to a winding other than the top winding 42*a*, such as the middle winding 44*c* of the cylindrical coil 44. FIG. 7 illustrates a modification in which the shallow top portion 46 has an empty space or opening 48 of inner radius r. This inner opening can compensate for the tendency of the top portion 46 to provide a higher plasma ion density at the wafer center, so that the embodiment of FIG. 7 provides a more uniform plasma ion density with the opening 48 than the embodiments of FIGS. 5 or 6 in general.

Figure 8:
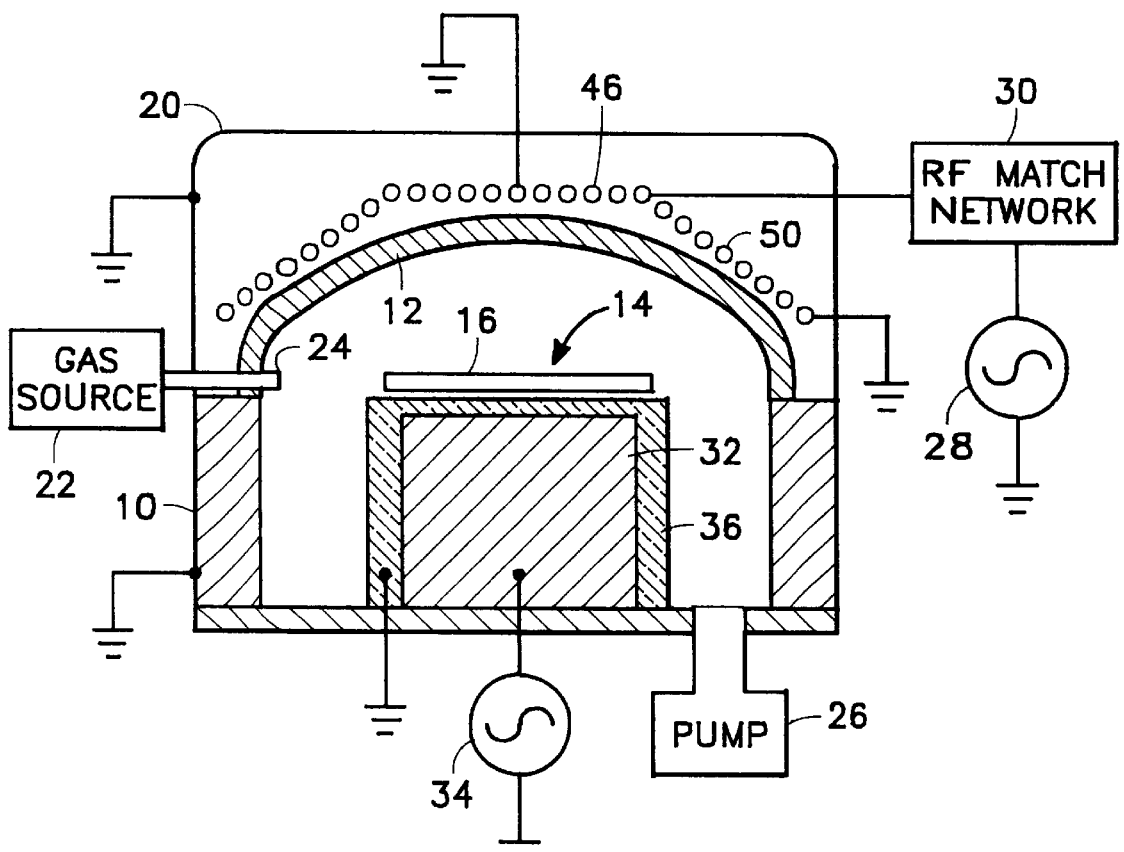
FIG. 8 is a simplified cut-away side view of an inductively coupled RF plasma reactor corresponding to a eighth embodiment of the invention.
Figure 9:
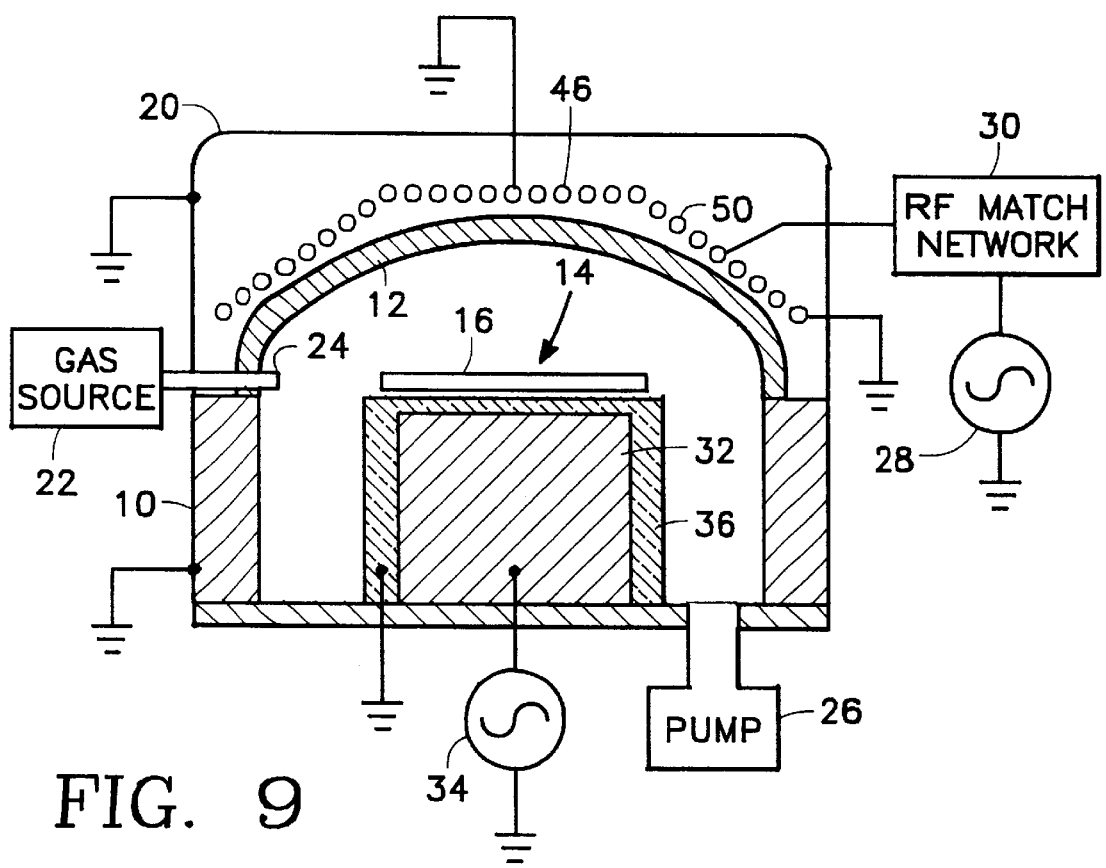
FIG. 9 is a simplified cut-away side view of an inductively coupled RF plasma reactor corresponding to a ninth embodiment of the invention.
Figure 10:
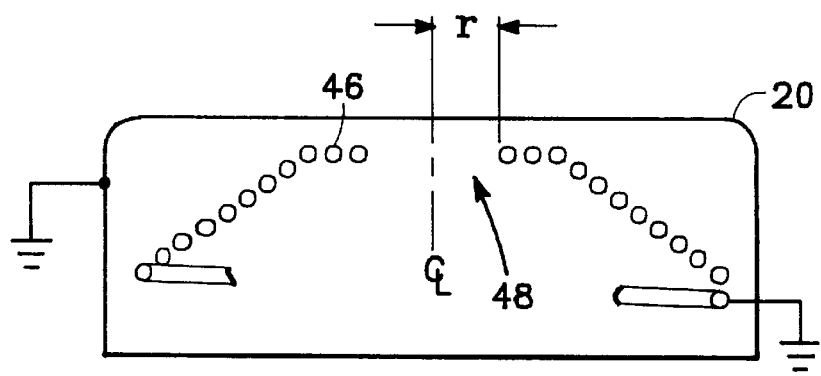
FIG. 10 is a simplified cut-away side view of an inductively coupled RF plasma reactor corresponding to a tenth embodiment of the invention.

FIG. 8 illustrates a second embodiment of the hybrid inductor consisting of the shallow top portion 46 and a conical side coil 50 corresponding to the conical coil inductor 40 of FIG. 3 in lieu of the cylindrical coil 44 of FIG. 5. As in the embodiment of FIG. 5, both portions 46, 50 of the coil are wound from the same continuous conductor and a single power source 28, 30 connected to the top winding 50*a* energizes the whole coil inductor. FIG. 9 illustrates how the power source 28, 30 may be connected to a winding other than the top winding 50*a*, as in FIG. 6. FIG. 10 illustrates how a center opening 48 may be provided in the top coil portion 46 in combination with the conical side coil 50.

Figure 11:
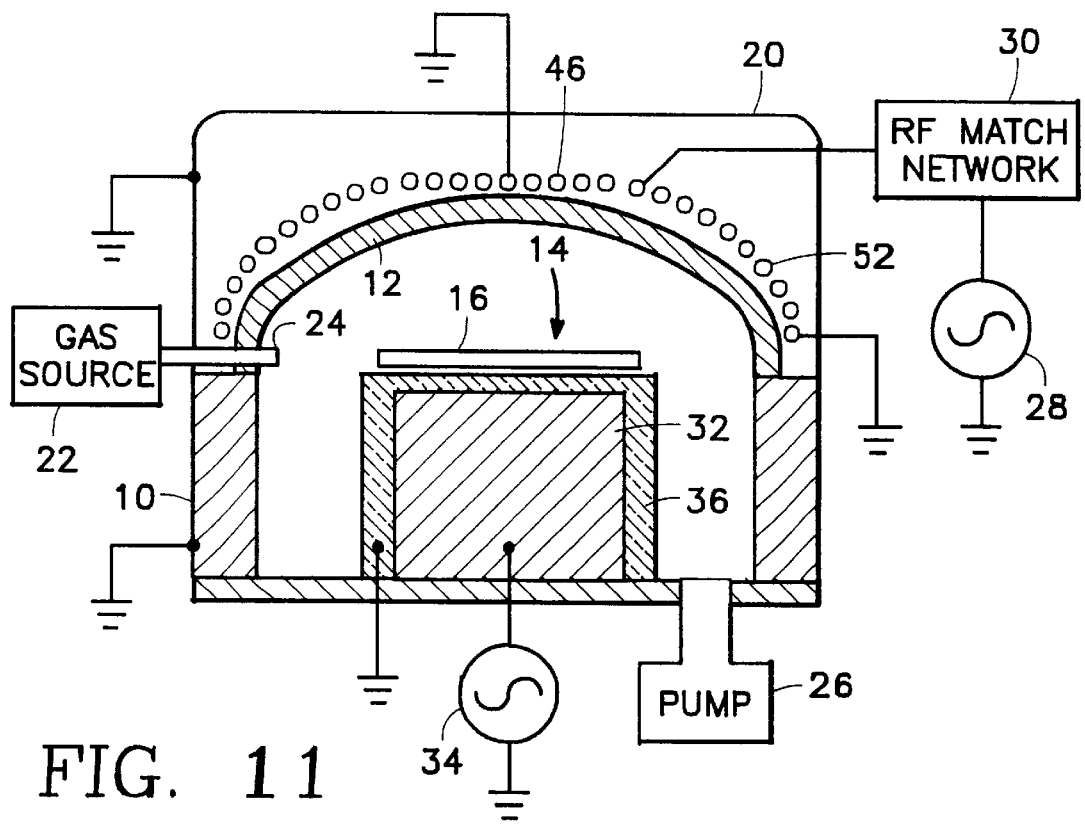
FIG. 11 is a simplified cut-away side view of an inductively coupled RF plasma reactor corresponding to an eleventh embodiment of the invention.

FIG. 11 illustrates a third embodiment of the hybrid coil inductor of the invention in which the cylindrical side coil 44 or the conical side coil 50 are replaced by a curved-section (e.g., dome) shaped coil 52, with the power source 28, 30 being connected to the outermost winding 46*a* of the top portion 46. As in FIG. 5, both coil portions 46, 52 are continuously wound from the same conductor and energized with one power source 28, 30. In FIG. 11, the center or top coil portion 46 is the most shallow while the side or bottom coil portion 52 is the steepest, the top coil portion most closely conforming with the shallow shape of the center of the multi-radius dome ceiling 12, this conformality diminishing radially away from the center. In an alterative embodiment, the entire coil inductor 46, 52 may be of exactly the same shape as the ceiling 12 for complete conformality.

Figure 12:
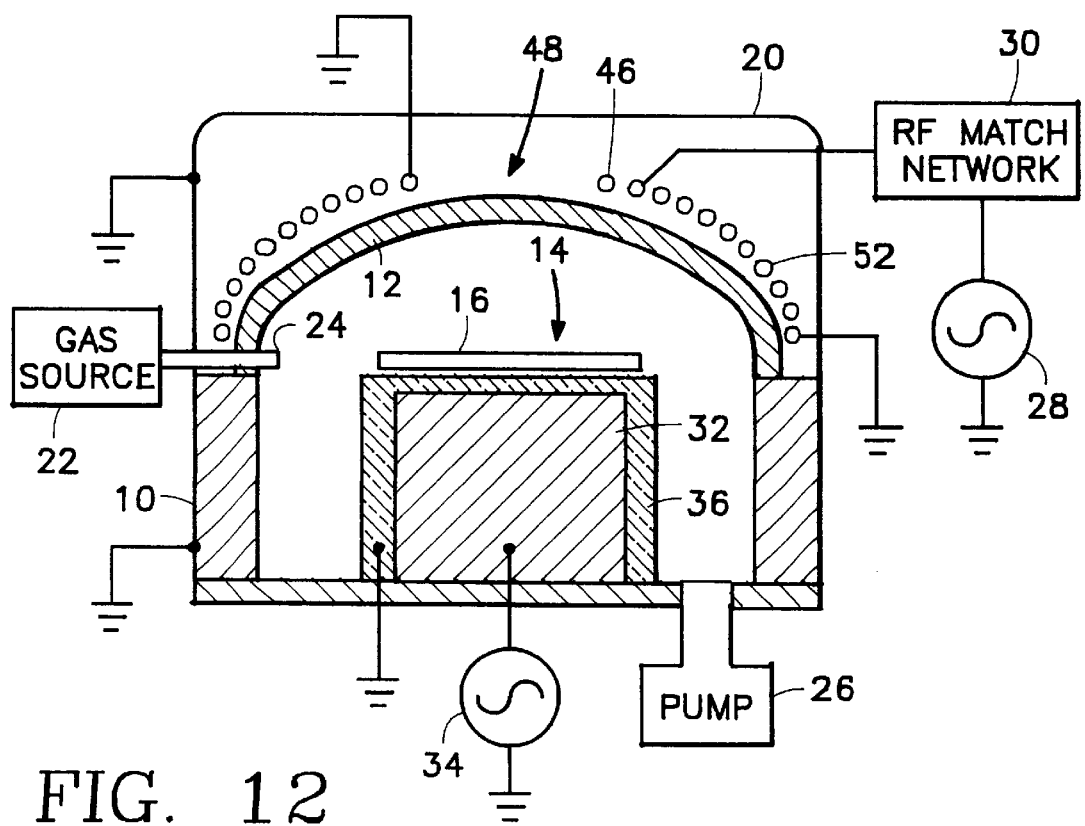
FIG. 12 is a simplified cut-away side view of an inductively coupled RF plasma reactor corresponding to an twelfth embodiment of the invention.

FIG. 12 illustrates how the opening 48 in the top portion 46 may be combined with the curved-section side coil 52. In embodiments such as that of FIG. 12 in which the conductor (coil inductor 52 or capacitive electrode of the same shape) is at least nearly conformal with the dome ceiling, the ion current density tends to be higher near the wafer center and therefore undesirable nonuniform, provided that the highest part of the ceiling (the center) is at least 75 cm (3 in.) above the wafer. (A lesser height, such as 50 cm or less, causes the ion current density near the wafer center to be lower than at other portions of the wafer due to recombination effects near the ceiling.) The problem of excessive ion current density at the wafer center is solved by the aperture 48 because the aperture 48 reduces the ion current density at the wafer center to a level at which the overall ion density distribution across the wafer is generally more uniform, depending upon the radius of the aperture 48. For example, a 50 cm (20") diameter chamber for processing a 30 cm (12") diameter wafer with a nearly conformal conductor (e.g., coil inductor) as that illustrated in FIG. 12, the aperture 48 should be in the range of 15 cm to 35 cm (6" to 14") in diameter to provide a more nearly uniform ion current density distribution across the wafer surface. As another example, a 35 cm (14") diameter chamber for processing a 20 cm (8") wafer, the aperture 48 should be in the range of about 10 cm to 25 cm (4" to 10").

Implementations of the embodiment of FIG. 12 in which the coil inductor 52 is conformal with the ceiling 12 readily ignite the plasma. In comparison, the non-conformal embodiments such as the conical coil inductor of FIG. 4 have greater difficulty igniting a plasma, although they better suppress sputtering near the lower ceiling corner, as discussed above. Therefore, at plasma source power levels above 2000 Watts, the embodiment of FIG. 4 is most suitable while at plasma source power levels below 2000 Watts the embodiment of FIG. 12 (with a ceiling-conformal coil shape and aperture) is most suitable.

Figure 13:
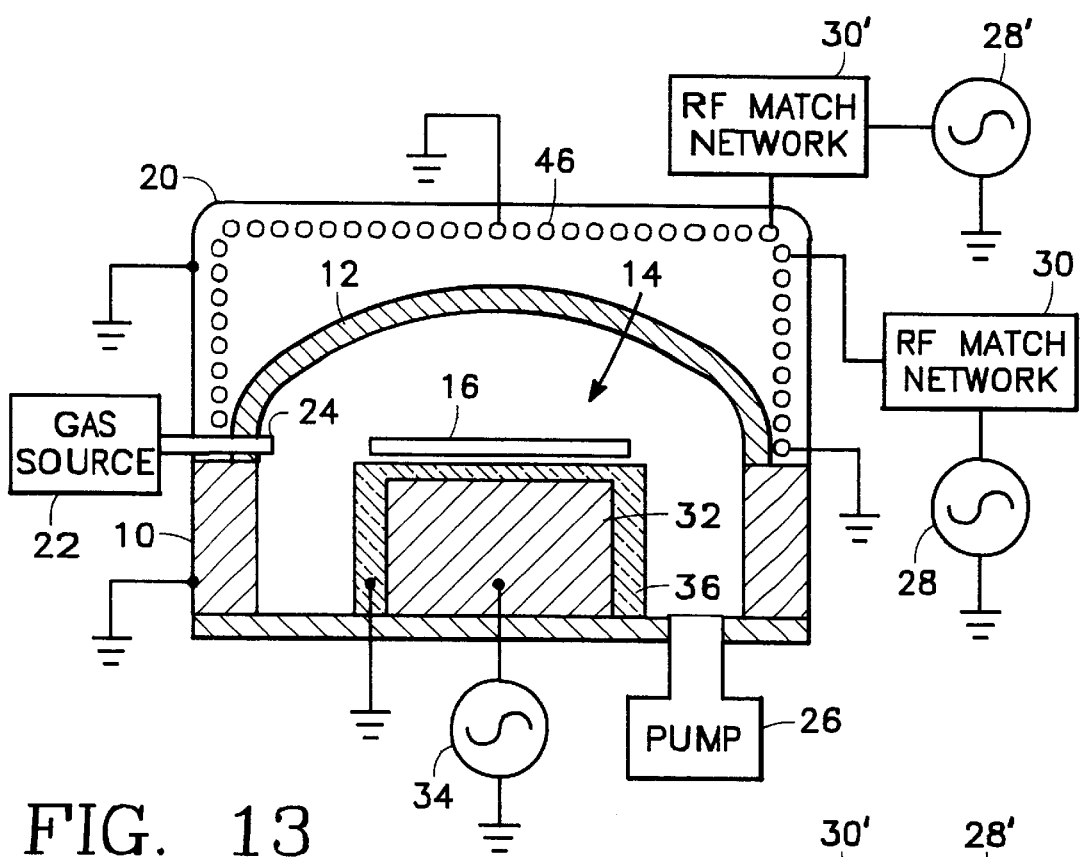
FIG. 13 is a simplified cut-away side view of an inductively coupled RF plasma reactor corresponding to an thirteenth embodiment of the invention.
Figure 14:
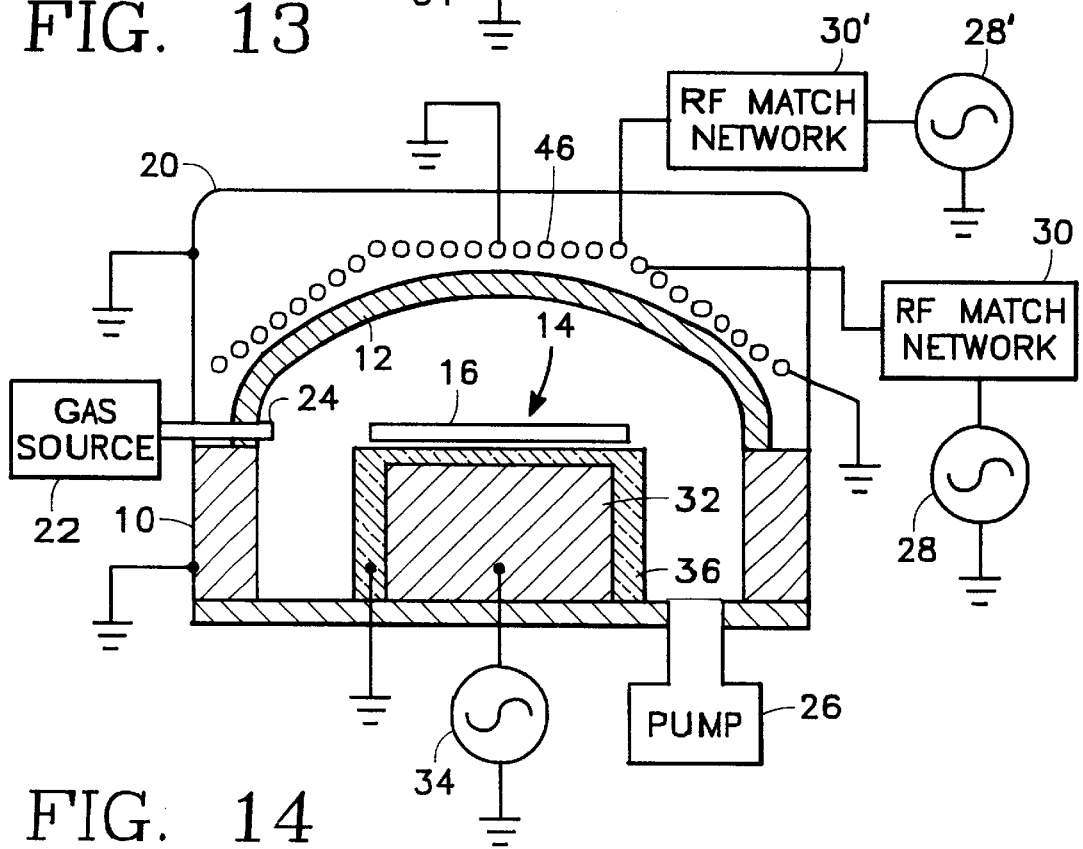
FIG. 14 is a simplified cut-away side view of an inductively coupled RF plasma reactor corresponding to an fourteenth embodiment of the invention.
Figure 15:
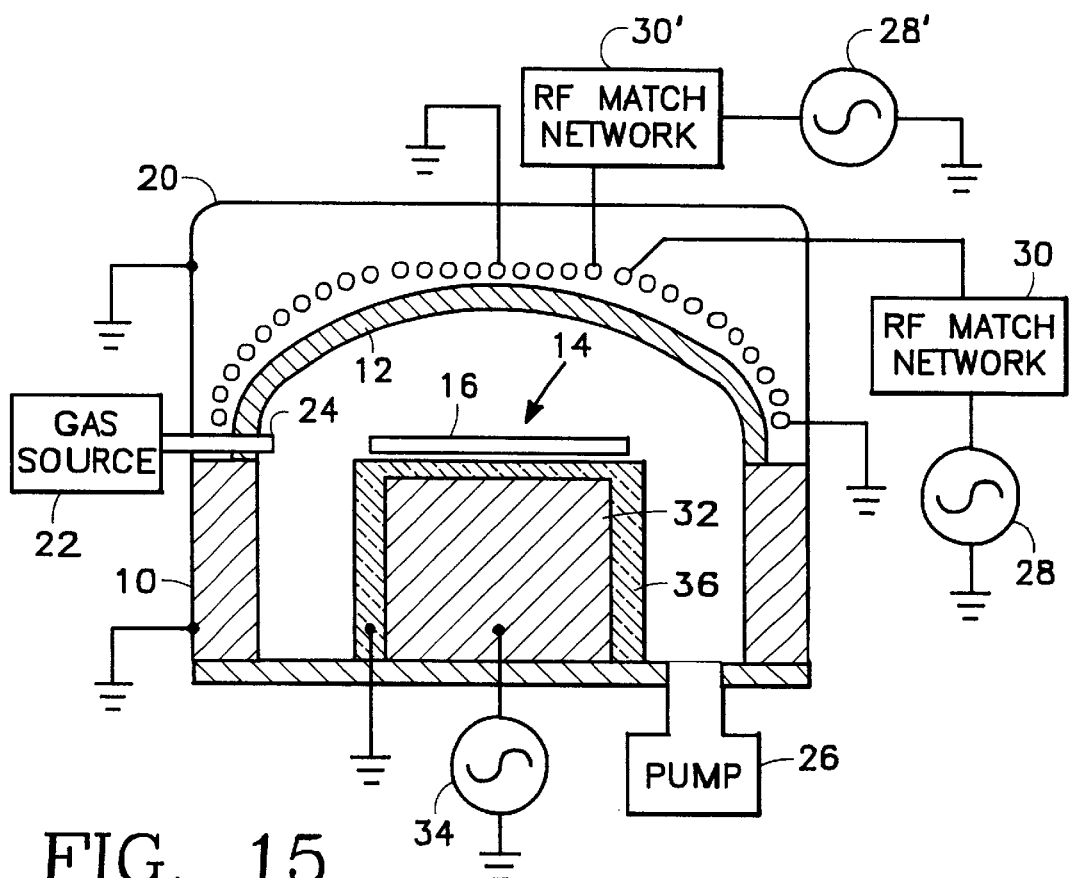
FIG. 15 is a simplified cut-away side view of an inductively coupled RF plasma reactor corresponding to an fifteenth embodiment of the invention.

FIG. 13 illustrates how the embodiment of FIG. 5 may be modified by electrically separating the portions 44, 46 of the unitary coil and energizing each coil portion 44, 46 with separately controllable independent RF power sources 28, 30 and 28', 30'. This feature has the advantage that the plasma ion density in the wafer center may be controlled relative to the plasma ion density elsewhere by changing the power output of one of the power sources 30, 30' relative to the other. FIGS. 14 and 15 illustrate how the same modification may be made to the embodiments of FIGS. 8 and 11 respectively.

The dual power supply embodiments of FIGS. 13–15 may be used to reduce, if desired, the plasma ion density at the wafer center by increasing the power of the flat top coil RF source 28', 30' or decreasing it in the case of insufficient plasma ion density at the wafer center. Further adjustments of the power input are possible to bias the pedestal and substrate, relative to the power inputs to the coil portions.

Figure 16:
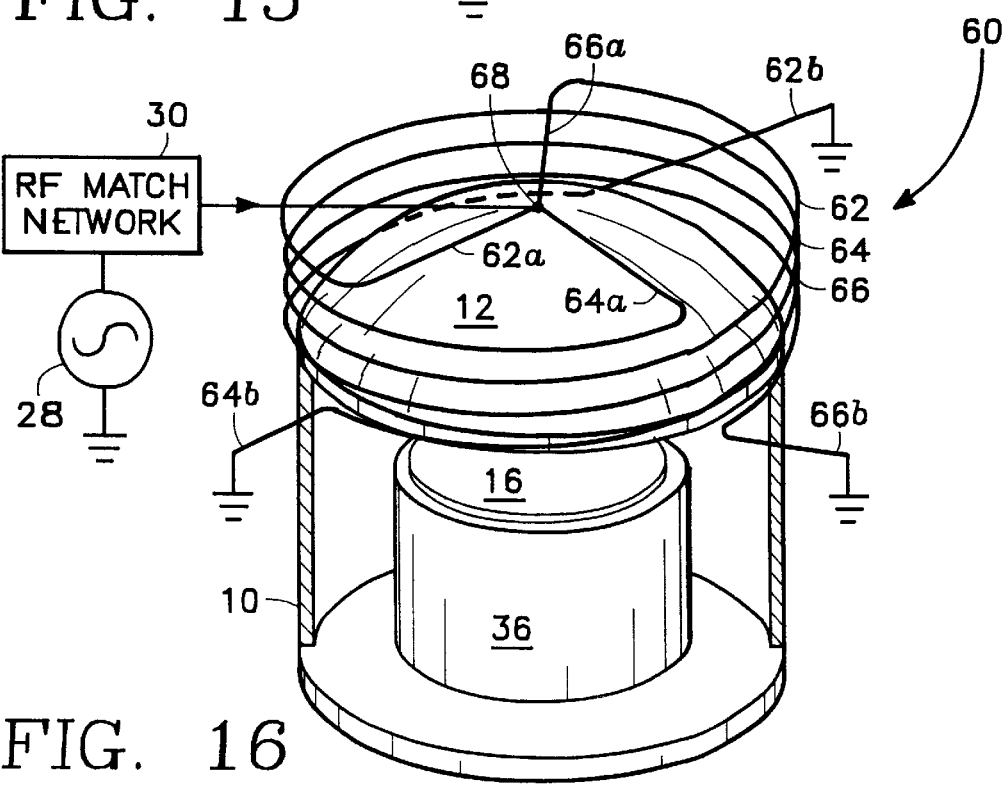
FIG. 16 illustrates an embodiment corresponding to FIG. 1 employing a coil inductor consisting of multiple concentric spiral conductors.

Referring to FIG. 16, the cylindrical coil inductor 18 of FIG. 1 may be replaced by a multiple spiral coil inductor 60 consisting of plural (e.g., three) concentric spiral conductors 62, 64, 66 connected to a common apex 68 by respective straight conductors 62a, 64a, 66a. The RF match network 30 is connected to the apex 68 while the ends 62b, 64b, 66b of the spiral conductors 62, 64, 66 are connected to ground. Preferably, the spiral conductors 62, 64, 66 are of equal lengths so that the ends 62b, 64b, 66b are equilaterally spaced about an arc. Such a multiple spiral coil inductor is disclosed in U.S. patent application Ser. No. 08/332,569 filed Oct. 31, 1994 by Xue-Yu Qian et al. entitled "Inductively Coupled Plasma Reactor With Symmetrical Parallel Multiple Coils Having a Common RF Terminal" and assigned to the present assignee.

Figure 17:
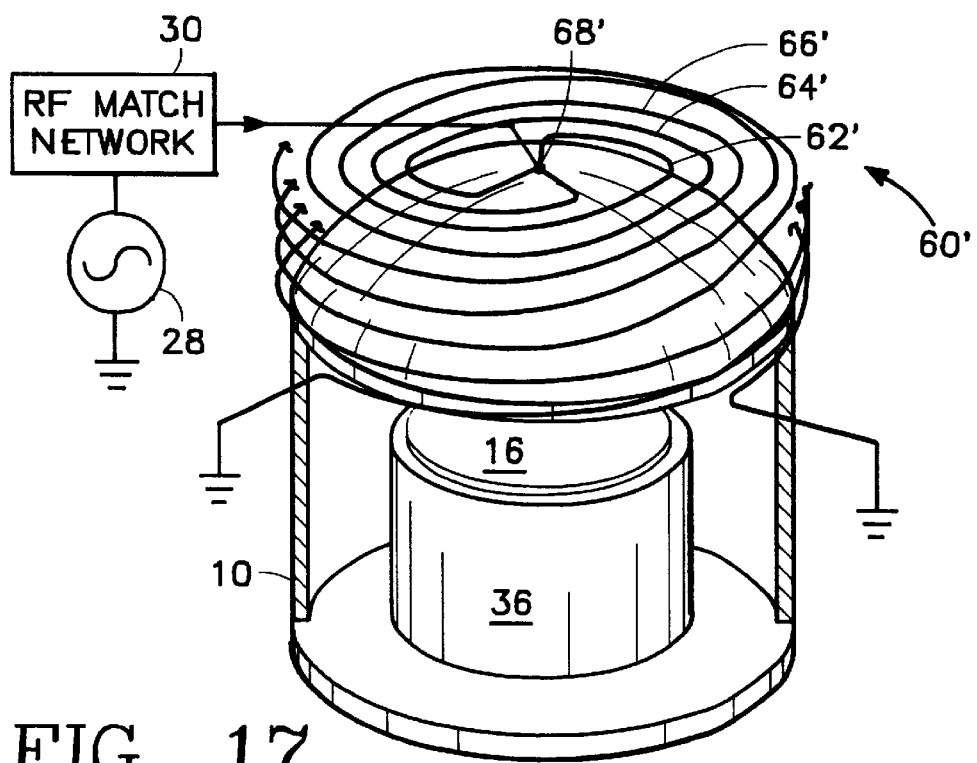
FIG. 17 illustrates an embodiment corresponding to FIG. 5 employing a coil inductor consisting of multiple concentric spiral conductors.

Referring to FIG. 17, the right-cylinder shaped coil inductor 42 of FIG. 5 may also be replaced by a multiple spiral coil inductor 60' like that of FIG. 16. In FIG. 17, the multiple spirals continue from the outer circumference of the multiple spiral coil inductor 60' to the apex 68.

Figure 18:
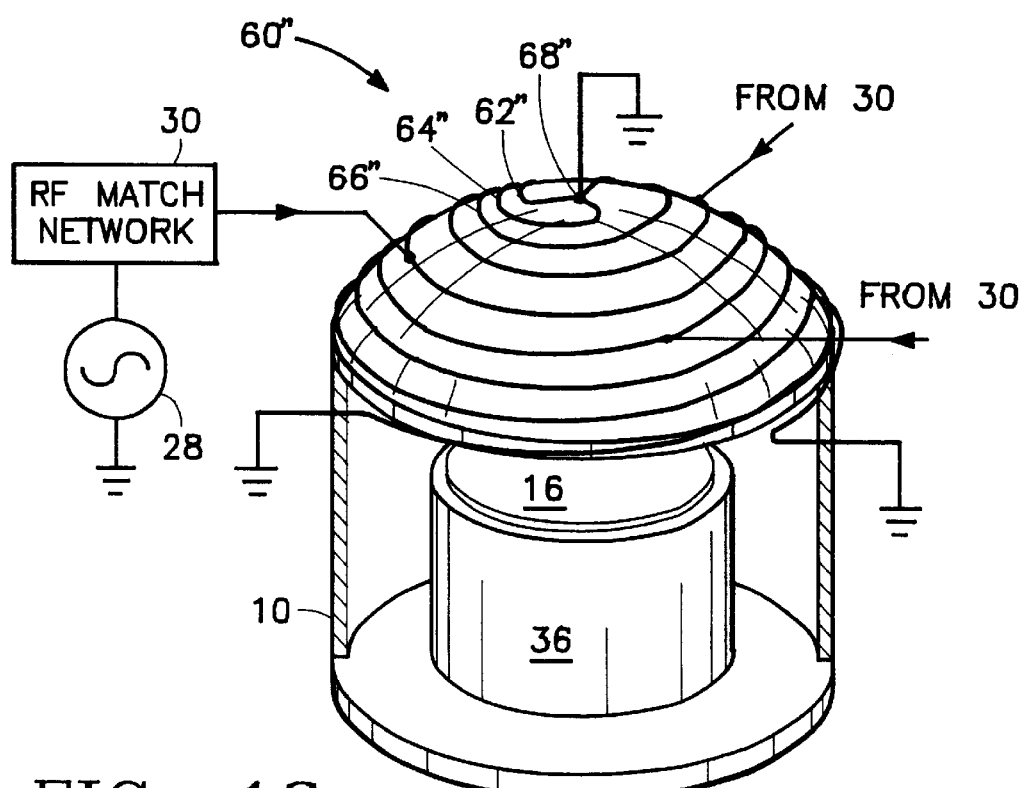
FIG. 18 illustrates an embodiment corresponding to FIG. 11 employing a coil inductor consisting of multiple concentric spiral conductors.

Referring to FIG. 18, the dome-shaped coil inductor of FIG. 11 may be replaced by a dome-shaped multiple spiral coil inductor 60' consisting of plural (e.g., three) concentric spiral conductors 62', 64', 66' connected at a common apex 68'. In one variation generally applicable to multiple spiral coil inductors disclosed herein, the apex 68' and the ends of all multiple spiral conductors 62', 64', 66' are grounded while the RF match network 30 is connected to mid-points along each of the multiple spiral conductors 62', 64', 66' (similar to the mirror-coil configurations of FIGS. 2, 4, 6, 8, 9 and 11, for example). This divides each multiple spiral conductor 62', 64', 66' into two sections, although the number of sections may be greater than two. For two sections, the sections are mirror coils. For this purpose, adjacent sections are oppositely wound (wound in opposite directions) so that the magnetic fields from all sections add constructively, as described in both the above referenced applications by Yin et al. and by Qian et al. This illustrates how any embodiment employing multiple spiral coil inductors may be modified in accordance with a mirror coil configuration to provide multiple coil sections, as described in detail in the above-referenced application by Xue-Yu Qian et al.

Figure 19:
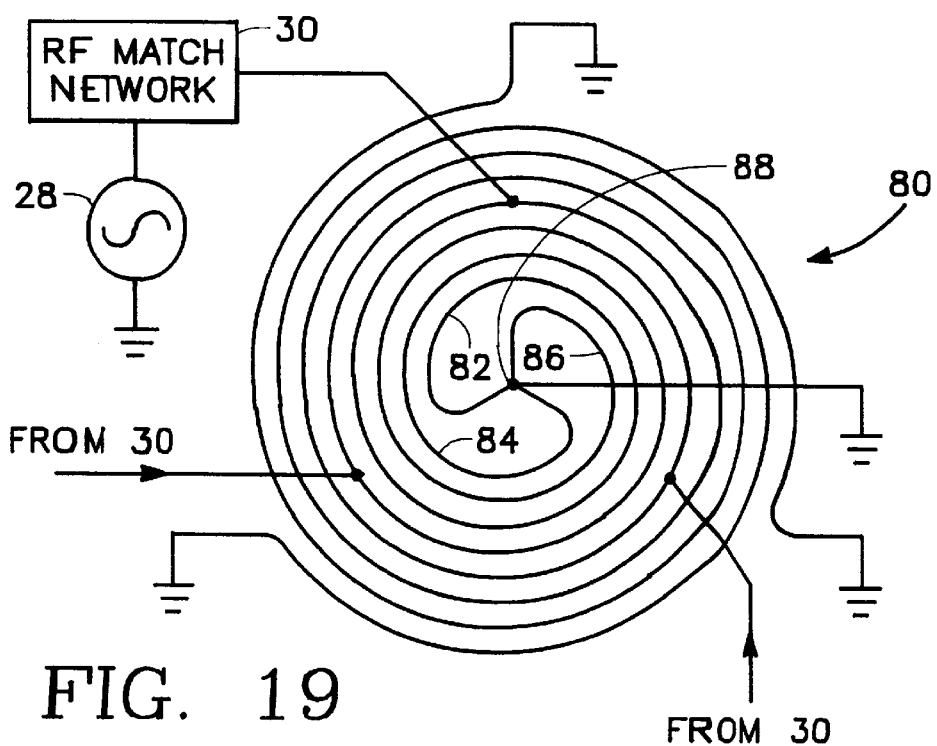
FIG. 19 illustrates an embodiment corresponding to FIG. 14 employing a coil inductor consisting of multiple concentric spiral conductors.
Figure 20:
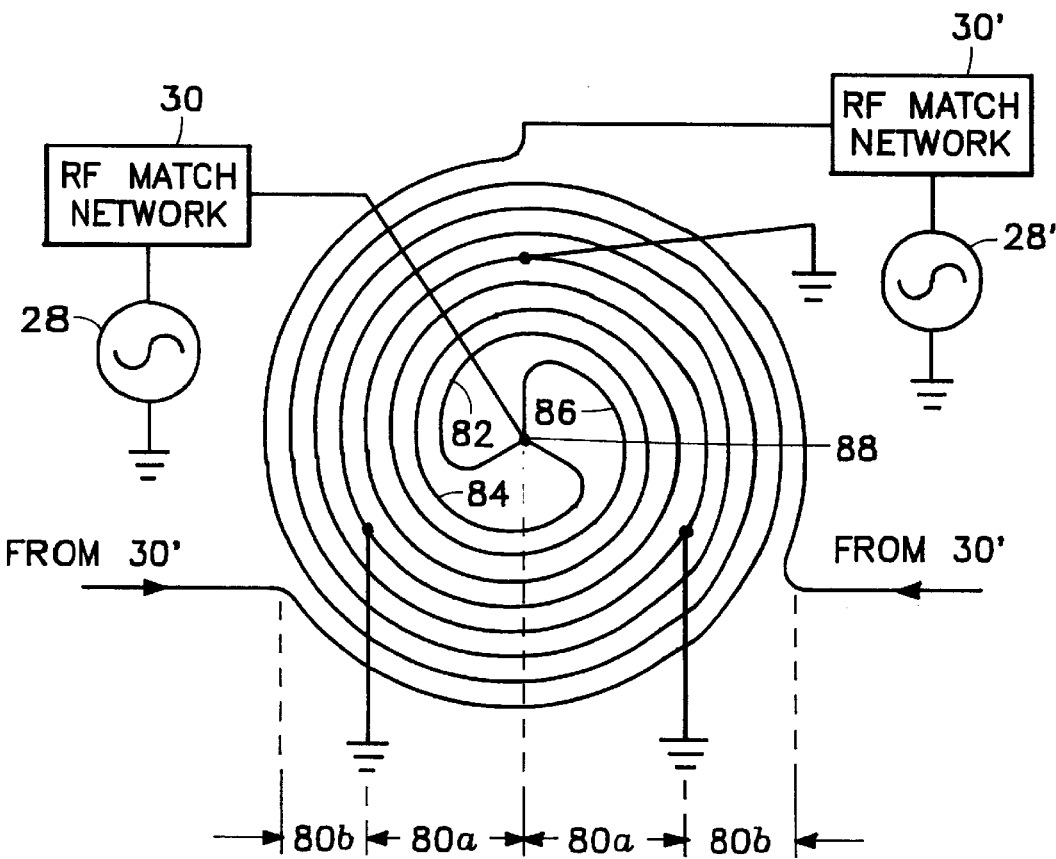
FIG. 20 illustrates a modification of the embodiment of FIG. 19 in which different portions of the inductor are powered independently.

Referring to FIG. 19, the truncated conical coil inductor 46 of FIG. 14 may be replaced by a multiple spiral coil inductor 80 of the same shape consisting of plural (e.g., three) concentric spiral conductors 82, 84, 86 connected at a common apex 88. Referring to FIG. 20, as yet another modification applicable to any of the multiple spiral coil inductors disclosed herein, the coil inductor 80 is divided into two separately powered sections, a top section 80a and a bottom section 80b. The two sections 80a, 80b are powered independently by separately controllable RF generators 28, 28' and RF match networks 30, 30', respectively. In yet a further modification, eliminating the upper portion 80 a provides an inductor (80b) having a central aperture as in the embodiments of FIGS. 10 and 12 described previously herein. In this manner both the benefits of optimizing control over many other plasma-related factors may be obtained simultaneously.

In summary, the embodiments of FIGS. 1 through 20 generally include an arcuate-shaped non-conductive or dielectric ceiling 12 which may be a dome and preferably a multiple-radius dome supported in facing spaced overlapping relationship with the wafer pedestal 32, 36. The central portion of the ceiling 12 is centered relative to the coil inductor 18 and relative to the wafer pedestal 32, 36 and has the largest radius and the peripheral or circumferential portion of the ceiling 12 has the smallest radius, so that the central portion overlying the center of the wafer pedestal 32, 36 is the most shallow or flattest and constitutes a substantial fraction of the diameter of the ceiling 12 while the remaining peripheral portion is the steepest or most curved. Preferably, the inductor 18 is a wound coil preferably wound in a multi-radius shape as in FIGS. 11 or 12, but ranging between the right cylinder shape of FIGS. 1 and 2 to the planar shape of the top portion 46 of the coil inductors of FIGS. 5–14, the conical and multi-radius shapes lying within this range. The multi-radius coil inductors 52 of FIGS. 11 and 12 are either conformal with the multi-radius curvature of the ceiling 12 (as in FIG. 12 are non-conformal (as in FIG. 11). In fact, all of the embodiments except that of FIG. 12 have coil inductors whose shapes are non-conformal with the multi-radius dome-shaped ceiling 12. In general, for a non-conformal coil inductor, the inductor (e.g., the multi-radius inductor 52 of FIG. 11) has at least one zone of an intermediate radius (from the center of inductor) which is axially spaced from the ceiling 12 to a greater degree than other zones (e.g., the center portion 46 ) of the inductor, as is the case with the embodiments of FIGS. 5–9 and 12. In the case of the multi-radius inductor 52, the central portion (e.g., the central portion 46 of FIG. 11) of the inductor is most nearly flat and is closest to the ceiling 12, and has a maximum radius of curvature at its center (46) and a minimum radius of curvature at is periphery. If there are only two radii of curvature of the multi-radius inductor, then the maximum radius of curvature extends to an intermediate portion inward from the periphery while the minimum radius of curvature extends from the periphery to the intermediate portion. Alternatively, it is desirable for there to be many radii progressing monotonically from the maximum at the center to the minimum at the periphery of the inductor. In the embodiments of FIGS. 7, 10, 12 and 20, the inductor defines a central aperture or hole (e.g., the hole 48 of FIG. 10), which has the advantage of providing a way of sculpting the plasma density by reducing the radiated RF power at the center of the inductor. This feature is particularly complementary to the embodiments of FIGS. 5–15 having central flat inductor portions 46. Of the foregoing feature, each may be suitably combined with others of these features and each may be exaggerated or minimized to achieve a multi-faceted sculpting of the spatial distribution of plasma density. Specifically, many useful coil shapes for optimizing plasma density distribution will be non-conformal relative to the ceiling shape, in that an intermediate radial zone of the coil shape will be spaced away from the ceiling surface in the axial direction to a greater degree than those portions of the coil nearest the center of the ceiling (as in FIG. 11, for example). An advantage is that sputtering of the ceiling is reduced where this spacing is significant near the bottom corner of the ceiling.

Figure 21:
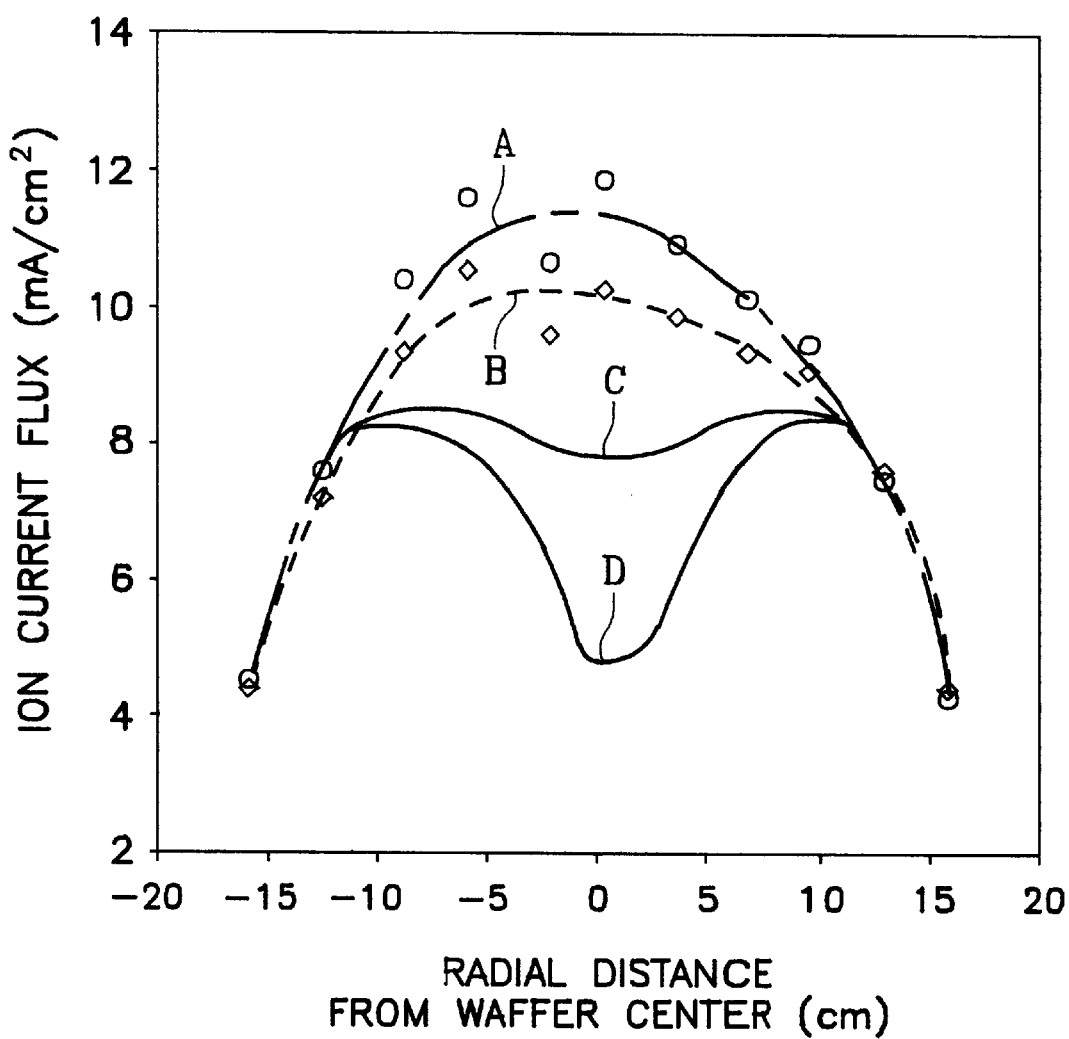
FIG. 21 is a graph of experimental data comparing the spatial distributions of plasma ion flux density for a coil inductor conformal with the dome ceiling and for a right cylinder coil inductor.

The graph of FIG. 21 illustrates how adjusting the shape of the coil inductor adjusts the plasma ion density spatial distribution. The vertical axis is the plasma ion density while the horizontal axis is the radial distance from the wafer center. The data points denoted by the empty circle symbols (corresponding to curve A) represent experimental data obtained in an Argon plasma with a coil inductor conforming the with the multiple radius dome ceiling. The data points denoted by solid diamonds (corresponding to curve B) represent experimental data obtained in an Argon plasma with a right cylinder-shaped coil inductor. The curve labelled C represents the plasma ion distribution obtained in a chlorine-containing plasma with a coil inductor conforming with the multi-radius dome shape. The curve labelled D represents the plasma ion distribution obtained in a chlorine-containing plasma with a right-cylinder-shaped coil inductor. The ion current flux scales of curves C and D are normalized and do not comport with the scale of curves A and B as defined on the ordinate of FIG. 21. The graph of FIG. 21 shows that for a plasma having practical applicability, such as the chlorine-containing plasma of curves C and D, the multi-radius dome shape provides the most nearly uniform ion current distribution across the wafer. On the other hand, in an Argon plasma, the right cylinder-shaped coil inductor provides a flatter ion density distribution compared with that obtained with the conformal (dome-shaped) coil inductor.

Ordinarily, the chamber pressure may be varied to sculpt the ion current distribution across the wafer surface. Specifically, in order to correct for excessive ion current density at the wafer center, the pressure should be increased, while the pressure should be decreased to correct inadequate ion current density at the wafer center. For example, in the case of a conformal coil as in FIG. 12 with a 10 cm quartz dome ceiling and applied plasma source power of 1500 Watts, the ideal chamber pressure is on the order of about 10 mTorr for optimizing ion current distribution uniformity. However, an advantage of the multi-radius dome-shaped ceiling is that it provides plasma processing which is more insensitive to changes in process conditions (such as chamber pressure) and therefore affords a wider process window. The advantages (including greater plasma distribution uniformity) afforded by the multi-radius dome-shaped ceiling obtains over a wide window or variation in process recipes and process chemistries.

Similarly, the applied plasma source power (e.g., from the RF source 28) may be varied to sculpt the ion current distribution across the wafer surface. Specifically, in order to correct for excessive ion current density at the wafer center, the RF power should be decreased, while the RF power should be increased to correct inadequate ion current density at the wafer center. For example, in the case of a conformal coil as in FIG. 12 with a 10 cm quartz dome ceiling and applied plasma source power of 1500 Watts, the ideal RF power level from the RF source 28 is on the order of about 1500 Watts for optimizing ion current distribution uniformity. However, as mentioned above, an advantage of the multi-radius dome-shaped ceiling is that it provides plasma processing which is more insensitive to changes in process conditions (such as applied plasma source power) and therefore affords a wider process window.

While the invention has been disclosed with reference to application in metal etch plasma reactors, it is also useful with plasma reactors for performing semiconductor (silicon and polysilicon) etch, dielectric (e.g., silicon dioxide) etch, silicide etch, nitride etch, polymer etch, chemical vapor deposition, physical vapor deposition and the like. As employed herein, the term silicide refers to a composition of silicon and a metal such as tungsten, while the term nitride refers to a composition of silicon and nitrogen. Polymer etch is a general term, although the most practical application of a polymer etch process is in etching photoresist polymers.

Each one of FIGS. 1–20 illustrates how the plasma reactor chamber is irradiated with plasma source RF power by a conductor overlying the chamber ceiling and having a particular shape conforming with a three dimensional surface such as a cone, cylinder or dome. While each of these figures shows how that conductor may be a coiled inductor, it should be understood that the conductor may instead be a capacitive electrode of the same shape (same three dimensional surface). In either case, the pedestal 36 is not necessarily connected to an RF bias source, and preferably is not so connected in the case in which the conductor is a capacitive electrode rather than a coil inductor.

Regime of Inductive Coil and Dome Ceiling Heights

The dome-shaped ceiling provides the advantage that the plasma discharge near the wafer center is enhanced as compared with that experienced with a flat ceiling, so that plasma ion density is more uniform across the wafer. This is because ionization and recombination are affected by the proximity of the ceiling, and the dome-shaped ceiling is further from the wafer center and nearer the wafer edge as compared with a flat ceiling. A multi-radius dome ceiling with a similarly shaped inductive coil has a closer distance between the center of the ceiling and the wafer as compared to a hemispherical dome. This provides a better plasma discharge control near the center zone of the dome and the plasma uniformity is better than that of the hemisphere.

In an inductively coupled plasma etch reactor of the following embodiment, ion density uniformity is improved, ion energy is better controlled and device damage is optimized, so that as a result etch profile control is enhanced, etch selectivity is improved and etch microloading is minimized. These results are achieved by adhering to an optimized coil-dome geometry including a particular dome apex height range relative to the dome base and a particular wafer position range relative to the dome apex. Different but related problems are overcome in this embodiment in enhancing etch selectivity, ion density uniformity, etch profile and source power efficiency while reducing ion damage, as follows.

1. Problems Relating to Etch Selectivity:

Etch selectivity is provided by depositing passivation species from the plasma onto wafer surfaces. For example, in etching a silicon dioxide layer over a polysilicon underlayer, passivation species including polymers accumulate more on polysilicon than on silicon dioxide, so that the polysilicon etches more slowly than the silicon dioxide, thus providing the desired etch selectivity. In silicon dioxide etch processes, the polymers are formed from fluoro-carbon gases in the plasma. In aluminum etch processes, the polymers are formed from, among other things, photoresist and other non-volatile species sputtered into the plasma from the wafer surface. The problem is that a flatter coil or one closer to the wafer center tends to decrease local ionization at the wafer center, while enhancing deposition or formation of polymer near the wafer center. Without such polymer formation, etch selectivity is reduced or non-existent. Conversely, enhancing etch selectivity by reducing local ionization at the wafer center (by un-flattening the dome-shaped coil) reduces ion density at the wafer center, thereby degrading ion density uniformity.

2. Problems Relating to Etch Profile:

A vertical side-wall profile of etched features is provided by deposition of passivation species such as polymer on the vertical and horizontal etched surfaces and anisotropic removal of them from the horizontal surfaces by ion bombardment. For this purpose, ions in the plasma impinging on the wafer preferably travel in a vertical direction, so that their energy is concentrated on the horizontal surfaces and very little polymer is removed from the vertical surfaces. One problem is that a plasma source relatively closer to the wave provides a strong dissociation and ionization of gases, but less recombination and passivation. A vertical etch profile is difficult to maintain, unless relatively high bias RF power is employed, which results in significant sputtering, low selectivity, etch profile microloading and wafer surface damage. A second problem is that the directionality of ions impinging on the wafer center is more random since there is less collimation by distance from the plasma source power to the wafer (e.g., the coil-to-wafer distance in an inductively coupled reactor). Again, a higher RF bias power is required to help collimate the ion flux, and this results in the problems discussed hereinabove.

3. Problems Relating to Ion Density Uniformity:

Moving the coil closer to the wafer to increase ion density at the wafer (by flattening the dome-shaped coil) at some point forces the ceiling so close to the wafer that recombination losses near the ceiling suppress ion density at the wafer center, as noted above. Moreover, at such a close distance the ion density uniformity at the wafer surface has a greater tendency to reflect the generally non-uniform toroidal distribution pattern at the ceiling. Such a close proximity reduces the opportunity for plasma diffusion to change the plasma distribution from the ceiling to the wafer to a less toroidal and more nearly uniform distribution.

4. Problems Relating to Ion Damage Control:

Ion bombardment damage at the wafer can be reduced by improving plasma ion distribution uniformity and decreasing the RF bias power applied to the wafer pedestal. This however reduces the vertical directionality of the ions and thereby degrades etch profile, as noted above. Increasing the source distance to increase ion collimation and improve passivation will reduce required RF bias power and minimize wafer damage.

5. Discovery of the Coil and Dome Ceiling Height Ranges:

In the main examples of the following description, the wafer diameter lies in the range of 150–200 mm (6"–8") and the chamber multi-radius dome-shaped ceiling maintains plasma distribution uniformity over the entire range, as significant advantage. For larger wafer diameters (such as 300 mm or 12"), the geometries described below for the smaller sizes are scaled upwardly. In particular, the major radius R of the multi-radius dome is scaled upwardly along with chamber diameter.

FIGS. 22A, 22B, 22C and 22D illustrate a progression of multi-radius dome ceiling shapes from flattest to steepest, corresponding to the method of one embodiment for discovering the correct coil height and dome ceiling height, relative to the dome base, for enhancing etch selectivity, etch profile, ion damage control and ion density together. In FIG. 23, the curves labelled A, B, C and D illustrate the ion density radial distribution at the wafer surface corresponding to the reactors of FIGS. 22A, 22B, 22C and 22D, respectively.

The reactors in each one of FIGS. 22A–D have the following features in common: a ceiling 100 resting on a cylindrical side wall 105 of diameter D on the order of 13" (although the dome diameter may be in the range of 10"–15") surrounding a wafer pedestal 110 and a pumping annulus 115. An inductive coil 120 overlies and conforms with the ceiling 100 and extends from the periphery 100a of the ceiling part way toward the center, the coil 125 defining a center aperture 125 of diameter A on the order of about 8". A semiconductor wafer 130 of diameter d on the order of 6" rests on the wafer pedestal 110. The cylindrical side wall 105 has a height h above the wafer 130. A plasma source RF power supply 135 is applied to the coil 120 near its outer end, the other end of the coil 120 being grounded. A bias RF power supply 140 is connected to the wafer pedestal 110.

Figure 22A:
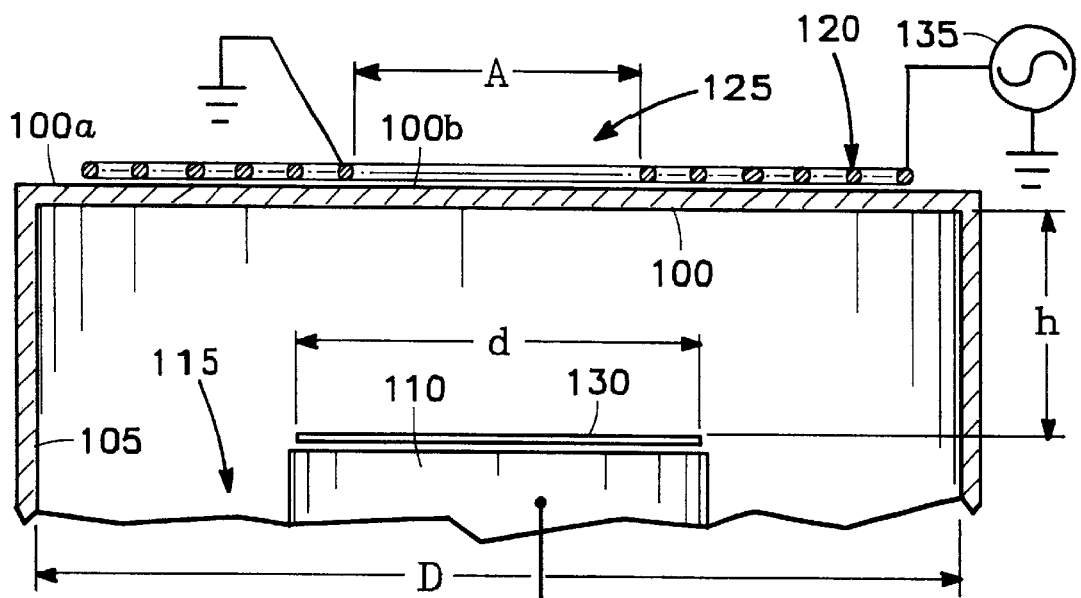
FIGS. 22A–22D illustrate a progression of RF plasma reactor shapes which differ from one another in accordance with the degree of flatness of a multi-radius dome-shaped ceiling.
Figure 23:
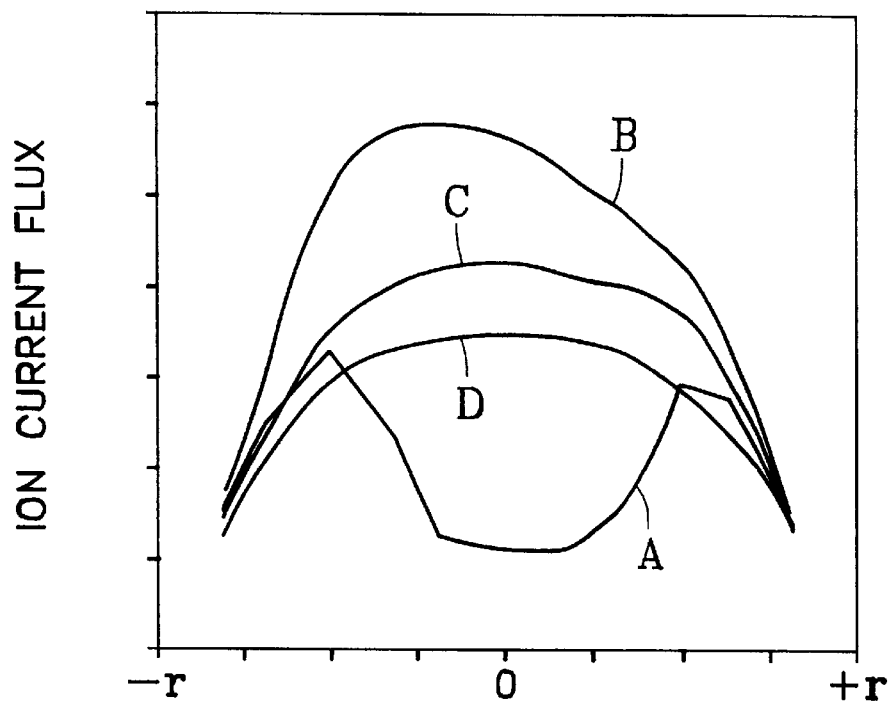
FIG. 23 is a graph of ion density as a function of radial position on a wafer in the reactor chamber, including curves corresponding to each of the examples of FIGS. 22A–22D.

In FIG. 22A, the ceiling 100 is at least nearly flat, and therefore recombination losses at the ceiling predominate over the wafer center. As a result, plasma ion density near the wafer center is very low, as indicated by the curve labelled A in FIG. 23.

Figure 22B:
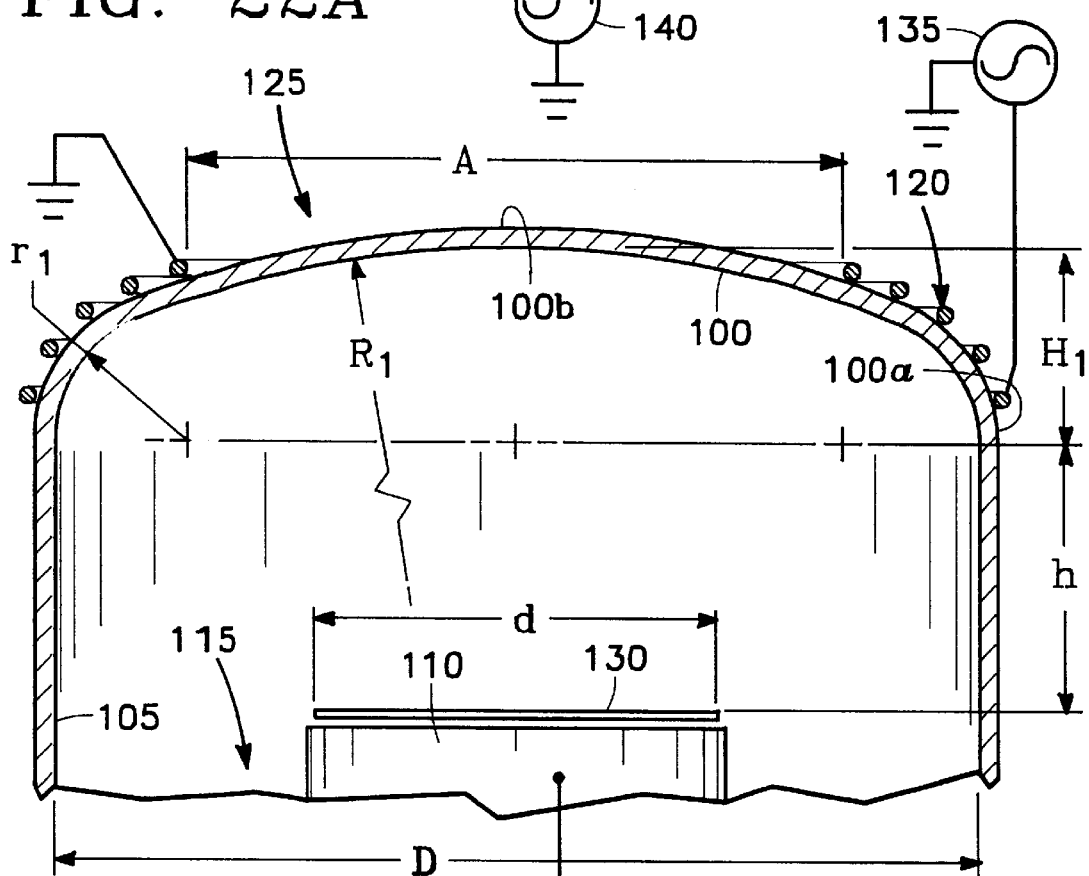

In FIG. 22B, the ceiling is less flat, corresponding to a shallow multi-radius dome shape, with a center radius R1 and a small corner radius ri and height Hi. Because the curvature of the dome-shaped ceiling 100 increases the distance of the ceiling 100 from the wafer center, recombination losses at the wafer center are negligible, as indicated by the curve labelled B in FIG. 23. In fact, with the elimination of recombination losses at the wafer center, the reactor of FIG. 22B provides the highest ion density. The disadvantage is that the in density is non-uniform, there being a pronounced peak at the wafer center. The coil 120 is relatively close to the wafer center in FIG. 22B, so that formation of polymer is somewhat suppressed, leading to poor etch profile and etch selectivity. Moreover, the local ionization is so close to the wafer 130 that the directionality of ions impinging on the wafer surface is more random, further degrading etch profile.

Figure 22C:
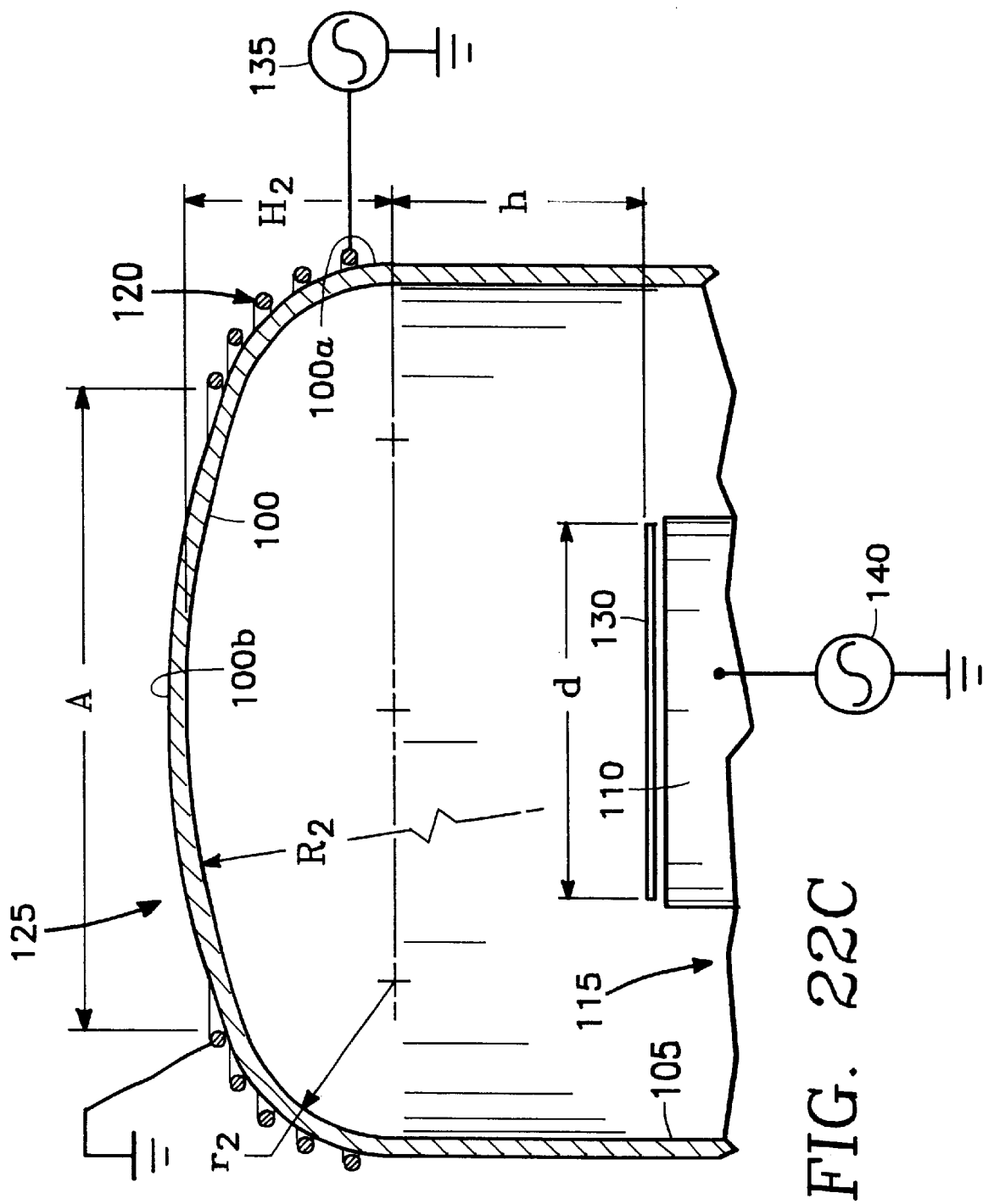

In FIG. 22C, the center radius R2 and corner radius r2 of the dome-shaped ceiling are such that the ceiling has a base-to-apex height H2 greater than H1, so that the coil to wafer distance is greater. As a result, polymer formation is not as suppressed and ion directionality is more vertical, leading to better etch profile and etch selectivity. However, the coil 120 is still sufficiently close to the wafer 130 that the ion density is relatively high, as indicated by the curve labelled C in FIG. 23.

Figure 22D:
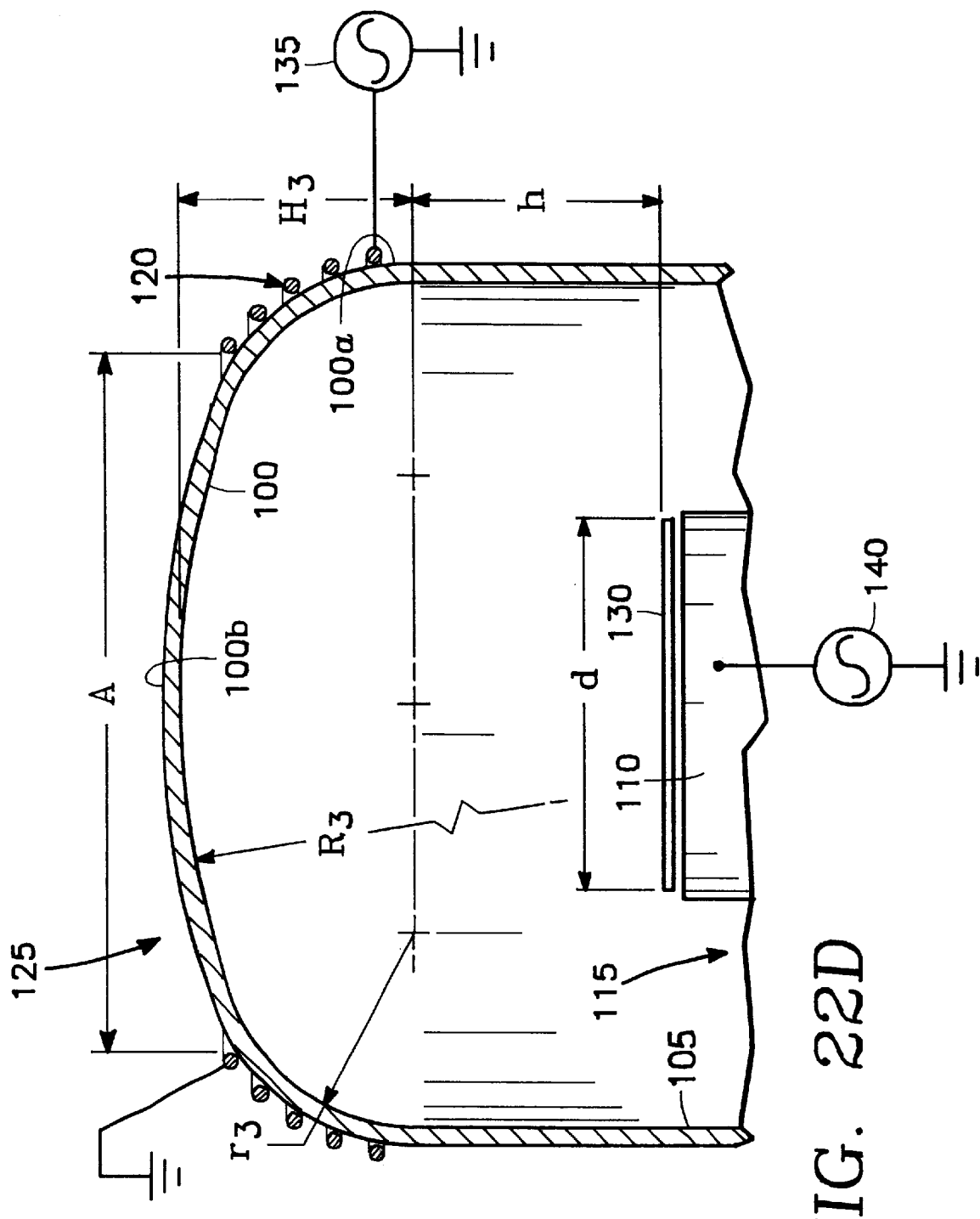

In FIG. 22D, the center radius R3 and corner radius r2 are such that the ceiling 100 has a base-to-apex height H3 greater than H2, so that the ion density at the wafer surface is less, as indicated by the curve labelled D of FIG. 23.

Table A sets forth the comparative dimensions of the embodiments of FIGS. 22A–D. It is a discovery of the invention that the foregoing problems are solved in the regime where R/r is between about 2 and 10, h is between about 1.5" and about 41" while H is between about 31" and about 6", and where H+h is between 3.5" and 7". For larger wafer sizes, this latter dimension increases to about 11" for an 8" diameter wafer, for example.

TABLE A

| FIG. | h | H | H + h |
|---|---|---|---|
| 22A | 2" | 0" | 2" |
| 22B | 2" | 3" | 5" |
| 22C | 2" | 4.7" | 6.7" |
| 22D | 2" | 5.5" | 7.5" |

Figure 25:
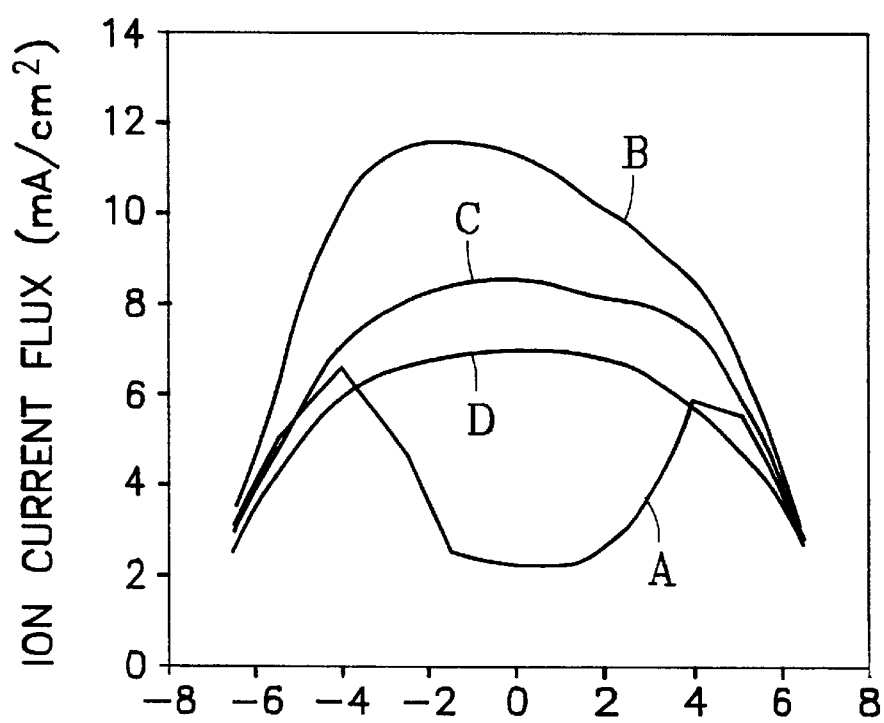
FIG. 25 is a graph of ion density as a function of radial position on a wafer in the reactor chamber, including curves corresponding to each of the examples of FIGS. 22A–22D.
Figure 24A:
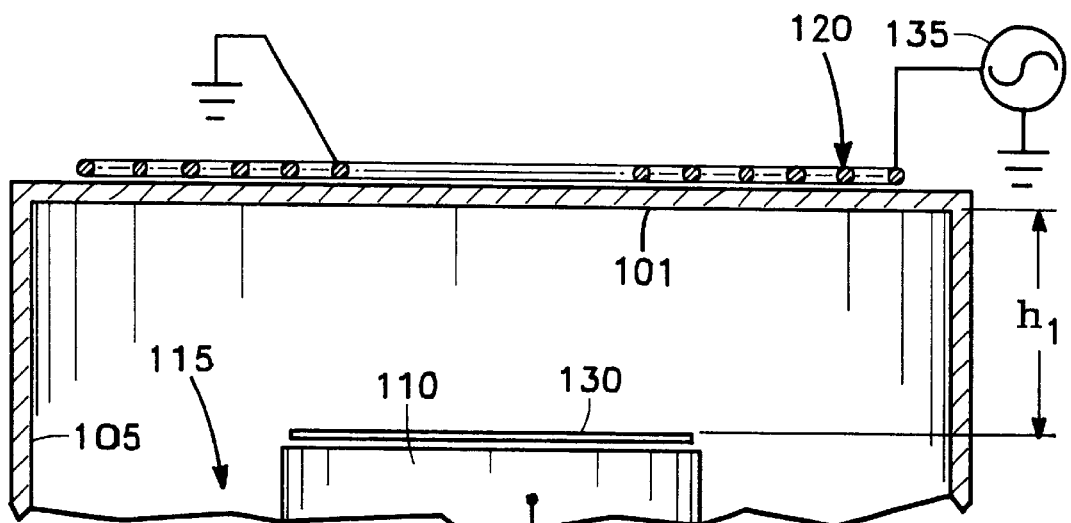
FIGS. 24A–24D illustrate a progression of RF plasma reactor shapes employing a multi-radius dome ceiling, the shapes differing from one another in accordance with the height of the chamber side wall.
Figure 24B:
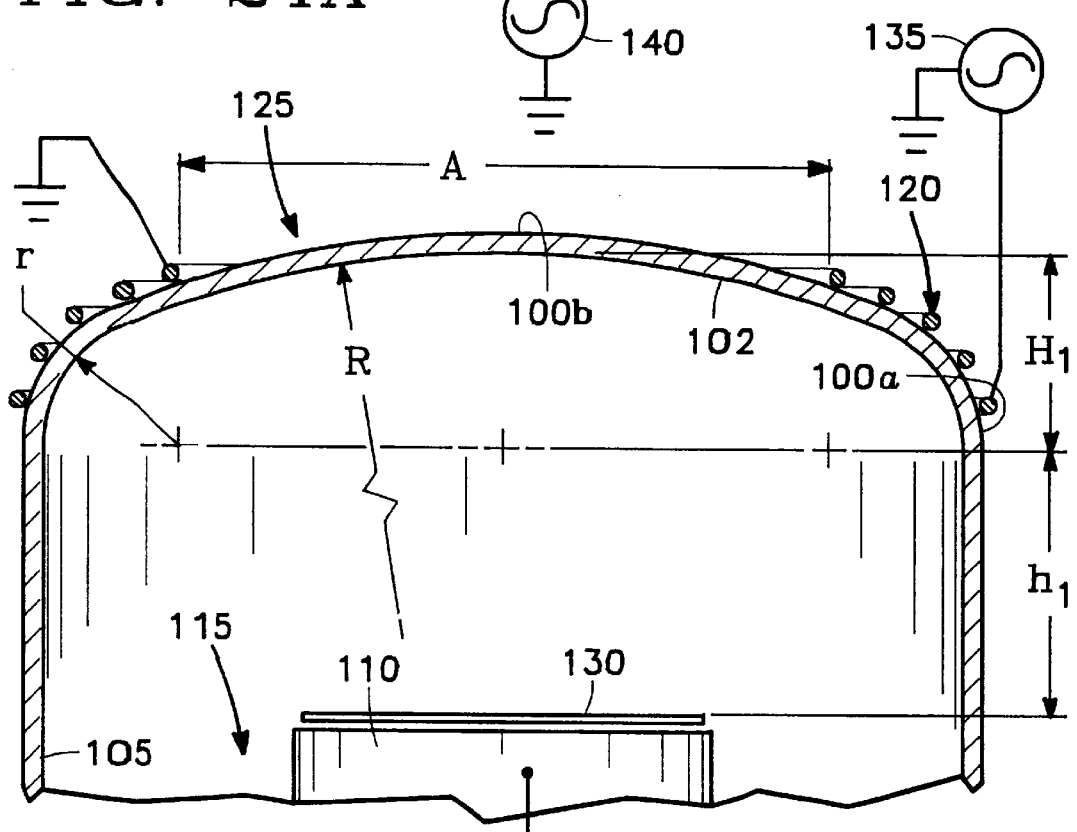
Figure 24C:
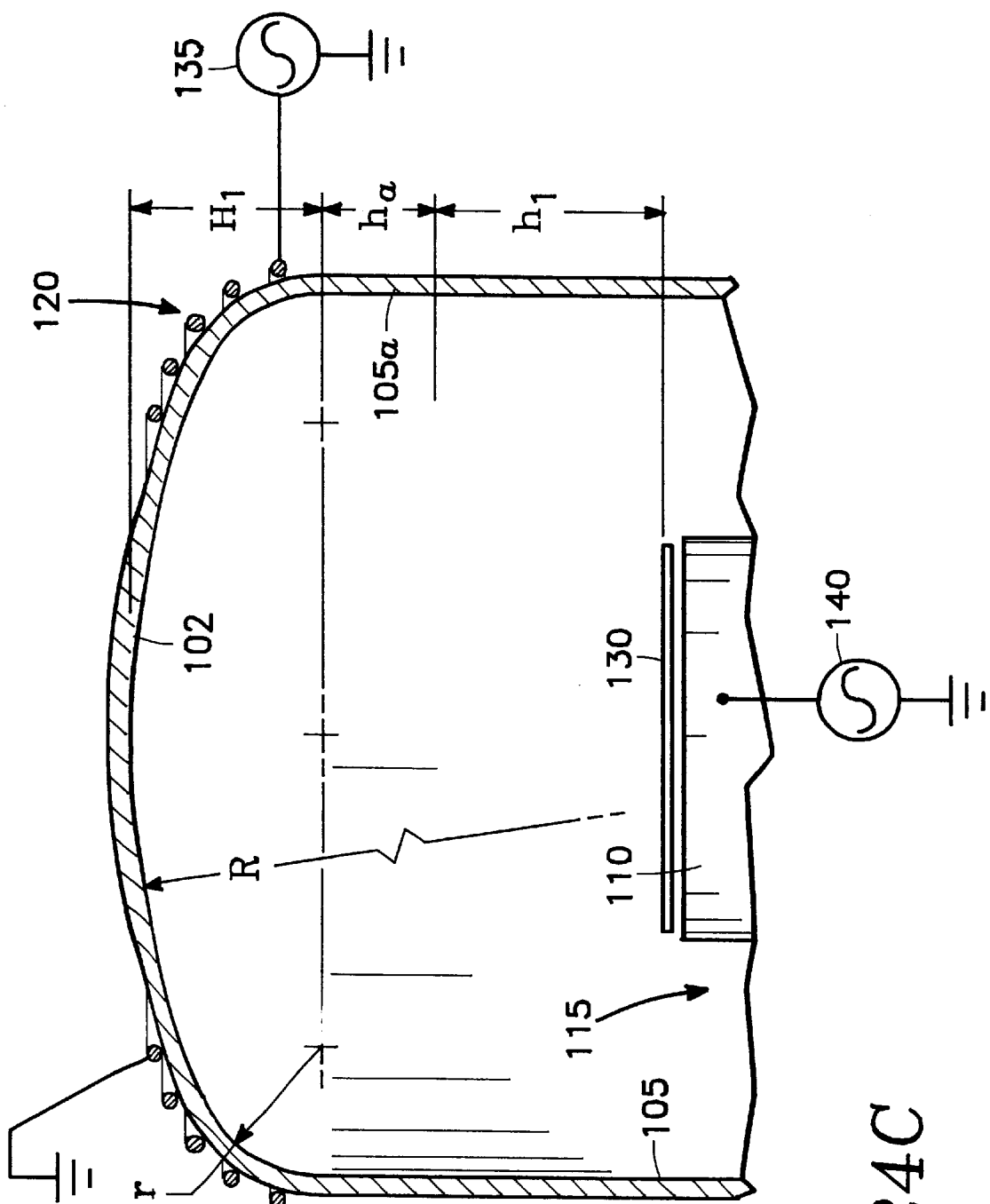
Figure 24D:
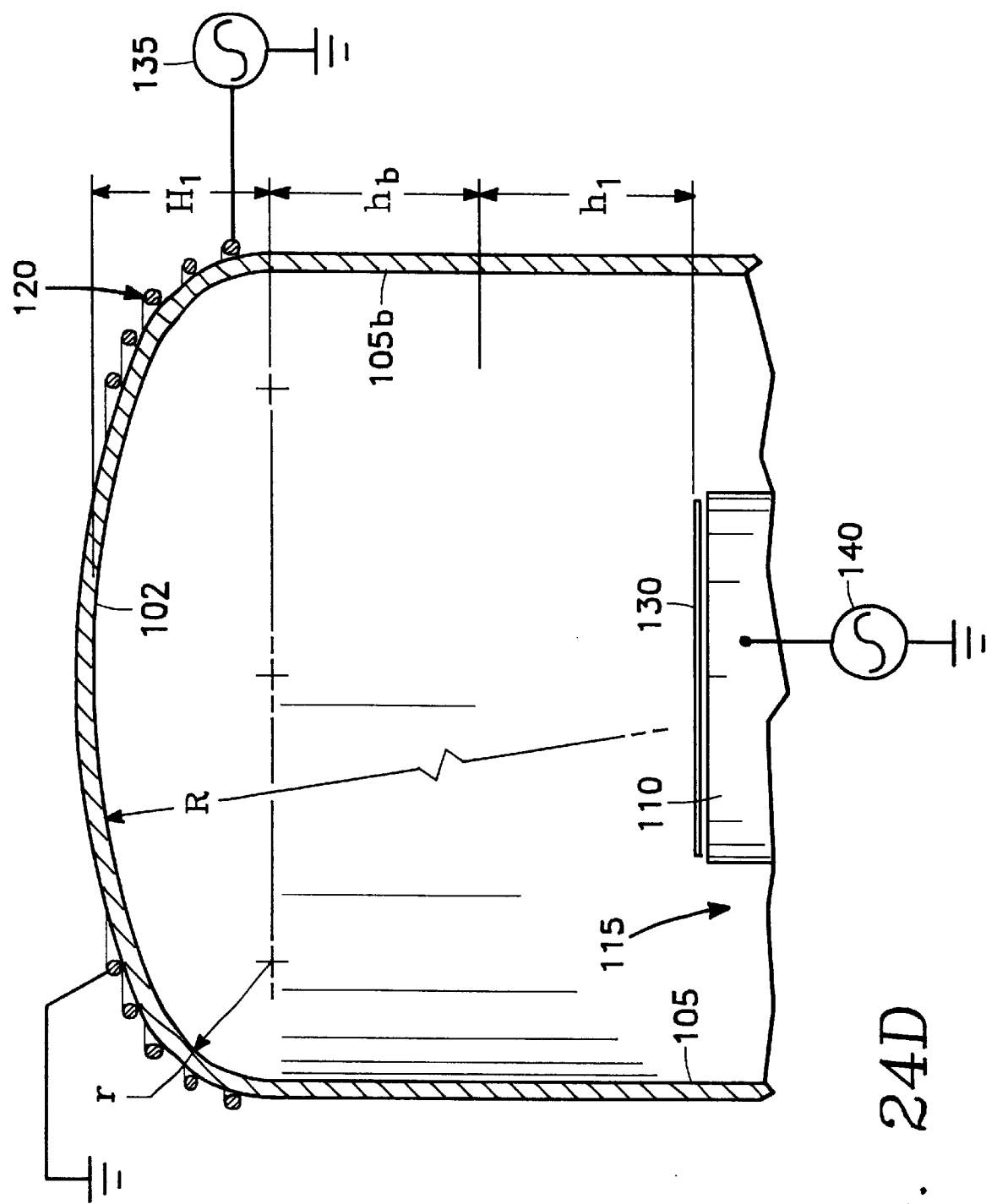

In the series of FIGS. 22A–22D, the results were varied by changing the curvature of the dome-shaped ceiling. Referring now to FIGS. 24A–24D, a similar progression in results may be obtained by changing the height of the cylindrical side wall 105. FIG. 24A illustrates a chamber similar to that of FIG. 22A having a flat ceiling 101 as a reference for comparison with results obtained in FIGS. 24B–24D. FIG. 24B illustrates the chamber of FIG. 24A modified in that a dome-shaped ceiling 102 is provided in lieu of the flat ceiling 101. FIG. 24C illustrates the chamber of FIG. 24B modified by adding a cylindrical 1-inch vertical spacer 105A between the cylindrical side wall 105 and the dome-shaped shaped ceiling 102. FIG. 24D illustrates the chamber of FIG. 24B modified by adding an approximately 2-inch vertical cylindrical spacer 105D between the side wall 105 and the dome-shaped ceiling 102. Table B sets forth the values of the base-to-apex dome height H, the wafer-to-side wall top height h, the spacer height h', and the total wafer-to-ceiling height HT for the embodiments of FIGS. 24A–24D. Ion density distributions across the wafer surface measured with the embodiments of FIGS. 24A–24D are illustrated in the graph of FIG. 25 by the curves labelled A, B, C and D, respectively.

TABLE B

| FIG | H | h | H + h | Source Pwr | Bias Power |
|---|---|---|---|---|---|
| 24A | 0" | 1.95" | 1.95" | | |
| 24B | 2.95" | 1.95" | 4.90" | 800 W | 220 W |
| 24C | 2.95" | 2.95" | 5.90" | 1200 W | 200 W |
| 24D | 2.95" | 3.83" | 6.80" | 1200 W | 190 W |

In FIG. 24A, the ceiling 101 is at least nearly flat, and therefore recombination losses at the ceiling predominate over the wafer center. Moreover, as the flatter ceiling is closer to the wafer, there is less opportunity for plasma diffusion to transform the non-uniform plasma distribution at the ceiling to a more uniform distribution at the wafer surface. As a result, plasma ion density near the wafer center is very low, as indicated by the curve labelled A in FIG. 25.

In FIG. 24B, the ceiling 102 has a multi-radius dome shaped, with a center radius R1 on the order of 14.7 inches and a smaller corner radius r1 in the range of about 2 inches and height H. Because the curvature of the dome-shaped ceiling 102 increases the distance of the ceiling 102 from the wafer center, recombination losses at the wafer center are negligible, as indicated by the curve labelled B in FIG. 25. In fact, with the elimination of recombination losses at the wafer center, the reactor of FIG. 24B provides the highest ion density. The disadvantage is that the in density is non-uniform, there being a pronounced peak at the wafer center. The coil 120 is relatively close to the wafer center in FIG. 24B, so that formation of polymer is somewhat suppressed, leading to poor etch profile and etch selectivity. Moreover, the local ionization is so close to the wafer 130 that the directionality of ions impinging on the wafer surface is more random, further degrading etch profile. The inferior etch profile obtained in this embodiment provides results corresponding to the SEM photograph of FIG. 26A for an aluminum etch process, in which the etched side walls are concave.

In FIG. 24C, the dome-shaped ceiling 102 is raised by the vertical 1-inch cylindrical spacer 105A so that the coil to wafer distance is greater. As a result, polymer formation is not as suppressed and ion directionality is more vertical, leading to better etch profile and etch selectivity. The superior etch profile obtained in this embodiment provides results corresponding to the SEM photograph of FIG. 26B for an aluminum etch process, in which the etched side walls are straight. Advantageously, the coil 120 is still sufficiently close to the wafer 130 that the ion density is relatively high, as indicated by the curve labelled C in FIG. 23. Moreover, the ion density is more uniform.

Figure 26C:
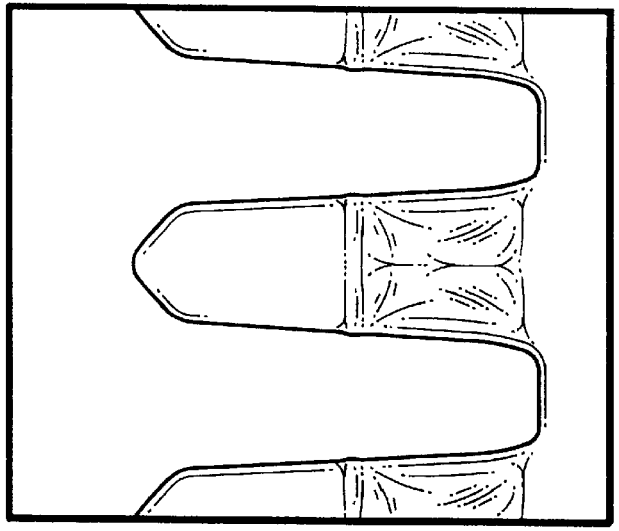
FIG. 26C is an SEM photograph of etched sidewall profiles obtained with an embodiment corresponding to that of FIG. 24D.
Figure 26B:
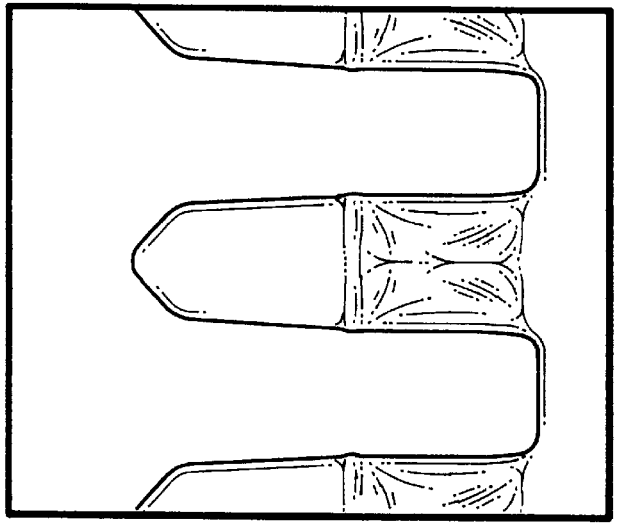
FIG. 26B is an SEM photograph of etched sidewall profiles obtained with an embodiment corresponding to that of FIG. 24C.
Figure 26A:
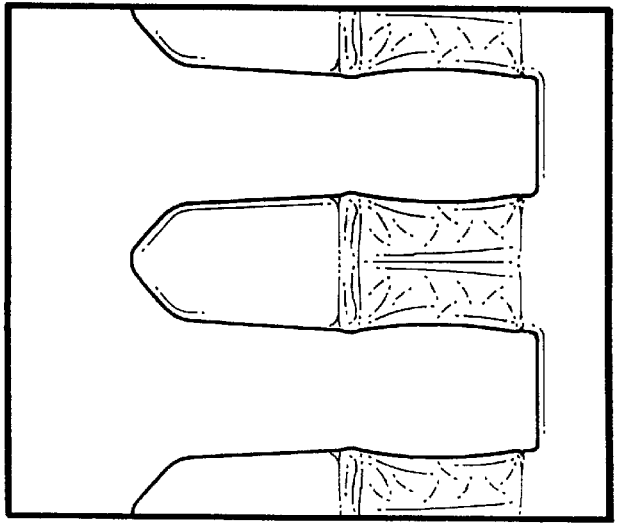
FIG. 26A is a scanning electron microscope (SEM) photograph of etched sidewall profiles obtained with an embodiment corresponding to that of FIG. 24B.

In FIG. 24D, the approximately 2-inch spacer 105B further increases the wafer-to-coil distance, so that the ion density at the wafer surface is less, as indicated by the curve labelled D of FIG. 25. However, the etch profile obtained in the embodiment of FIG. 24D, corresponding to the SEM photographs of FIG. 26D, is virtually the same as that obtained in the embodiment of FIG. 24C. One advantage of the embodiment of FIG. 24C is that the RF bias power applied to the wafer pedestal may be reduced relative to that employed in the embodiments of FIGS. 24A and 24 B, as set forth in TABLE B above. In fact, TABLE B indicates an approximately 15% reduction in RF bias power between the embodiments of FIGS. 24A and 24C. This reduction in bias power reduces ion damage, a significant advantage.

Another advantage is that in the flat ceiling embodiment of FIG. 24A, polysilicon etch selectivity relative to silicon dioxide is less than 15:1, is about 15:1 in the embodiment of FIGS. 24B having the dome-shaped coil and approaches 20:1 in the embodiments of FIGS. 24C and 24D.

Table C sets forth the dimensions of one embodiment of the invention.

TABLE C

| H | h | D | d | R | r |
|---|---|---|---|---|---|
| 2.95" | 4.02" | 13.64" | 6" | 14.7" | 2" |

In this embodiment, the coil 120 had its bottom winding starting at the base of the dome ceiling 100 where it meets the cylindrical side wall 105, there being approximately six windings at a pitch of 0.75 inch, the RF plasma source power being applied at about 1.75 turns from the bottom coil end. The corner radius r was centered at the height of the dome base. For a wafer diameter d of 8", the chamber diameter D is preferably on the order of 14" or 15", while for a wafer diameter d of 12", the chamber diameter is preferably on the order of 18" and 20".

Table D sets forth an alternative set of dimensions for the embodiments of FIGS. 24B, 24C and 24D employing a taller dome-shaped ceiling with conformal coil, the base-to-apex dome height H being 4.7".

TABLE D

| FIG. | H | h | H + h |
|---|---|---|---|
| 24B | 4.7" | 1.9" | 6.6" |
| 24C | 4.7" | 2.9" | 7.6" |
| 24D | 4.7" | 3.9" | 8.6" |

For polysilicon etch processes, h is preferably about 4.2", for metal etch processes h is preferably about 3.2" and for oxide etch processes h is preferably about 2.5'.

As in the progression of FIGS. 22A–22D, so in the progression of FIGS. 24A–24D, it is a discovery of the invention that the foregoing problems are solved in the regime where R/r is between about 2 and 10, h is between about 1.5" and about 4" while H is between about 3" and about 6", and where H+h is between on the order of about 6" and 7". The range of H+h may be expanded in other embodiments of the invention to on the order to between 3" and 11", the larger dimensions having particular applicability to larger chamber diameters accommodating larger wafers (e.g., 300 mm diameter wafers). Such regimes are applicable not only to the strictly conformal embodiments of FIGS. 22 and 24 but also to the embodiments of FIGS. 1–21. It is also applicable to embodiments in which the ceiling shape is not necessarily a multi-radius dome, but rather conical or flat, for example.

PREFERRED EMBODIMENTS OF THE PRESENT INVENTION

In accordance with a presently preferred embodiment of the invention applicable to processing 200 mm diameter wafers, h=about 3", H=about 4", R=about 15" and r=about 2.3". For 300 mm diameter wafers, H=about 6" and h=about 5". However, the invention is not at all limited to these dimensions. Specifically, H+h may lie in an intermediate range of 5"–8" or in a broader range of 3"–11".

Preference for the Multi-Radius Dome-Shaped Ceiling

As alluded to above in this specification, the multi-radius dome shaped ceiling provides the greatest plasma ion distribution uniformity at the wafer (or wafer pedestal) surface compared with other ceiling shapes, other factors being unchanged. The ceiling shape underlying an RF signal applicator such as an inductive coil antenna affects plasma ion density distribution at the wafer surface as follows: Most of the RF power from the RF signal applicator (e.g., the overhead coil antenna) is deposited in the plasma in accordance with a spatial distribution of RF power deposition, which is mostly confined in an absorption region along the edge of the plasma nearest the antenna. (The depth of this region depends upon the skin depth of the RF field.) The spatial distribution at the wafer surface of plasma ion density is greatly affected by the spatial distribution of RF power deposition. By changing the ceiling shape, the edge of the plasma is moved relative to the wafer surface, thereby changing the location of the RF absorption region. As a result, the spatial distribution of the RF power deposition is changed relative to the wafer surface, thereby changing the spatial distribution of plasma ion density at the wafer surface. Generally, as discussed above with reference to FIGS. 23 and 25, a small ceiling height (corresponding to a small distance between the RF absorption region and the wafer) produces a center-low ion density distribution at the wafer surface, due to the symmetry of the overhead coil antenna. Also, a large ceiling height (corresponding to a large distance between the RF power absorption region and the wafer surface) produces a center-high ion density distribution at the wafer surface, due to the diffusion of plasma ions toward the center along the greater ceiling-to-wafer distance and the minimization of the RF field near the chamber side wall.

Figure 27:
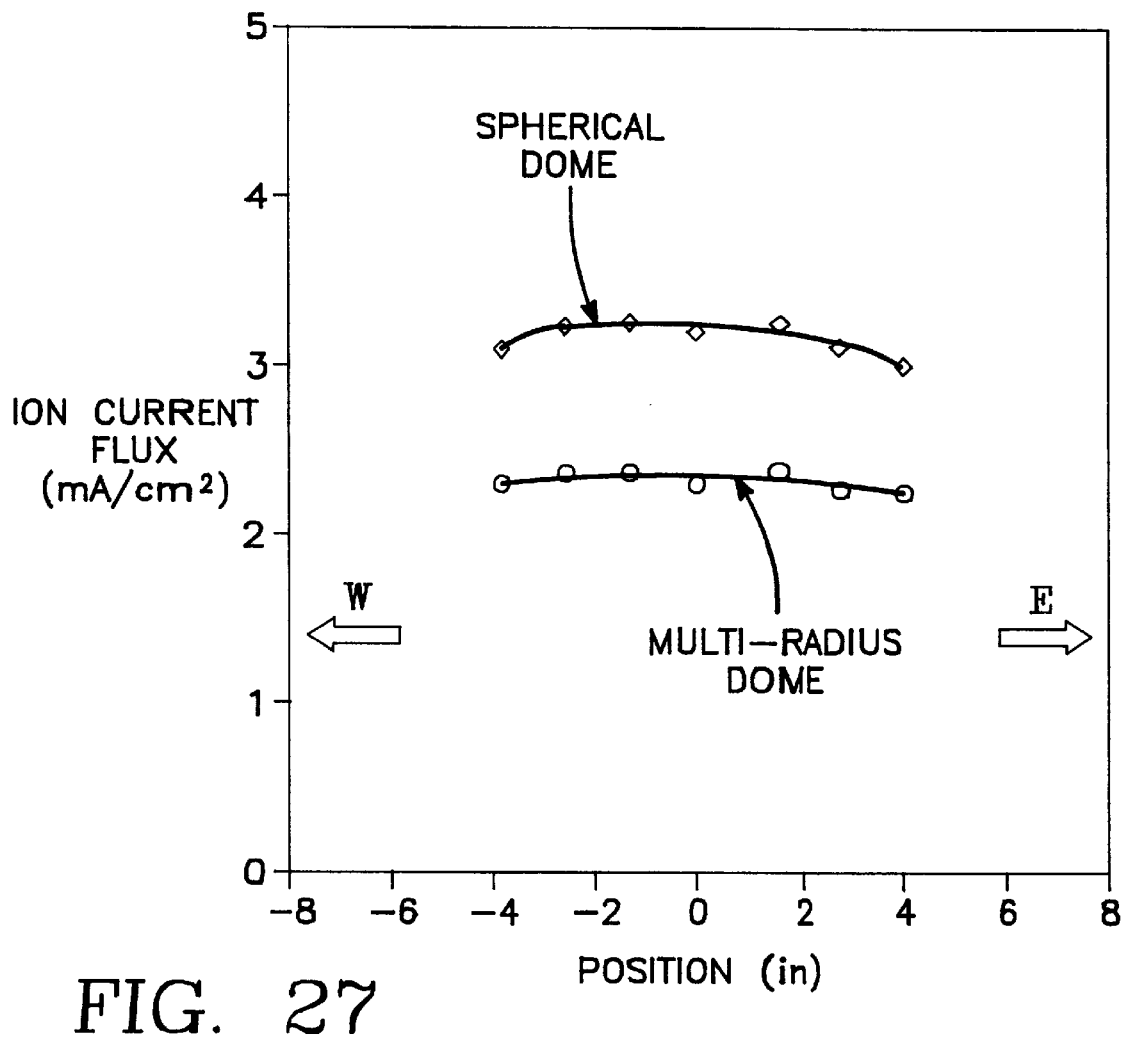
FIG. 27 is a graph whose ordinate corresponds to plasma ion density measured as ion current flux at the wafer surface and whose abscissa is radial position at the wafer surface, and comparing radial ion density distributions obtained with a nearly hemispherical dome-shaped ceiling and a multi-radius dome-shaped ceiling.

A multi-radius dome shape produces the most uniform distribution of plasma ion density at the wafer surface relative to other shapes. By comparison, a flat ceiling shape fails to compensate for the tendency of the radial plasma ion density distribution at the wafer surface to-be center high for a relatively large wafer-to-ceiling height and to be center-low for a relatively low wafer-to-ceiling height. A spherical ceiling has its center or apex higher above the wafer, so that the plasma diffusion toward the center is even greater, the result being a center-high non-uniform plasma ion density distribution at the wafer surface. FIG. 27 is a graph comparing radial distributions of plasma ion density obtained with nearly spherical and multi-radius dome ceilings using the same overhead coil antenna. FIG. 27 shows the superiority of the multi-radius dome shaped ceiling over the more spherical dome shaped ceiling. The ion distribution achieved with the multi-radius dome ceiling is nearly uniform whereas the ion distribution achieved with the more spherical ceiling is center-high and therefore non-uniform.

Most Effective Wafer-to-Ceiling Height of the Multi-Radius Dome Ceiling

The multi-radius dome-shaped ceiling itself is liable to produce a less than ideally uniform radial plasma ion density distribution at the wafer surface, depending upon the wafer-to-ceiling height (or wafer pedestal-to-ceiling height). Therefore, it is a discovery of the present invention that the plasma ion density distribution can be improved further by placing the multi-radius dome ceiling at a proper height above the wafer pedestal. In accordance with this aspect of the present invention, there are two limiting cases, a relatively large wafer-to-ceiling height at which the radial distribution of plasma ion density is center-high, and a relatively small wafer-to-ceiling height at which the radial distribution of plasma ion density is center-low. The ion distribution uniformity is improved by placing the ceiling at an intermediate height above the wafer between the heights of the two limiting cases. In fact, the best ion distribution uniformity (i.e., the most nearly flat radial distribution of plasma ion density distribution at the wafer surface) is achieved at a particular wafer-to-ceiling height which depends upon chamber pressure, gas phase recombination rate of the particular gases employed and other factors.

For process gas compositions suitable for a metal etch process, an ideal set of ceiling and reactor geometries has already been set forth in the specification in the discussion of Tables A, B, C and D. Such gas compositions typically include chlorine gas as the primary etchant and, in addition, a non-reactive gas such as nitrogen or an inert gas. Such metal etch gas compositions may include chlorine as a primary etchant and, in addition, secondary etchant gases, such as $BCl_3$, HCl and/or HBr. Any one, or a pair of, or all three of the secondary etchant gases $BCl_3$, HCl and HBr may be added to the chlorine gas.

In etching polysilicon, a process gas compatible with a polysilicon etch process can comprise at least one of the following etchants: chlorine, HBr, which may be mixed with at least one of the following: oxygen, a non-reactive gas, an inert gas For a typical silicon dioxide etch process, the process gas is both an etchant precursor and an etch passivation material precursor which tends to deposit on and protect non-oxide containing layers. Specifically, a fluorocarbon gas or a fluoro-hydrocarbon gas in a plasma forms fluoro-carbon passivation species and fluorine etchant species. However, for such a change in process gas composition, the ion density distribution may change, so that the ideal ceiling height may be different, as will now be discussed.

Effect of Process Gas Chemistry on Ion Distribution

Figure 28:
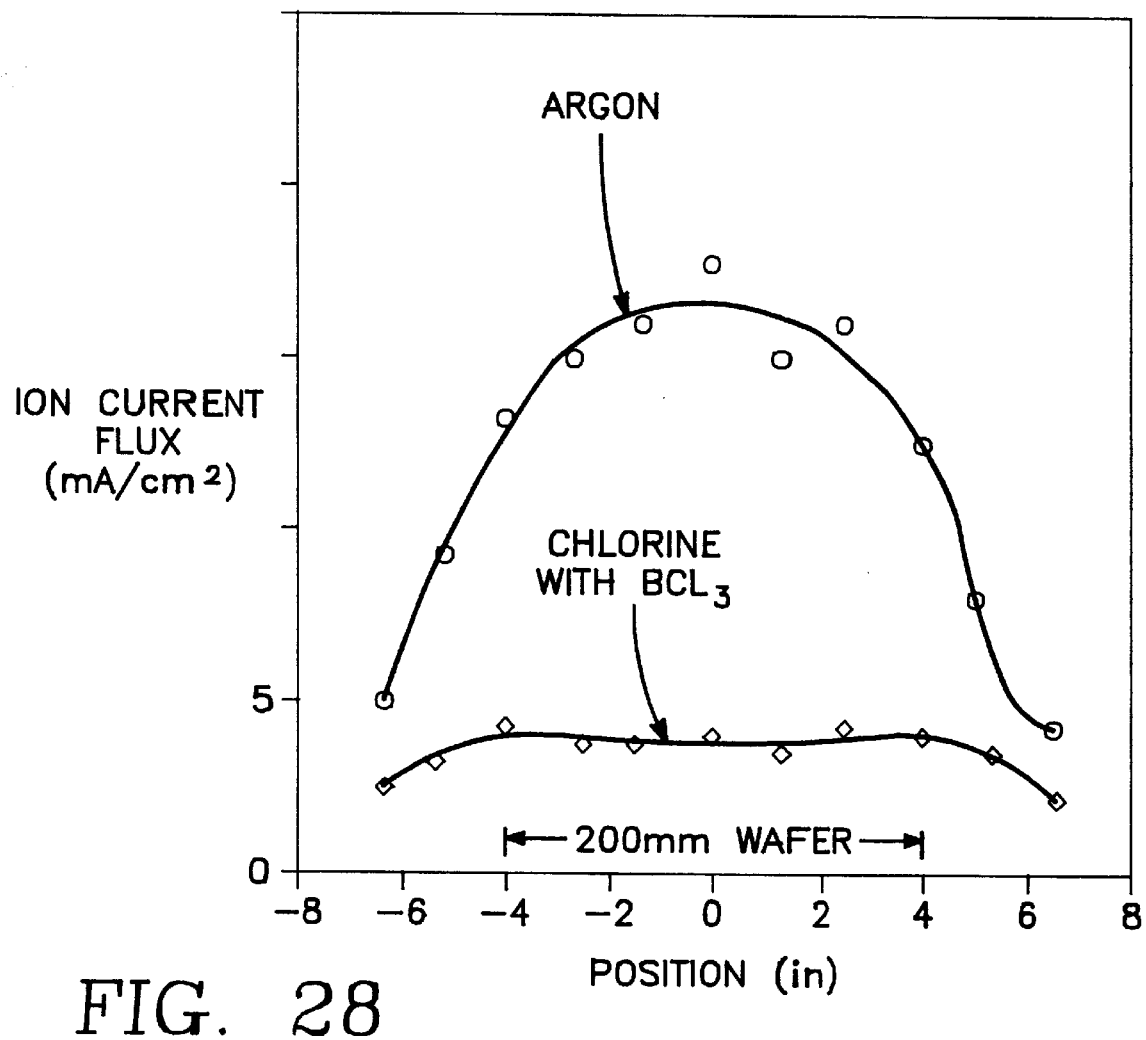
FIG. 28 is a graph whose ordinate corresponds to plasma ion density measured as ion current flux at the wafer surface and whose abscissa is radial position at the wafer surface, and comparing radial ion density distributions obtained with a argon and chlorine gas under similar conditions.

Depending upon the diffusion rate and recombination rate of the selected process gas composition, a different ceiling height may be ideal. Thus, for example, if a gas composition is employed having a faster diffusion rate and a lower recombination rate, then there is a greater tendency of the gas to diffuse toward the chamber center and thereby provide more plasma ions at the center, so that the plasma ion density radial distribution has a greater tendency to be center high. Thus, the ideal wafer-to-ceiling height for such a gas may be smaller. Such a difference has been discussed above with reference to the graph of FIG. 21. A somewhat different aspect is illustrated in the graph of FIG. 28 which includes actual experimental data for a chlorine-containing plasma. In FIG. 28, the plasma ion density distribution (measured as ion current flux) is center high for argon because argon has a high diffusion rate and low recombination rate, while the distribution is virtually flat for chlorine because chlorine has a lower diffusion rate and a higher recombination rate. A close inspection of FIG. 28 shows that the optimum distribution achieved with chlorine, as indicated by the experimental data, is slightly "M-shaped", in that there is a slight upward inflection near the outer ends and a slight depression in the center. (This effect is exaggerated in the qualitative depiction of the ion distribution of the chlorine-containing plasma of FIG. 21.) Thus, it may be said that the optimum ion density distribution achieved with the invention is neither center-high nor center-low, even if not perfectly flat (uniform).

Effect of Chamber Pressure on Ion Density Distribution

Similarly, the ideal wafer-to-ceiling height of the multi-radius ceiling depends upon chamber pressure. At a higher chamber pressure, the recombination rate is greater and there is less diffusion of the gas and/or etchant species to the center. As a result, at greater chamber pressures the radial distribution of plasma ion density tends to be center-low. At smaller chamber pressure the radial distribution tends to be center-high. Therefore, one problem is how to achieve an ion density distribution which is neither center-high nor center-low while maintaining the chamber at whatever pressure is required. One solution is to set the ceiling height to the ideal height at which process optimization (e.g., plasma ion density distribution uniformity) is obtained for a broad range of processing conditions (e.g., particular chamber pressure, plasma source power, plasma chemistry) so as to provide the widest possible process window of the plasma reactor.

Effect of RF Source Power on Ion Distribution

Figure 29:
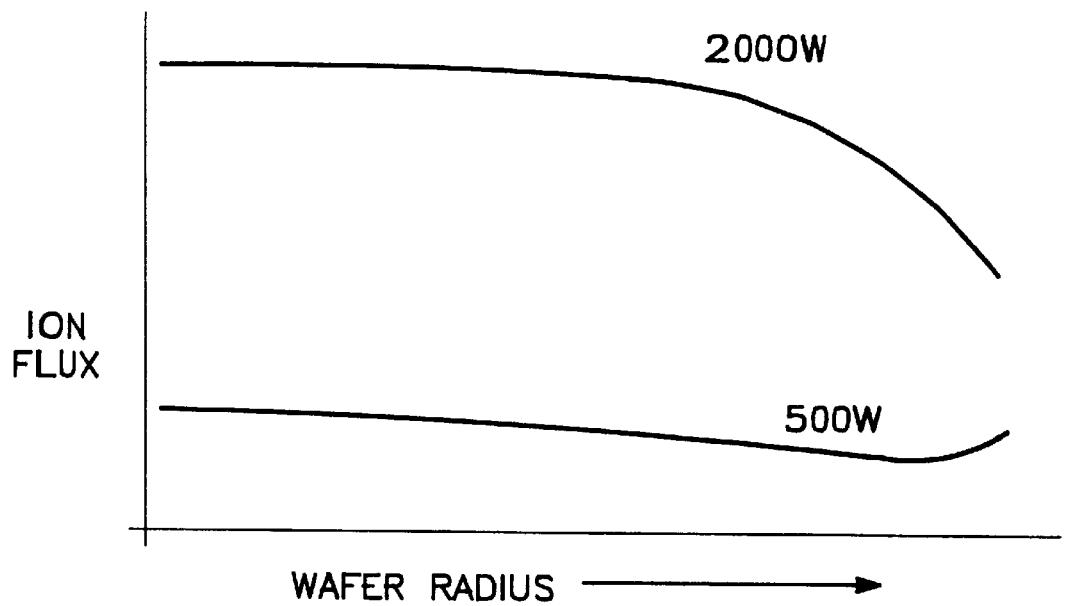
FIG. 29 is a graph whose ordinate corresponds to plasma ion density measured as ion current flux at the wafer surface and whose abscissa is radial position at the wafer surface, and comparing radial ion density distributions obtained at a plasma source power level of 500 Watts and 1000 Watts.

As discussed above, the RF power absorption region extends from the plasma edge under the RF signal applicator to a depth determined by the skin depth of the RF field. This skin depth decreases with increasing RF power applied to the RF signal applicator above the ceiling. Thus, by increasing the RF power level, the height of the RF power absorption region above the wafer is increased, so that a result is reached similar to that obtained by raising the ceiling height, namely a more center-high ion density distribution. Likewise, by decreasing the RF power a center-low ion density distribution can be obtained. The foregoing is illustrated in the graph of FIG. 29, depicting a simulation of the radial distribution of plasma ion density for an overhead coil inductor under a particular set of process conditions for two different source power levels, 500 Watts and 2000 Watts. At 500 Watts, the distribution is fairly flat while at 2000 Watts, the distribution is distinctly center-high. Therefore, one problem is how to obtain an ion density distribution which is neither center-high nor center-low while applying whatever RF power level is required. The solution is to employ a multi-radius dome-shaped ceiling, because the plasma ion density distribution obtained with a multi-radius dome-shaped ceiling is more nearly uniform across a much wider range of plasma source power levels than other geometries.

Polysilicon Etch Process

All of the foregoing factors affecting ideal wafer-to-ceiling height of the multi-radius dome-shaped ceiling affect the polysilicon etch process. In etching polysilicon, one is generally defining the field effect transistor gate length and area, a critical dimension which must be nearly perfectly uniform across an entire die. This requires a uniformly perfect (vertical) etch profile across the entire die. Etch profile uniformity is optimized by selecting a low chamber pressure and a high gas flow rate. A low chamber pressure generally is in the range of 1–20 mT but can range to about 50 mT, and a high gas flow rate is in the range of 150–1000 sccm. A typical polysilicon etch process is performed at a low chamber pressure in the range of about 1–5 mT (and preferably around 2 mT) and a gas flow rate of about 160 sccm. Preferably, the RF source power frequency, which for metal etch can be as low as 2 MHz, is raised to over 10 MHz (preferably 12.5 MHz) for polysilicon etch processing. Moreover, the gas composition for a polysilicon etch process is somewhat different, typically including chlorine with another active gas such as oxygen and/or HBr. In addition, a non-reactive gas such as nitrogen or an inert gas such as helium may be included. Due mainly to the lower pressure at which a polysilicon etch process is performed, the radial distribution of ion density at the wafer surface has a greater tendency to be center high, so that the ideal wafer-to-ceiling height of the multi-radius dome ceiling is smaller.

Figure 30:
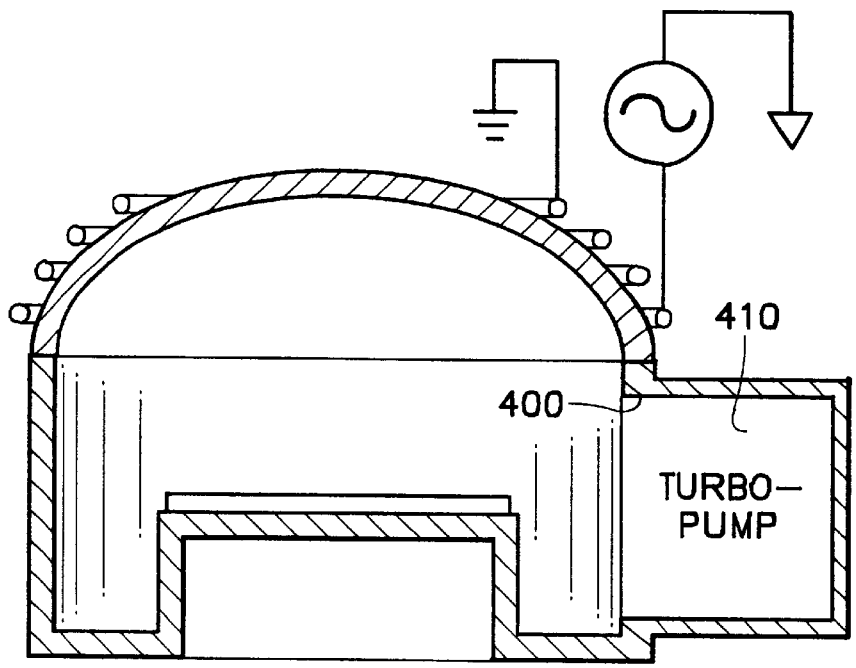
FIG. 30 illustrates a plasma reactor having a multi-radius dome, an aperture in its side wall through with the chamber is evacuated by a turbo-pump.

This creates a seemingly insurmountable problem in that, while the obvious solution would be to lower the multi-radius ceiling to the ideal height dictated by the reduced chamber pressure, such a lowering of the ceiling would necessarily reduce the aperture of the vacuum pump, where, typically, the chamber is evacuated through the sidewall to the pump. The pump aperture area, and therefore the pump speed and gas flow rate, is limited by the wafer-to-ceiling height. The required reduction in ceiling height would reduce effective pump speed and therefore reduce the gas flow rate below the high level (e.g., 160 sccm) required to maintain sufficient etch profile uniformity. This could impair the etch profile uniformity to an unacceptable degree, a significant problem. Therefore, the required compensation for the center-high tendency of the ion density distribution in the polysilicon etch process cannot be achieved by simply decreasing the ceiling height. This situation is illustrated in FIG. 30, illustrating an aperture 400 in the sidewall 105 through which the chamber interior is evacuated by a turbo-pump 410. The maximum height of the aperture extends from the bottom of the chamber to the top of the sidewall 105. The effective pumping rate of the turbo-pump 410 is limited by the area of the aperture 400, which is proportional to the height of the sidewall 105 and therefore proportional to the height of the ceiling 100 above the wafer pedestal 110.

While the problem of maintaining a good etch profile for a given chamber pressure is particularly acute in the case of polysilicon etch processes as set forth above, the same problem exists in metal etch processes and silicon oxide etch process, as well as plasma etch processes in general. It is therefore a goal of the invention to provide a superior etch profile and uniform process conditions across the wafer surface for a wide variety of plasma etch processes, including metal etch, silicon oxide etch, polysilicon etch, silicide etch, silicon nitride etch and polymer etch, for example.

Optimum Size of Aperture in the Overhead RF Signal Applicator

Figure 31:
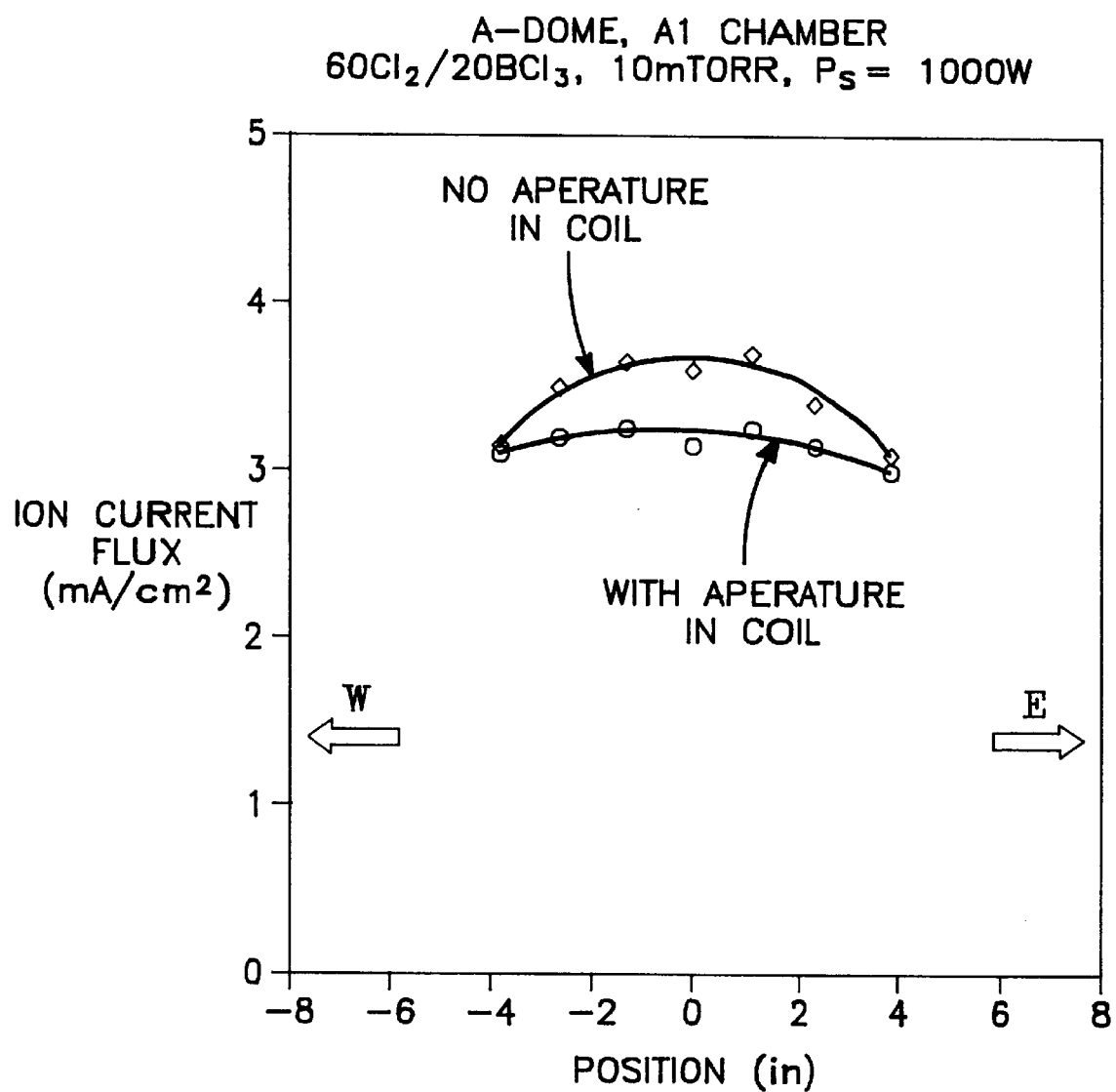
FIG. 31 is a graph whose ordinate corresponds to plasma ion density measured as ion current flux at the wafer surface and whose abscissa is radial position at the wafer surface, and comparing radial ion density distributions obtained with no central aperture in the overhead coil antenna and an aperture of ideal size in the overhead coil antenna.

The solution to this problem is to adjust the diameter A or radius A/2 of the central aperture or void in the overhead RF signal applicator (e.g., the coil antenna 120) to achieve the desired degree of uniformity in the radial distribution of plasma ion density. FIG. 31 illustrates the difference in plasma ion density distribution (as measured by the ion current flux at the wafer surface) for a coil with no aperture and the same coil with a center aperture (void) of an ideal radius. Clearly, the ion distribution is nearly uniform in the latter case and center-high or non-uniform in the former case. In the polysilicon etch process, in which the chamber pressure is relatively low, the radius of the central aperture in the coil antenna 120 is increased to the point at which an optimally uniform plasma ion density distribution is realized. In this way, there is no need to decrease the wafer-to-ceiling height of the multi-radius dome-shaped ceiling, a significant advantage.

Figure 32:
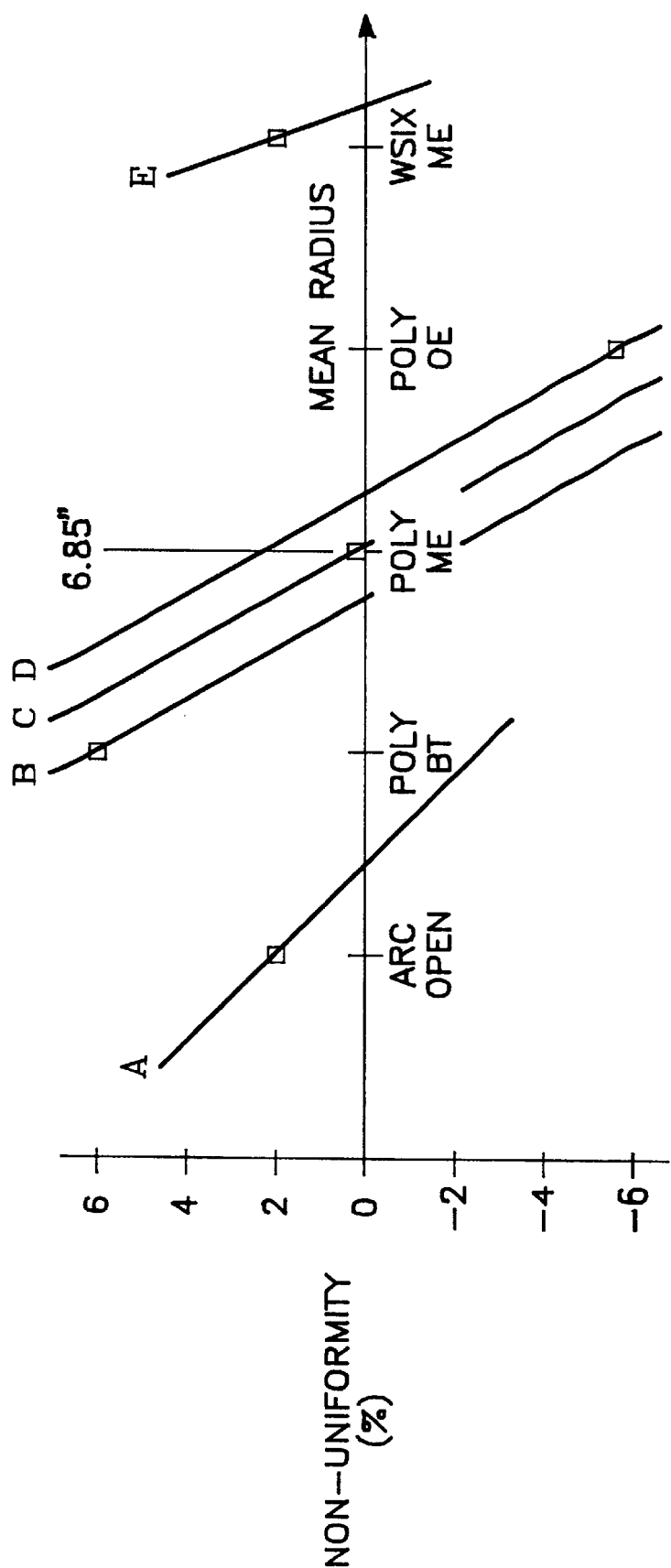
FIG. 32 is a graph whose ordinate corresponds to non-uniformity of radial plasma ion density distribution as a deviation from a mean ion density and whose abscissa corresponds to the effective mean radius of the overhead RF signal applicator, and including curves showing the behavior of the non-uniformity as a function of mean radius for several different process conditions.

More generally, the RF signal applicator (e.g., the overhead coil antenna 120) is characterized by a mean radius. In the case of an RF signal applicator having a annular shape with a single aperture or central opening, the mean radius is the sum of its outer and inner radii divided by two. (If the RF signal applicator is comprised of more than one annular section, then the mean radius is computed differently.) In any case, the mean radius is the mean of the radii of all finite circumferential elements of the RF signal applicator, and characterizes the radial distribution of the RF signal applicator. Increasing the aperture radius is one species of the more general operation of increasing the mean radius of the RF signal applicator. The mean radius affects the radial distribution of plasma ion density at the wafer surface between the extremes of two limiting cases: (a) at a large mean radius of the RF signal applicator the ion density distribution is center-low, and (b) at a small mean radius of the RF signal applicator the ion density distribution is center-high. The most uniform ion density distribution is realized (for a given ceiling height) by selecting a mean radius of the RF signal applicator between these two extremes at an optimum value. FIG. 32 illustrates how the non-uniformity in the radial distribution of plasma ion density at the wafer surface varies as a function of the RF signal applicator mean radius, from a "positive" or center-high distribution to a "negative" or center-low distribution. The non-uniformity is expressed as a percentage that the ion density deviates at its center from a median density of the distribution. A center-high distribution has a positive deviation while a center-low distribution has a negative deviation. The ordinate (vertical axis) of FIG. 32 is the value of the non-uniformity of the radial distribution of plasma ion density at the wafer surface. At the origin, the non-uniformity is zero so that the distribution is uniform or at least nearly devoid of "center-high" and "center-low" extremes. The abscissa (horizontal axis) is the mean radius of the RF signal applicator. Each curve in FIG. 32 corresponds to a different polysilicon etch process performed employing different gas chemistries, different chamber pressures and different RF source power levels. The intersection of each curve with the abscissa indicates the ideal mean radius. The process of curve A of FIG. 32 is performed at a very low chamber pressure using a mixture of chlorine and oxygen. The process of curve B of FIG. 32 is performed at a higher chamber pressure using a mixture of chlorine and argon. The process of curve C of FIG. 32 is performed at a low chamber pressure using a mixture of chlorine, HBr, oxygen and helium. The process of curve D of FIG. 32 is performed at a high chamber pressure using a mixture of HBr, oxygen and helium. The process of curve E of FIG. 32 is performed at a low chamber pressure using a mixture of chlorine, oxygen and nitrogen. Curves B, C and D intersect the abscissa near a mean radius of 6.85 inches for a reactor with a geometry fairly similar to that of Table C and given specifically in Table E below. Therefore, for such a reactor, an overhead signal applicator aperture mean radius of 6.85 is suitable for such polysilicon etch processes. In the reactor of TABLE E below, the inner radius of the overhead coil, A/2, is preferably 6.071" and the outside radius of the overhead coil is preferably 7.62".

TABLE E

| H | h | D | d | R | r |
|---|---|---|---|---|---|
| 4.2" | 2" | 14" | 8" | 15" | 2" |

It should be noted that while a total height H+h on the order of 6" or 7" has been disclosed, the total height H+h may be as high as 8" or more, depending upon the process requirements.

The various curves of FIG. 32 are affected by changes in source power applied to the overhead coil antenna 120, by changes in chamber pressure and by changes in process gas chemistry. The ion distribution has greater tendency to exhibit a center-high behavior if the source power is increased or if the chamber pressure is decreased. If any such changes are made, the curves of FIG. 32 in general are shifted proportionately to the right (for a greater ideal mean radius of the signal applicator). Likewise, if opposite changes are made (decrease in source power or increase in chamber pressure), then the curves of FIG. 32 are, in general, shifted to the left (for a lesser ideal mean radius). However, it is anticipated that for most practical applications involving the plasma processing of semiconductor wafers between 6 and 12 inches in diameter, the reactor chamber has a diameter between about 12 and 20 inches and the ratio $(H+h)/R_m$ of the total ceiling height H+h to the mean radius $R_m$ of the coil antenna is in the range between about 0.8 and 1.5 for a multi-radius dome shaped ceiling. Preferably, the multi-radius dome shape of the ceiling is such that the ratio R/r of its major and minor radii lies in the range between 2 and 10, as discussed above in this specification. In one preferred embodiment, the ratio $(H+h)/R_m$ of the total ceiling height to the coil mean radius is approximately 14/6.85 where the wafer diameter is in the range of 6 to 8 inches.

The invention is useful for plasma etching any of the following materials: polysilicon, silicon dioxide and metal. The following applications have already been described in this specification: In etching metal, a process gas compatible with a metal etch process can comprise at least one of the following etchants: chlorine, $BCl_2$, HCl, HBr, while the ceiling height above the wafer support can be 7.9 inches and the RF signal frequency can be about 2 MHz. In etching silicon dioxide, a process gas compatible with a silicon oxide etch process can comprise at least one of the following etchant precursors: a fluorocarbon, a fluorohydrocarbon, while the ceiling height above the wafer support can be about 7.2 inches and the RF signal frequency can be about 2 MHz. In etching polysilicon, a process gas compatible with a polysilicon etch process can comprise at least one of the following etchants: chlorine, HBr, which may be mixed with at least one of the following: oxygen, a non-reactive gas, an inert gas, while the ceiling height above the wafer support can be about 8.9 inches and the RF signal frequency can be above about 10 MHz. For polysilicon etching, the chamber pressure can be maintained below about 20 mT and as low as between 1–5 mT.

While in the preferred embodiments the both the interior and exterior surfaces of the ceiling are multi-radius dome-shaped surfaces, in an alternative embodiment the interior multi-radius dome-shaped surface at the top of the chamber may be provided by an interior liner of the same shape, so that the ceiling itself may be another shape (e.g., flat). In any case, it is preferable that the top interior surface of the chamber adjacent the ceiling be a multi-radius dome shaped surface.

Advantages of the Invention:

The invention as described above provides advantages in power deposition, azimuthal electric field, ion density and ion flux directionality and electron temperature. Specifically, the electric field at the wafer is reduced relative to a fixed set of process conditions, reducing device damage. The region where ions are produced (i.e., the region nearest the coil) is remote from the wafer so that non-uniformities therein are ameliorated by ion diffusion before reaching the wafer surface. The ion flux is more collimated so that a generally lower bias voltage on the wafer suffices to achieve anisotropic etching. The electron temperature gradient across the wafer surface, thereby reducing device damage due.

Application-Specific Embodiments

Although the preferred embodiments of the invention have a much wider range of applicability and therefore are not necessarily application-specific nor limited in application to any particular process, there exist certain embodiments which find their best application to a particular application. Specifically, the particular ranges of the wafer support-to-ceiling height and annular coil mean radius may vary somewhat depending upon the application, for example, to metal etch, polysilicon etch, silicon oxide etch, and so forth. On the other hand, because of the wide process window and wide applicability of the invention, the same reactor embodying the invention including ceiling height and annular coil mean radius dimensions falling within the ranges of the invention as set forth herein may suffice for many or all plasma etch applications (e.g., metal, oxide and polysilicon etch) without requiring modification or substitution, a significant advantage. The purpose of this section of the present specification is to point out certain preferences that may vary depending upon the particular application.

For a 200 mm (8") diameter wafer, the ceiling height for both metal and polysilicon etch processes is preferably near 7" but may lie in a range of 31" to 11". For oxide etch, the ceiling height lies in the same range but has preferred value close to 4". For a 200 mm (8") diameter wafer, the mean radius of the annular overhead coil for metal etch lies in the range of 3" to 9", for polysilicon etch lies in the range of 6" to 12", and for silicon oxide etch lies in the range of 5" to 11". For a 300 mm (12") diameter wafer, the ceiling height for both metal and polysilicon etch process lies in the range of 4" to 12" while for oxide etch it lies in the range of 3" to 9". For a 300 mm (12") diameter wafer, the annular coil mean radius for metal etch lies in the range of 5" to 15" with a preferred value around 10", while for oxide etch it lies in the same range but the preferred value may be around 9".

At least some of the foregoing differences between applications arise, in general, from the following. The oxide etch process requires a higher ion flux density at the wafer surface than metal or polysilicon etch processes, and therefore a lower ceiling height is preferred. The annular coil mean radius for polysilicon etch processing is generally larger than for metal or silicon oxide etch processes because the polysilicon etch processes employ a plasma source power RF frequency much higher (about 6 times higher) than the other etch processes.

Summary of Geometry Sub-Ranges by Process

In the preferred embodiments, the ceiling defines a multi-radius dome-shaped interior surface of the chamber having major and minor radii having a ratio therebetween lying in a range of approximately 2 to 10. The reactor the chamber diameter is about 14 inches, and the mean radius of the signal applicator is about 7 inches. However, more generally, the ceiling height is in the range of 3 to 11 inches for a chamber diameter exceeding 200 mm. Or, the ceiling height is in the range of 4 to 12 inches for a chamber diameter exceeding 300 mm.

In alternative embodiments, the ceiling can include a flat interior surface facing the wafer pedestal. Or, the ceiling includes a smooth three-dimensionally shaped interior surface facing the wafer pedestal, in which the highest part of the interior surface is disposed at the intermediate height.

Generally, the chamber has a diameter of between about 12 inches and 24 inches where the wafer has a diameter in the range of approximately 6–12 inches.

If the process gas is compatible with a metal etch process, it may include at least one of the following etchants: chlorine, $BCl_2$, HCl, HBr. Then, the ceiling is at a height above the support in a range of about 3" to 11", the mean radius in a range of about 3" to 9", and the chamber is sufficiently large to accommodate a 200 mm wafer; or, the ceiling is at a height above the support in a range of about 4" to 12", the mean radius is in a range of about 5" to 14", and the chamber is sufficiently large to accommodate a 300 mm wafer.

If the process gas is compatible with a silicon oxide etch process, it may include at least one of the following etchant precursors: a fluorocarbon, a fluorohydrocarbon. Then, the ceiling is at a height above the support in a range of about 3" to 11", the mean radius is in a range of about 5" to 11" and the chamber is sufficiently large to accommodate a 200 mm wafer; or, the ceiling is at a height above the support in a range of about 4" to 12", the mean radius is in a range of about 6" to 14" and the chamber is sufficiently large to accommodate a 300 mm wafer. If the process gas is compatible with a polysilicon etch process, it may include at least one of the following etchants: chlorine, HBr, mixed with at least one of the following: oxygen, a non-reactive gas, an inert gas. Then, the ceiling is at a height above the support in a range of about 3" to 11", the mean radius is in a range of about 4" to 12", and the chamber is sufficiently large to accommodate a 200 mm wafer; or the ceiling is at a height above the support in a range of about 4" to 12", the mean radius is in a range of about 6" to 15", and the chamber is sufficiently large to accommodate a 300 mm wafer. While in many etch processes the RF source power frequency is about 2 MHz, in the case of polysilicon etch that frequency may be over 10 MHz (i.e., 12 MHz); furthermore, the process may maintain a pressure in the chamber less than 20 mT (e.g., between about 1 mT and 5 mT).

The the height of the ceiling above the wafer pedestal and the mean radius of the RF signal applicator preferably define a ratio therebetween in the range of approximately 0.8 to 1.5.

Applicability of the Invention to Other Ceiling Geometries

As described above, in addition to the multi-radius dome-shaped ceiling, the invention includes other features such as the optimal ranges of ceiling height over the wafer support and size (or mean radius) of an aperture in an annular overhead coil inductor. These other features of the invention may be carried out in accordance with their details set forth above in the absence of a multi-radius dome-shaped interior surface adjacent the ceiling. For example, a flat ceiling may be employed while adhering to the teachings given in the foregoing specification of the optimum ceiling height and/or coil aperture opening mean radius.

While the invention has been described in detail by specific reference to preferred embodiments, it is understood that variations and modifications thereof may be made without departing from the true spirit and scope of the invention.

What is claimed is:

1. A method of processing a semiconductor wafer in an RF plasma reactor having a wafer pedestal for supporting said wafer, said method comprising:
   providing an overhead ceiling defining an upper boundary of a chamber of said reactor in facing relationship to said pedestal;
   introducing a process gas into said chamber;
   providing an overhead RF signal applicator near said ceiling for applying an RF signal into said chamber through said ceiling to maintain a plasma of said process gas in said chamber;
   wherein said plasma has a radial ion density distribution near the plane of said pedestal which is a center-high radial distribution for a greater height of said ceiling above said pedestal and is a center-low distribution for a lesser height of said ceiling above said pedestal, wherein said providing said ceiling comprises placing said ceiling at a height intermediate said greater and lesser heights such that said radial ion density distribution is intermediate said center-high and center-low radial distributions.

2. The method of claim 1 wherein said process gas is compatible with one of: (a) a metal etch plasma process, (b) a silicon oxide etch plasma process, (c) a polysilicon etch plasma process, (d) a silicide etch process, (e) a nitride etch process, (f) a polymer etch process.

3. The method of claim 2 wherein said ceiling height is such that said ion density distribution is neither predominantly center-high nor predominantly center-low.

4. The method of claim 3 wherein said distribution is M-shaped.

5. The method of claim 1 wherein said ceiling height is in the range of 3 to 11 inches for a chamber diameter exceeding 200 mm.

6. The method of claim 1 wherein said ceiling height is in the range of 4 to 12 inches for a chamber diameter exceeding 300 mm.

7. The method of claim 5 wherein said ceiling comprises a flat interior surface facing said wafer pedestal.

8. The method of claim 5 wherein said ceiling comprises a smooth three-dimensionally shaped interior surface facing said wafer pedestal.

9. The method of claim 8 wherein a highest part of said interior surface is disposed at said intermediate height.

10. The method of claim 6 wherein said ceiling comprises a flat interior surface facing said wafer pedestal.

11. The method of claim 6 wherein said ceiling comprises a smooth three-dimensionally shaped interior surface facing said wafer pedestal.

12. The method of claim 11 wherein a highest part of said interior surface is disposed at said intermediate height.

13. The method of claim 5 wherein said ceiling height is approximately 7 inches.

14. The method of claim 5 wherein said ceiling defines a multi-radius interior surface of said chamber.

15. The method of claim 14 wherein said interior surface has a major radius and a minor radius defining a ratio therebetween in the range of about 2 to 10.

16. The method of claim 14 wherein said interior surface has an apex, said apex lying at said intermediate height.

17. The method of claim 11 wherein said chamber has a diameter of between about 12 inches and 24 inches.

18. The method of claim 7 wherein said wafer has a diameter in the range of approximately 6–12 inches.

19. The method of claim 2 wherein said process gas is compatible with a metal etch process and comprise at least one of the following etchants: chlorine, $BCl_2$, HCl, HBr.

20. The method of claim 19 wherein said ceiling is at a height above said support in a range of about 3" to 11" and said chamber is sufficiently large to accommodate a 200 mm wafer.

21. The method of claim 19 wherein said ceiling is at a height above said support in a range of about 4" to 12" and said chamber is sufficiently large to accommodate a 300 mm wafer.

22. The method of claim 20 wherein said RF signal has a frequency of about 2 MHz.

23. The method of claim 2 wherein said process gas is compatible with a silicon oxide etch process and comprise at least one of the following etchant precursors: a fluorocarbon, a fluorohydrocarbon.

24. The method of claim 23 wherein said ceiling is at a height above said support in a range of about 3" to 11" and said chamber is sufficiently large to accommodate a 200 mm wafer.

25. The method of claim 23 wherein said ceiling is at a height above said support in a range of about 4" to 12" and said chamber is sufficiently large to accommodate a 300 mm wafer.

26. The method of claim 23 wherein said RF signal has a frequency of about 2 MHz.

27. The method of claim 2 wherein said process gas is compatible with a polysilicon etch process and comprise at least one of the following etchants: chlorine, HBr, mixed with at least one of the following: oxygen, a non-reactive gas, an inert gas.

28. The method of claim 27 wherein said ceiling is at a height above said support in a range of about 3" to 11" and said chamber is sufficiently large to accommodate a 200 mm wafer.

29. The method of claim 27 wherein said ceiling is at a height above said support in a range of about 4" to 12" and said chamber is sufficiently large to accommodate a 300 mm wafer.

30. The method of claim 27 wherein said RF signal has frequency of at least 10 MHz.

31. The method of claim 27 further comprising maintaining a pressure in said chamber less than 20 mT.

32. The method of claim 31 wherein said pressure is maintained between about 1 mT and 5 mT.

33. The method of claim 2 wherein said process gas is compatible with one of: (a) a metal etch plasma process, (b) a silicon oxide etch plasma process, (c) a polysilicon etch plasma process.

34. The method of claim 1 wherein said ceiling height is such that deviations within said radial distribution of said plasma ion density from a mean ion density are at least nearly minimum for a given chamber pressure, process gas composition and RF power applied to said RF signal applicator.

35. A method of processing a semiconductor wafer in an RF plasma reactor having a wafer pedestal for supporting said wafer, said method comprising:
- providing a ceiling of said chamber in facing relationship to said wafer pedestal;
- introducing a process gas into said chamber;
- providing an overhead RF signal applicator near said ceiling for applying an RF signal into said chamber through said ceiling to maintain a plasma of said process gas in said chamber, said RF signal applicator having an annular distribution corresponding to a mean radius of said RF signal applicator;
- wherein said plasma has a radial ion density distribution with respect to an axis of symmetry of said ceiling which is a center-high radial distribution for a lesser mean radius of said signal applicator and a center-low distribution for a greater mean radius of said signal applicator, said providing a signal applicator comprising providing a mean radius of said signal applicator intermediate said greater and lesser mean radii such that said radial ion density distribution is intermediate said center-high and center-low radial distributions.

36. The method of claim 35 wherein said annular distribution has an inner radius and an outer radius, said mean radius being an average of said inner and outer radii.

37. The method of claim 35 wherein said process gas is compatible with one of: (a) a metal etch plasma process, (b) a silicon oxide etch plasma process, (c) a polysilicon etch plasma process.

38. The method of claim 35 wherein said mean radius of said signal applicator is such that said ion density distribution is neither predominantly center-high nor predominantly center-low.

39. The method of claim 38 wherein said distribution is M-shaped.

40. The method of claim 38 wherein said ceiling defines a multi-radius dome-shaped interior surface of said chamber having major and minor radii having a ratio therebetween lying in a range of approximately 2 to 10.

41. The method of claim 40 wherein said chamber diameter is in the range of approximately 12 to 20 inches.

42. The method of claim 41 wherein said wafer has a diameter in the range of approximately 6 to 12 inches.

43. The method of claim 40 wherein said chamber diameter is about 14 inches, and said mean radius of said signal applicator is about 7 inches.

44. The method of claim 37 wherein said process gas is compatible with a metal etch process and comprise at least one of the following etchants: chlorine, $BCl_2$, HCl, HBr.

45. The method of claim 44 wherein said mean radius is in a range of 3" to 9" and said chamber is sufficiently large to accommodate a 200 mm wafer.

46. The method of claim 44 wherein said mean radius is in a range of 4" to 12" and said chamber is sufficiently large to accommodate a 300 mm wafer.

47. The method of claim 44 wherein said RF signal has a frequency of about 2 MHz.

48. The method of claim 37 wherein said process gas is compatible with a silicon oxide etch process and comprise at least one of the following etchant precursors: a fluorocarbon, a fluorohydrocarbon.

49. The method of claim 48 wherein said mean radius is in a range of 4" to 12" and said chamber is sufficiently large to accommodate a 200 mm wafer.

50. The method of claim 48 wherein said mean radius is in a range of about 5" to 15" and said chamber is sufficiently large to accommodate a 300 mm wafer.

51. The method of claim 48 wherein said RF signal has a frequency of about 2 MHz.

52. The method of claim 37 wherein said process gas is compatible with a polysilicon etch process and comprise at least one of the following etchants: chlorine, HBr, mixed with at least one of the following: oxygen, a non-reactive gas, an inert gas.

53. The method of claim 52 wherein said means radius is in a range of about 6" to 12" and said chamber is sufficiently large to accommodate a 200 mm wafer.

54. The method of claim 52 wherein said mean radius is in a range of about 7" to 15" and said chamber is sufficiently large to accommodate a 300 mm wafer.

55. The method of claim 52 wherein said RF signal has frequency of at least 10 MHz.

56. A method of performing an etch process on a semiconductor wafer with an optimum etch profile in an RF plasma reactor having a floor and a wafer pedestal for supporting said wafer, said method comprising:
- providing an overhead multi-radius dome-shaped ceiling in facing relationship to said pedestal, said ceiling defining a chamber of said reactor;
- introducing a process gas into said chamber at a relatively high gas flow rate in excess of about 100 sccm and evacuating said chamber through an aperture whose size is limited by the height of said ceiling;
- providing an overhead RF signal applicator having an annular distribution corresponding to a mean radius of said signal applicator near said ceiling for applying an RF signal into said chamber through said ceiling to maintain a plasma of said process gas in said chamber;
- wherein said plasma has a radial ion density distribution near the plane of said pedestal which is a center-high radial distribution for a greater height of said ceiling above said pedestal and is a center-low distribution for a lesser height of said ceiling above said pedestal, wherein said providing said ceiling comprises placing said ceiling at a selected height at which said aperture size is sufficient for said pump to maintain said chamber at a pressure not greater than about 10 mT, said selected height corresponding to a center-high ion distribution for a minimum mean radius of said signal applicator;
- wherein said plasma has a radial ion density distribution with respect to an axis of symmetry of said ceiling which is a center-high radial distribution for a lesser mean radius of said signal applicator and a center-low distribution for a greater mean radius of said signal applicator, said providing a signal applicator comprising providing a mean radius of said signal applicator intermediate said greater and lesser mean radii such that said radial ion density distribution is intermediate said center-high and center-low radial distributions.

57. The method of claim 56 wherein said process gas is compatible with one of: (a) a metal etch plasma process, (b) a silicon oxide etch plasma process, (c) a polysilicon etch plasma process, (d) a silicide etch process, (e) a nitride etch process, (f) a polymer etch process.

58. The method of claim 57 wherein said ceiling height is such that said ion density distribution is neither predominantly center-high nor predominantly center-low.

59. The method of claim 58 wherein said distribution is M-shaped.

60. The method of claim 56 wherein said ceiling height is in the range of 3 to 11 inches for a chamber diameter exceeding 200 mm.

61. The method of claim 56 wherein said ceiling height is in the range of 4 to 12 inches for a chamber diameter exceeding 300 mm.

62. The method of claim 60 wherein said ceiling comprises a flat interior surface facing said wafer pedestal.

63. The method of claim 60 wherein said ceiling comprises a smooth three-dimensionally shaped interior surface facing said wafer pedestal.

64. The method of claim 63 wherein a highest part of said interior surface is disposed at said intermediate height.

65. The method of claim 61 wherein said ceiling comprises a flat interior surface facing said wafer pedestal.

66. The method of claim 61 wherein said ceiling comprises a smooth three-dimensionally shaped interior surface facing said wafer pedestal.

67. The method of claim 66 wherein a highest part of said interior surface is disposed at said intermediate height.

68. The method of claim 60 wherein said ceiling height is approximately 7 inches.

69. The method of claim 60 wherein said ceiling defines a multi-radius interior surface of said chamber.

70. The method of claim 69 wherein said interior surface has a major radius and a minor radius defining a ratio therebetween in the range of about 2 to 10.

71. The method of claim 69 wherein said interior surface has an apex, said apex lying at said intermediate height.

72. The method of claim 56 wherein said chamber has a diameter of between about 12 inches and 24 inches.

73. The method of claim 72 wherein said wafer has a diameter in the range of approximately 6–12 inches.

74. The method of claim 57 wherein said process gas is compatible with a metal etch process and comprise at least one of the following etchants: chlorine, BCl$_2$, HCl, HBr.

75. The method of claim 74 wherein said ceiling is at a height above said support in a range of about 3" to 11", said mean radius in a range of about 3" to 9", and said chamber is sufficiently large to accommodate a 200 mm wafer.

76. The method of claim 74 wherein said ceiling is at a height above said support in a range of about 4" to 12", said mean radius is in a range of about 5" to 14", and said chamber is sufficiently large to accommodate a 300 mm wafer.

77. The method of claim 74 wherein said RF signal has a frequency of about 2 MHz.

78. The method of claim 57 wherein said process gas is compatible with a silicon oxide etch process and comprise at least one of the following etchant precursors: a fluorocarbon, a fluorohydrocarbon.

79. The method of claim 78 wherein said ceiling is at a height above said support in a range of about 3" to 11", said mean radius is in a range of about 5" to 11" and said chamber is sufficiently large to accommodate a 200 mm wafer.

80. The method of claim 78 wherein said ceiling is at a height above said support in a range of about 4" to 12", said mean radius is in a range of about 6" to 14" and said chamber is sufficiently large to accommodate a 300 mm wafer.

81. The method of claim 78 wherein said RF signal has a frequency of about 2 MHz.

82. The method of claim 57 wherein said process gas is compatible with a polysilicon etch process and comprise at least one of the following etchants: chlorine, HBr, mixed with at least one of the following: oxygen, a non-reactive gas, an inert gas.

83. The method of claim 82 wherein said ceiling is at a height above said support in a range of about 3" to 11", said mean radius is in a range of about 4" to 12", and said chamber is sufficiently large to accommodate a 200 mm wafer.

84. The method of claim 83 wherein said ceiling is at a height above said support in a range of about 4" to 12", said mean radius is in a range of about 6" to 15", and said chamber is sufficiently large to accommodate a 300 mm wafer.

85. The method of claim 82 wherein said RF signal has frequency of at least 10 MHz.

86. The method of claim 82 further comprising maintaining a pressure in said chamber less than 20 mT.

87. The method of claim 86 wherein said pressure is maintained between about 1 mT and 5 mT.

88. The reactor of claim 56 wherein the height of said ceiling above said wafer pedestal and said means radius of said RF signal applicator define a ratio therebetween in the range of approximately 0.8 to 1.5.

89. An RF plasma reactor, comprising:

a reactor chamber including a ceiling;

a gas inlet for supplying a process gas into said chamber;

an overhead RF signal applicator near said ceiling for applying an RF signal into said chamber through said ceiling to maintain a plasma of said process gas in said chamber;

a wafer pedestal in said chamber for supporting a semiconductor wafer to be processed in generally facing relationship relative to said ceiling;

wherein said plasma has a radial ion density distribution near the plane of said pedestal which is a center-high radial distribution for a greater height of said ceiling above said pedestal and is a center-low distribution for a lesser height of said ceiling above said pedestal, said height of said ceiling being intermediate said greater and lesser heights such that said radial ion density distribution is intermediate said center-high and center-low radial distributions;

wherein said RF signal applicator has an annular distribution;

wherein said plasma has a radial ion density distribution with respect to an axis of symmetry of said ceiling which is a center-high radial distribution for a lesser mean radius of said signal applicator and a center-low distribution for a greater mean radius of said signal applicator, said mean radius of said signal applicator being intermediate said greater and lesser mean radii such that said radial ion density distribution is intermediate said center-high and center-low radial distributions; and wherein said process gas is compatible with one of: (a) a metal etch plasma process, (b) a silicon oxide etch plasma process, (c) a polysilicon etch plasma process.

90. The reactor of claim 89 wherein said process gas is compatible with a metal etch process and comprise at least one of the following etchants: chlorine, BCl$_2$, HCl, HBr.

91. An RF plasma reactor, comprising:

a reactor chamber including a ceiling;

a gas inlet for supplying a process gas into said chamber;

an overhead RF signal applicator near said ceiling for applying an RF signal into said chamber through said ceiling to maintain a plasma of said process gas in said chamber;

a wafer pedestal in said chamber for supporting a semiconductor wafer to be processed in generally facing relationship relative to said ceiling;

wherein said plasma has a radial ion density distribution near the plane of said pedestal which is a center-high radial distribution for a greater height of said ceiling above said pedestal and is a center-low distribution for a lesser height of said ceiling above said pedestal, said height of said ceiling being intermediate said greater and lesser heights such that said radial ion density distribution is intermediate said center-high and center-low radial distributions;

wherein said RF signal applicator has an annular distribution;

wherein said plasma has a radial ion density distribution with respect to an axis of symmetry of said ceiling which is a center-high radial distribution for a lesser mean radius of said signal applicator and a center-low distribution for a greater mean radius of said signal applicator, said mean radius of said signal applicator being intermediate said greater and lesser mean radii such that said radial ion density distribution is intermediate said center-high and center-low radial distributions;

wherein said chamber has a diameter of between about 12 inches and 24 inches; and wherein said wafer has a diameter in the range of approximately 6–12 inches.

92. An RF plasma reactor, comprising:

a reactor chamber including a ceiling;

a gas inlet for supplying a process gas into said chamber;

an overhead RF signal applicator near said ceiling for applying an RF signal into said chamber through said ceiling to maintain a plasma of said process gas in said chamber;

a wafer pedestal in said chamber for supporting a semiconductor wafer to be processed in generally facing relationship relative to said ceiling;

wherein said plasma has a radial ion density distribution near the plane of said pedestal which is a center-high radial distribution for a greater height of said ceiling above said pedestal and is a center-low distribution for a lesser height of said ceiling above said pedestal, said height of said ceiling being intermediate said greater and lesser heights such that said radial ion density distribution is intermediate said center-high and center-low radial distributions;

wherein said RF signal applicator has an annular distribution;

wherein said plasma has a radial ion density distribution with respect to an axis of symmetry of said ceiling which is a center-high radial distribution for a lesser mean radius of said signal applicator and a center-low distribution for a greater mean radius of said signal applicator, said mean radius of said signal applicator being intermediate said greater and lesser mean radii such that said radial ion density distribution is intermediate said center-high and center-low radial distributions;

wherein said process gas is compatible with one of: (a) a metal etch plasma process, (b) a silicon oxide etch plasma process, (c) a polysilicon etch plasma process;

wherein said process gas is compatible with a silicon oxide etch process and comprise at least one of the following etchant precursors: a fluorocarbon, a fluorohydrocarbon; and wherein said RF signal has a frequency of about 2 MHz.

93. An RF plasma reactor, comprising:

a reactor chamber including a ceiling;

a gas inlet for supplying a process gas into said chamber;

an overhead RF signal applicator near said ceiling for applying an RF signal into said chamber through said ceiling to maintain a plasma of said process gas in said chamber;

a wafer pedestal in said chamber for supporting a semiconductor wafer to be processed in generally facing relationship relative to said ceiling;

wherein said plasma has a radial ion density distribution near the plane of said pedestal which is a center-high radial distribution for a greater height of said ceiling above said pedestal and is a center-low distribution for a lesser height of said ceiling above said pedestal, said height of said ceiling being intermediate said greater and lesser heights such that said radial ion density distribution is intermediate said center-high and center-low radial distributions;

wherein said RF signal applicator has an annular distribution;

wherein said plasma has a radial ion density distribution with respect to an axis of symmetry of said ceiling which is a center-high radial distribution for a lesser mean radius of said signal applicator and a center-low distribution for a greater mean radius of said signal applicator, said mean radius of said signal applicator being intermediate said greater and lesser mean radii such that said radial ion density distribution is intermediate said center-high and center-low radial distributions;

wherein said process gas is compatible with one of: (a) a metal etch plasma process, (b) a silicon oxide etch plasma process, (c) a polysilicon etch plasma process; and wherein said process gas is compatible with a polysilicon etch process and comprise at least one of the following etchants: chlorine, Hbr, mixed with at least one of the following: oxygen, a non-reactive gas, an inert gas.

94. The reactor of claim 93 wherein said RF signal has frequency of at least 10 MHz.

95. The reactor of claim 93 further comprising maintaining a pressure in said chamber less than 20 mT.

96. The reactor of claim 95 wherein said pressure is maintained between about 1 mT and 5 mT.

97. An RF plasma reactor, comprising:

a reactor chamber including a ceiling;

a gas inlet for supplying a process gas into said chamber;

an overhead RF signal applicator near said ceiling for applying an RF signal into said chamber through said ceiling to maintain a plasma of said process gas in said chamber;

a wafer pedestal in said chamber for supporting a semiconductor wafer to be processed in generally facing relationship relative to said ceiling;

wherein said plasma has a radial ion density distribution near the plane of said pedestal which is a center-high radial distribution for a greater height of said ceiling above said pedestal and is a center-low distribution for a lesser height of said ceiling above said pedestal, said height of said ceiling being intermediate said greater and lesser heights such that said radial ion density distribution is intermediate said center-high and center-low radial distributions;

wherein said RF signal applicator has an annular distribution;

wherein said plasma has a radial ion density distribution with respect to an axis of symmetry of said ceiling which is a center-high radial distribution for a lesser mean radius of said signal applicator and a center-low distribution for a greater mean radius of said signal applicator, said mean radius of said signal applicator being intermediate said greater and lesser mean radii such that said radial ion density distribution is intermediate said center-high and center-low radial distributions; and wherein the height of said ceiling above said wafer pedestal and said means radius of said RF signal applicator define a ratio therebetween in the range of approximately 0.8 to 1.5.

98. An RF plasma reactor, comprising:

a reactor chamber including a ceiling;

a gas inlet for supplying a process gas into said chamber;

an overhead RF signal applicator near said ceiling for applying an RF signal into said chamber through said ceiling to maintain a plasma of said process gas into said chamber, said overhead RF signal applicator comprising plural concentric spiral conductors having radially interior and exterior ends, said interior ends being connected together near a common axis of symmetry of said plural concentric spiral conductors;

a wafer pedestal in said chamber for supporting a semiconductor wafer to be processed in generally facing relationship relative to said ceiling;

said pedestal being spaced from said ceiling at a range of about 3 to 12 inches and capable of supporting a wafer of a diameter ranging generally between 200 mm and 300 mm so as to improve uniformity of ion density distribution.

99. The reactor of claim 98 wherein said RF signal applicator has an annular distribution with a center void and has a mean radius between said void and an outer circumference of said RF signal applicator between about 3 and 14 inches.

100. The reactor of claim 98 wherein said ceiling defines a multi-radius dome-shaped interior surface of said chamber having major and minor radii having a ratio therebetween lying in a range of approximately 2 to 10 inches.

101. The reactor of claim 98 wherein said ceiling height is in the range of 3 to 11 inches and said pedestal is capable of supporting a wafer of a diameter of about 200 mm.

102. The reactor of claim 98 wherein said ceiling height is in the range of 4 to 12 inches and said pedestal is capable of supporting a wafer of a diameter of about 300 mm.

103. The reactor of claim 98 wherein said ceiling comprises a flat interior surface facing said wafer pedestal.

104. The reactor of claim 98 wherein said ceiling comprises a smooth three-dimensionally shaped interior surface facing said wafer pedestal.

105. The reactor of claim 104 wherein a highest part of said interior surface is disposed at said ceiling height.

106. The reactor of claim 98 wherein said ceiling defines a multi-radius interior surface of said chamber.

107. The reactor of claim 106 wherein said interior surface has a major radius and a minor radius defining a ratio therebetween in the range of about 2 to 10.

108. The reactor of claim 104 wherein said interior surface has an appex lying at said ceiling height.

109. The reactor of claim 98 wherein said chamber has a diameter of between about 12 inches and 24 inches.

110. The reactor of claim 98 wherein said ceiling is at a height above said support in a range of about 3" to 11", said means radius of said RF signal applicator is in a range of about 3" to 9", and said pedestal is capable of supporting a 200 mm wafer.

111. The reactor of claim 98 wherein said ceiling is at a height of about 4" to 12", said mean radius of said RF signal applicator is in a range of about 5" to 15", and said pedestal is capable of supporting a 300 mm. Wafer.

112. The reactor of claim 98 wherein said ceiling is at a height above said support in a range of about 3" to 11", said mean radius of said RF signal applicator is in a range of about 5" to 11" and said pedestal is capable of supporting a 200 mm wafer.

113. The reactor of claim 98 wherein said ceiling is at a height above said support in a range of about 4" to 12", said mean radius of said RF signal applicator is in a range of about 6" to 15" and said pedestal is capable of supporting a 300 mm wafer.

114. The reactor of claim 98 wherein the height of said ceiling above said wafer pedestal and said mean radius of said RF signal applicator define a ratio therebetween in the range of approximately 0.8 to 1.5.

115. An RF plasma reactor, comprising:

a reactor chamber including a ceiling:

a gas inlet for supplying a process gas into said chamber;

an overhead RF signal applicator near said ceiling for applying an RF signal into said chamber through said ceiling to maintain a plasma of said process gas in said chamber, said RF signal applicator having an annular distribution corresponding to a mean radius of said RF signal applicator, said overhead RF signal applicator comprising plural concentric spiral conductors having radially interior and exterior ends, said interior ends being connected together near a common axis of symmetry of said plural concentric spiral conductors;

a wafer pedestal in said chamber for supporting a semiconductor wafer to be processed in generally facing relationship relative to said ceiling;

said mean radius of said RF signal applicator being in a range of about 3 to 12 inches and said wafer pedestal capable of supporting a wafer having a diameter in the range of 200 mm to 300 mm.

116. The rector of claim 115 wherein said annular distribution has an inner radius and an outer radius, said mean radius being an average of said inner and outer radii.

117. The reactor of claim 115 wherein said ceiling defines a multi-radius dome-shaped interior surface of said chamber having major and minor radii having a ratio therebewteen lying in a range of approximately 2 to 10.

118. The reactor of claim 117 wherein said chamber diameter is in the range of approximately 12 to 20 inches.

119. The reactor of claim 115 wherein said pedestal is capable of supporting a wafer having a diameter in the range of approximately 6 to 12 inches.

120. The reactor of claim 117 wherein said chamber diameter is about 14 inches, and said mean radius of said signal applicator is about 7 inches.

121. The reactor of claim 115 wherein said mean radius is in a range of 3" to 9" and said pedestal is capable of supporting a 200 mm wafer.

122. The reactor of claim 115 wherein said mean radius is in a range of 5" to 15" and said pedestal is capable of supporting a 300 mm wafer.

123. The reactor of claim 115 wherein said mean radius is in a range of 4" to 12" and said pedestal is capable of supporting a 200 mm wafer.

124. The rector of claim 115 wherein said mean radius is in a range of about 5" to 15" and said pedestal is capable of supporting a 300 mm wafer.

125. The reactor of claim 115 wherein said mean radius is in a range of about 6" to 15" and said chamber is sufficiently large to accommodate a 300 mm wafer.

126. An RF plasma reactor, comprising:
a) a reactor chamber adapted to process a workpiece and comprising a ceiling;
b) a gas inlet adapted to supply process gas into the chamber, the gas inlet coupled to at least one supply of process gas capable of forming within the chamber a plasma adapted for one of: metal etch, silicon oxide etch, polysilicon etch, silicide etch, nitride etch, or polymer etch.
c) an overhead RF signal applicator near the ceiling capable of applying an RF signal into the chamber through the ceiling to maintain a plasma therein;
d) a wafer pedestal in the chamber for supporting a semiconductor wafer to be processed in generally facing relationship relative to the ceiling; and
e) wherein the plasma has a radial ion density distribution near the plane of the pedestal which is a center-high radial distribution for a greater height of the ceiling above the pedestal and is a center-low distribution for a lesser height of the ceiling above the pedestal, the height of the ceiling being intermediate the greater and lesser heights such that the radial ion density distribution is intermediate the center-high and center-low radial distributions.

127. The reactor of claim 126 wherein the gas inlet is coupled to a supply of at least one of chlorine, BCl2, HCl, or Hbr.

128. The reactor of claim 127 further comprising the RF signal applicator having signal with a frequency of about 2 MHz.

129. The reactor of claim 126 wherein the gas inlet is coupled to a supply of at least one of the following etchant precursors: a fluorocarbon, or a fluorohydrocarbon.

130. The reactor of claim 124 further comprising the RF signal applicator having signal with a frequency of about 2 MHz.

131. The reactor of claim 126 wherein the gas inlet is coupled at least one supply of least one of chlorine, or HBr, and at least one supply of at least one of oxygen, a non-reactive gas, and inert gas.

132. The reactor of claim 131 further comprising the RF signal applicator having signal with a frequency of at least 10 MHz.

133. The reactor of claim 131 further comprising a vacuum pump and further comprising the chamber having a pressure of less than 20 mT.

134. The reactor of claim 133 further comprising the chamber having a pressure of between about 1 mT and 5 mT.

135. The reactor of claim 126 wherein the RF signal applicator comprising plural concentric spiral conductors having radially interior and exterior ends, the interior ends being connected together near a common axis of symmetry of the plural concentric spiral conductors, and wherein the pedestal being spaced from the ceiling at a range of about 3 to 12 inches and capable of supporting a wafer of a diameter ranging generally between 200 mm and 300 mm so as to improve uniformity of ion density distribution.

136. The reactor of claim 126 wherein the RF signal applicator has an annular distribution with a center void and has a mean radius between the void and an outer circumference of the RF signal applicator between about 3 and 14 inches, and wherein the pedestal being spaced from the ceiling at a range of about 3 to 12 inches and capable of supporting a wafer of a diameter ranging generally between 200 mm and 300 mm so as to improve uniformity of ion density distribution.

137. An RF plasma reactor, comprising:
a reactor chamber including a ceiling;
a gas inlet for supplying a process gas into said chamber;
an overhead RF signal applicator near said ceiling for applying an RF signal into said chamber through said ceiling to maintain a plasma of said process gas in said chamber;
a wafer pedestal in said chamber for supporting a semiconductor wafer to be processed in generally facing relationship relative to said ceiling;
wherein said plasma has a radial ion density distribution near the plane of said pedestal which is a center-high radial distribution for a greater height of said ceiling above said pedestal and is a center-low distribution for a lesser height of said ceiling above said pedestal, said height of said ceiling being intermediate said greater and lesser heights such that said radial ion density distribution is intermediate said center-high and center-low radial distributions; and
wherein said process gas is compatible with one of: (a) a metal etch plasma process, (b) a silicon oxide etch plasma process, (c) a polysilicon etch plasma process, (d) a silicide etch process, (e) a nitride etch process, (f) a polymer etch process.

138. The reactor of claim 137 wherein said process gas is compatible with a metal etch process and comprise at least one of the following etchants: chlorine, $BCl_2$, HCl, HBr.

139. The reactor of claim 138 wherein said ceiling is at a height above said support in a range of about 3" to 11" and said chamber is sufficiently large to accommodate a 200 mm wafer.

140. The reactor of claim 139 wherein said RF signal has a frequency of about 2 MHz.

141. The reactor of claim 138 wherein said ceiling is at a height above said support in a range of about 4" to 12" and said chamber is sufficiently large to accommodate a 300 mm wafer.

142. The reactor of claim 137 wherein said process gas is compatible with a silicon oxide etch process and comprise at least one of the following etchant precursors: a fluorocarbon, a fluorohydrocarbon.

143. The reactor of claim 142 wherein said ceiling is at a height above said support in a range of about 3" to 11" and said chamber is sufficiently large to accommodate a 200 mm wafer.

144. The reactor of claim 142 wherein said ceiling is at a height above said support in a range of about 4" to 12" and said chamber is sufficiently large to accommodate a 300 mm wafer.

145. The reactor of claim 142 wherein said RF signal has a frequency of about 2 MHz.

146. The reactor of claim 137 wherein said process gas is compatible with a polysilicon etch process and comprise at least one of the following etchants: chlorine, HBr, mixed with at least one of the following: oxygen, a non-reactive gas, an inert gas.

147. The reactor of claim 142 wherein said ceiling is at a height above said support in a range of about 3" to 11" and said chamber is sufficiently large to accommodate a 200 mm wafer.

148. The reactor of claim 142 wherein said ceiling is at a height above said support in a range of about 4" to 12" and said chamber is sufficiently large to accommodate a 300 mm wafer.

149. The reactor of claim 142 wherein said RF signal has frequency of at least 10 MHz.

150. The reactor of claim 142 further comprising maintaining a pressure in said chamber less than 20 mT.

151. The reactor of claim 142 wherein said pressure is maintained between about 1 mT and 5 mT.

152. An RF plasma reactor, comprising:

a reactor chamber including a ceiling;

a gas inlet for supplying a process gas into said chamber;

an overhead RF signal applicator near said ceiling for applying an RF signal into said chamber through said ceiling to maintain a plasma of said process gas in said chamber;

a wafer pedestal in said chamber for supporting a semiconductor wafer to be processed in generally facing relationship relative to said ceiling;

wherein said plasma has a radial ion density distribution near the plane of said pedestal which is a center-high radial distribution for a greater height of said ceiling above said pedestal and is a center-low distribution for a lesser height of said ceiling above said pedestal, said height of said ceiling being intermediate said greater and lesser heights such that said radial ion density distribution is intermediate said center-high and center-low radial distributions;

wherein said chamber has a diameter of between about 12 inches and 24 inches; and wherein said wafer has a diameter in the range of approximately 6–12 inches.

153. An RF plasma reactor, comprising:

a reactor chamber including a ceiling;

a gas inlet for supplying a process gas into said chamber;

an overhead RF signal applicator near said ceiling for applying an RF signal into said chamber through said ceiling to maintain a plasma of said process gas in said chamber, said RF signal applicator having an annular distribution corresponding to a mean radius of said RF signal applicator;

a wafer pedestal in said chamber for supporting a semiconductor wafer to be processed in generally facing relationship relative to said ceiling;

wherein said plasma has a radial ion density distribution with respect to an axis of symmetry of said ceiling which is a center-high radial distribution for a lesser mean radius of said signal applicator and a center-low distribution for a greater mean radius of said signal applicator, said mean radius of said signal applicator being intermediate said greater and lesser mean radii such that said radial ion density distribution is intermediate; and wherein said process gas is compatible with one of: (a) a metal etch plasma process, (b) a silicon oxide etch plasma process, (c) a polysilicon etch plasma process.

154. The reactor of claim 153 wherein said process gas is compatible with a metal etch process and comprise at least one of the following etchants: chlorine, $BCl_2$, HCl, HBr.

155. The reactor of claim 154 wherein said mean radius is in a range of 3" to 9" and said chamber is sufficiently large to accommodate a 200 mm wafer.

156. The reactor of claim 154 wherein said mean radius is in a range of 4" to 12" and said chamber is sufficiently large to accommodate a 300 mm wafer.

157. The reactor of claim 154 wherein said RF signal has a frequency of about 2 MHz.

158. The reactor of claim 153 wherein said process gas is compatible with a silicon oxide etch process and comprise at least one of the following etchant precursors: a fluorocarbon, a fluorohydrocarbon.

159. The reactor of claim 158 wherein said RF signal has a frequency of about 2 MHz.

160. The reactor of claim 153 wherein said process gas is compatible with a polysilicon etch process and comprise at least one of the following etchants: chlorine, HBr, mixed with at least one of the following: oxygen, a non-reactive gas, an inert gas.

161. The reactor of claim 160 wherein said RF signal has frequency of at least 10 MHz.

162. An RF plasma reactor, comprising:

a reactor chamber including a ceiling;

a gas inlet for supplying a process gas into said chamber;

an overhead RF signal applicator near said ceiling for applying an RF signal into said chamber through said ceiling to maintain a plasma of said process gas in said chamber, said RF signal applicator having an annular distribution corresponding to a mean radius of said RF signal applicator;

a wafer pedestal in said chamber for supporting a semiconductor wafer to be processed in generally facing relationship relative to said ceiling;

wherein said plasma has a radial ion density distribution with respect to an axis of symmetry of said ceiling which is a center-high radial distribution for a lesser mean radius of said signal applicator and a center-low distribution for a greater mean radius of said signal applicator, said mean radius of said signal applicator being intermediate said greater and lesser mean radii such that said radial ion density distribution is intermediate;

wherein said ceiling defines a multi-radius dome-shaped interior surface of said chamber having major and minor radii having a ratio therebetween lying in a range of approximately 2 to 10; and wherein said wafer has a diameter in the range of approximately 6 to 12 inches.

* * * * *